US007557846B2

(12) United States Patent
Ohkawa

(10) Patent No.: US 7,557,846 B2
(45) Date of Patent: Jul. 7, 2009

(54) SOLID-STATE IMAGE SENSOR INCLUDING COMMON TRANSISTORS BETWEEN PIXELS

(75) Inventor: Narumi Ohkawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 764 days.

(21) Appl. No.: 10/924,957

(22) Filed: Aug. 25, 2004

(65) Prior Publication Data

US 2005/0237405 A1    Oct. 27, 2005

(30) Foreign Application Priority Data

Apr. 27, 2004    (JP)    ............... 2004-130806

(51) Int. Cl.
*H04N 5/14* (2006.01)
*H01L 31/062* (2006.01)
*H01L 27/00* (2006.01)

(52) U.S. Cl. .............. 348/302; 257/291; 250/208.1
(58) Field of Classification Search ............ 348/294, 348/302, 308; 257/291, 292; 250/208.1
See application file for complete search history.

(56) References Cited

U.S. PATENT DOCUMENTS

| 6,107,655 | A  | * | 8/2000  | Guidash ............... 257/292 |
| 6,352,869 | B1 |   | 3/2002  | Guidash |
| 6,423,994 | B1 |   | 7/2002  | Guidash |
| 6,466,266 | B1 |   | 10/2002 | Guidash et al. |
| 6,657,665 | B1 |   | 12/2003 | Guidash |
| 6,674,470 | B1 |   | 1/2004  | Tanaka et al. |
| 6,977,684 | B1 | * | 12/2005 | Hashimoto et al. ...... 348/294 |
| 6,982,759 | B2 | * | 1/2006  | Goto ................ 348/302 |
| 2001/0054713 | A1 |  | 12/2001 | Miyagawa |
| 2002/0027239 | A1 |  | 3/2002  | Ohkubo |

FOREIGN PATENT DOCUMENTS

| EP | 0757476 A2    | 5/1997 |
| JP | 10-150182     | 6/1998 |
| JP | 10-256521     | 9/1998 |
| JP | HEI 10-256520 A | 9/1998 |
| JP | 11-126895     | 5/1999 |
| JP | 2000-058809 A | 2/2000 |
| JP | 1 017 106 A2  | 7/2000 |

(Continued)

OTHER PUBLICATIONS

Office Action dated Apr. 25, 2006 issued in corresponding Korean Application No. 10-2004-0076864.

(Continued)

*Primary Examiner*—Nhan T Tran
(74) *Attorney, Agent, or Firm*—Westerman, Hattori, Daniels & Adrian, LLP.

(57) ABSTRACT

In the solid-state image sensor including 4-Tr-pixels, a source follower transistor SF-Tr, a rest transistor RST and a select transistor Select are made common between pixels $P_n$, $P_{n+1}$ adjacent in the column direction, and a transfer transistor TG1 and a transfer transistor TG2 are formed in region which respectively positioned on the same side with respect to the photodiode PD1 and the photodiode PD2, and the source follower transistor SF-Tr, the reset transistor RST and the select transistor Select made common are formed in regions positioned on the side in the row direction with respect to the photodiode PD1 and the photodiode PD2.

56 Claims, 30 Drawing Sheets

FOREIGN PATENT DOCUMENTS

| | | |
|---|---|---|
| JP | 2000-232216 | 8/2000 |
| JP | 2000-232216 A | 8/2000 |
| JP | 2001-298177 | 10/2001 |
| JP | 2002-009271 A | 1/2002 |
| JP | 2002-083949 A | 3/2002 |
| KR | 2000-0052598 | 8/2000 |

OTHER PUBLICATIONS

European Search Report, dated May 26, 2006, issued in corresponding European Application No. 04 25 5247.

Notification of Reason(s) for Refusal in Japanese Office Action dated Jun. 10, 2008 in connection with Japanese application No. 2004-130806.

* cited by examiner

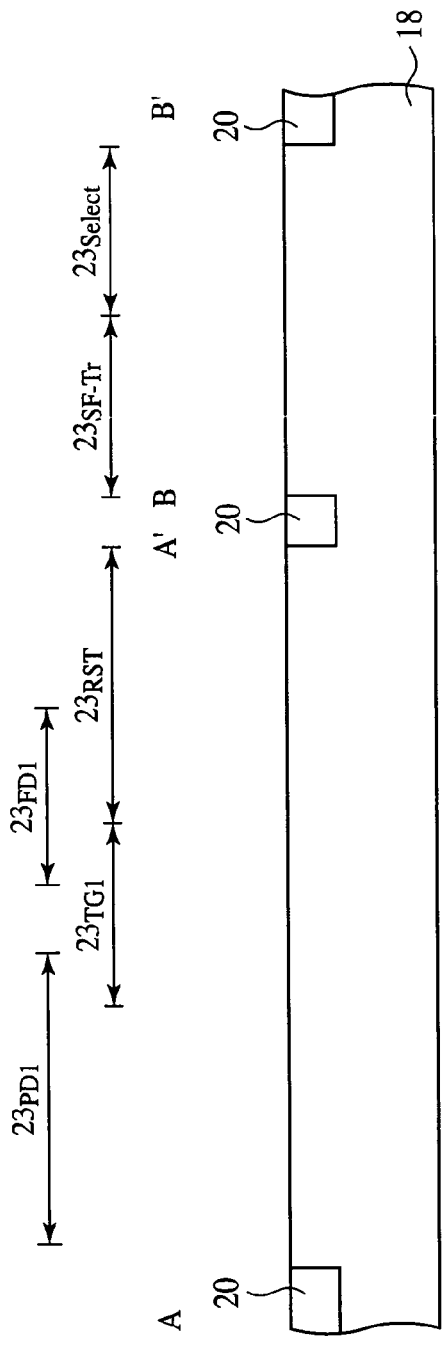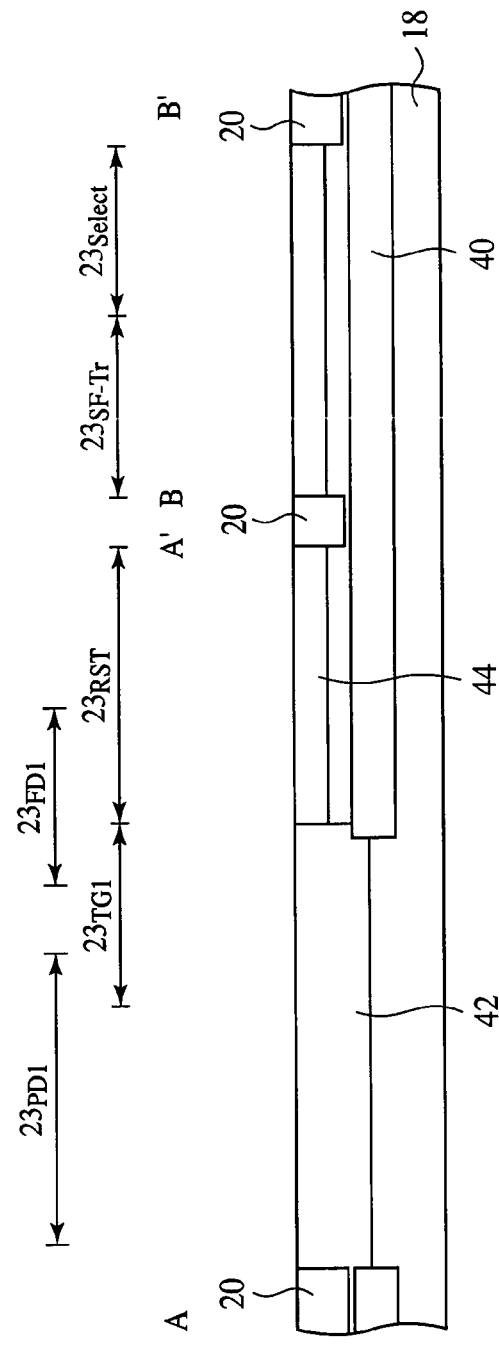
FIG. 6A
FIG. 6B

SOLID-STATE IMAGE SENSOR INCLUDING COMMON TRANSISTORS BETWEEN PIXELS

CROSS-REFERENCE TO RELATED APPLICATIONS

This application is based upon and claims priority of Japanese Patent Application No. 2004-130806, filed on Apr. 27, 2004, the contents being incorporated herein by reference.

BACKGROUND OF THE INVENTION

The present invention relates to a solid-state image sensor including common elements between the pixels.

The solid-state imaging device using semiconductors are roughly classified in CCDs and image sensors based on CMOS.

The CMOS image sensors generally have the structure which is the so-called 3-Tr APS (Active Pixel Sensor), comprising a photodiode (PD) which converts a photo signal to an electric signal, a reset transistor (RST) which resets the photodiode, a source follower transistor (SF-Tr) which converts signal charges of the photodiode to voltages to output the signal charges in voltage, and a select transistor (Select) which connects/selects pixels and signal lines.

It is said that the solid-state image sensor including 3-Tr-pixels are vulnerable to noises (kTC noises) caused by thermal noises. The structure called a 4-Tr-pixel which can remove kTC noises as well is proposed. The solid-state image sensor including 4-Tr-pixels has the structure including further a transfer transistor (transfer gate) between the rest transistor and the photodiode described above, and an N-type diffused layer (FD: Floating Diffusion) between the reset transistor and the transfer transistor is connected to the gate of the source follower transistor.

The solid-state image sensor including the above-described 4-Tr-pixels requires 4 transistors and 1 photodiode per a pixel unit and has so many component elements. The photodiode has an accordingly decreased occupation area in the pixel. From this viewpoint, it is proposed to make the component elements common between adjacent pixels.

Various layouts for making a read transistor part including the reset transistor, the select transistor and the source follower transistor common between adjacent pixels have been so far reported (refer to, e.g., Japanese published unexamined patent application No. 2000-232216, Japanese published unexamined patent application No. Hei 11-126895 (1999), Japanese published unexamined patent application No. Hei 10-256521 (1998), Japanese published unexamined patent application No. Hei 10-150182 (1998), Japanese published unexamined patent application No. 2001-298177).

Making the read transistor part common between adjacent pixels decreases a element number of 1 pixel, and can increase the occupation area of the photodiode.

However, the proposed pixel layouts having a read transistor part made common between adjacent pixels causes wide variations in photosensitivities and charge transfer characteristics.

SUMMARY OF THE INVENTION

An object of the present invention is to provide a solid-state image sensor which can ensure a sufficient area for the photodiodes and can make the photosensitivities and charge transfer characteristics uniform among the pixels.

According to one aspect of the present invention, there is provided a solid-state image sensor comprising a plurality of pixels arranged in a matrix in a row direction and in a column direction, each of said plurality of pixels including photoelectric converter; a first transistor for transferring a signal charge generated in the photoelectric converter; an impurity diffused region for storing the signal charge outputted from the photoelectric converter via the first transistor; a second transistor for outputting a signal, based on the signal charge stored in the impurity diffused region; a third transistor for resetting an input terminal of the second transistor; and a fourth transistor for reading the signal outputted by the second transistor, the second transistor of a first one of said pixels in an $n^{th}$ row, and the second transistor of a second one of said pixels in an $n+1^{th}$ row being made common, the third transistor of the first pixel, and the third transistor of the second pixel being made common, the fourth transistor of the first pixel, and the fourth transistor of the second pixel being made common, the first transistor of the first pixel and the first transistor of the second pixel being formed in regions positioned respectively on the same side in the column direction with respect to the photoelectric converter of the first pixel and the photoelectric converter of the second pixel, and at least one of the second transistor made common, the third transistor made common and the fourth transistor made common being formed in a region positioned on a side in the row direction with respect to the photoelectric converter of the first pixel and the photoelectric converter of the second pixel.

According to the present invention, in the solid-state image sensor including 4-Tr-pixels in which a source follower transistor, a reset transistor and a select transistor are made common between the pixel in the $n^{th}$ row and the pixel in the $n+1^{th}$ row, the transfer transistor of the pixel in the $n^{th}$ row and the transfer transistor of the pixel in the $n+1^{th}$ row are formed in regions positioned respectively on the same side in the column direction with respect to the photodiode of the pixel in the $n^{th}$ row and the photodiode of the pixel in the $n+1^{th}$ row, and at least one of the source follower transistor made common, the reset transistor made common and the select transistor made common is formed in a region positioned on a side in the row direction with respect to the photodiode of the pixel in the $n^{th}$ and the photodiode of the pixel in the $n+1^{th}$ row, whereby a sufficient area of the photodiodes can be ensured, and the photosensitivities and the charge transfer characteristics can be made uniform among the pixels.

According to the present invention, the width in the row direction of the active region where the photodiode is formed and the width in the row direction of the active region under the gate electrode of the transfer transistor are substantially the same, whereby the charge transfer from the photodiode to the floating diffusion can be highly efficient.

According to the present invention, the contact plugs are formed in the region other than the regions between the photodiodes adjacent in the column direction, whereby the length of the photodiode can be large in the column direction, and the light receiving amount per 1 pixel can be large.

According to the present invention, the metal interconnection layers formed above the pixels can shield light almost equally among the pixels, whereby the light receiving characteristics can be uniform among the pixels.

BRIEF DESCRIPTION OF THE DRAWINGS

FIGS. 6A and 6B are sectional views of the solid-state image sensor according to the first embodiment of the present invention in the steps of the method for fabricating the same, which show the method (Part 1).

DETAILED DESCRIPTION OF THE INVENTION

[The Solid-State Image Sensor Including 4-Tr-Pixels Having no Element Made Common]

Figure 30:
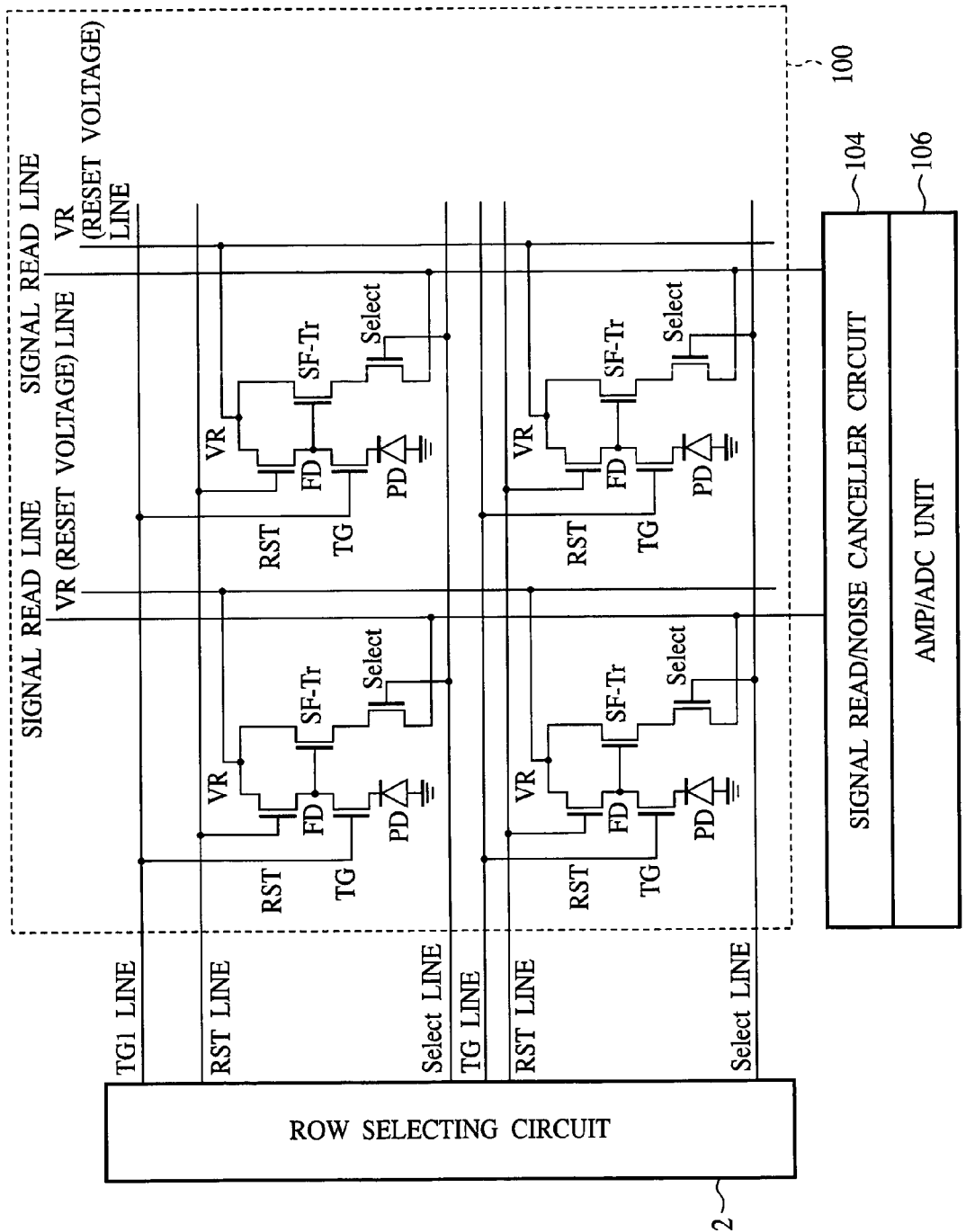
FIG. 30 is a circuit diagram of a solid-state image sensor including 4-Tr-pixels having no element made common.

Before the solid-state image sensor according to the present invention is explained, the solid-state image sensor including 4-Tr-pixels having elements not made common will be explained with reference to FIG. 30. FIG. 30 is a circuit diagram of the solid-state image sensor including the 4-Tr-pixels having elements not made common. In FIG. 30, the pixel array part 100 is represented by 2×2 pixel units.

Each pixel comprises a photodiode PD, a transfer transistor TG, a rest transistor RST, a source follower transistor SF-Tr and a select transistor Select.

The cathode terminal of the photodiode PD is connected to the source terminal of the transfer transistor TG. The anode terminal of the photodiode PD is grounded. The source terminal of the reset transistor RST and the gate terminal of the source follower transistor SF-Tr are connected to the drain terminal of the transfer transistor TG. An impurity diffused region which stores charges transferred from the photodiode PD is present in the region for the drain terminal of the transfer transistor TG, the source terminal of the reset transistor RST and the gate terminal of the source follower transistor SF-Tr connected to. The impurity diffused region will be called hereinafter a floating diffusion FD. The source terminal of the source follower transistor SF-Tr is connected to the drain terminal of the select transistor Select.

The respective pixels adjacent to each other in the row direction are connected to a transfer gate (TG) line commonly connecting the gate terminals of the transfer transistors TG, a reset (RST) line commonly connecting the gate terminals of the reset transistors RST, and a select (Select) line commonly connecting the gate terminals of the select transistors Select.

The respective pixels adjacent to each other in the column direction are connected to a signal read line commonly connecting the source terminals of the select transistors Select, and a VR (reset voltage) line commonly connecting the drain terminals of the reset transistors RST.

The TG lines, the RST lines and the Select lines are connected to a row select circuit 102. The signal read lines are connected to a signal read/noise canceller circuit 104. The signal read/noise canceller circuit 104 is connected to an AMP/ADC unit 106 including amplifiers and AD converters provided for the respective columns. The VR lines are connected to an electric power source whose voltage is substantially a source voltage, or an electric power source whose voltage is decreased in the chip.

The present invention allows the solid-state image sensor including the 4-Tr-pixels described above to ensure a sufficient area for the photodiode and to realize uniform photosensitivities, charge transfer characteristics, etc. among the pixels. The solid-state image sensor according to the present invention will be specifically explained below.

A FIRST EMBODIMENT

Figure 1:
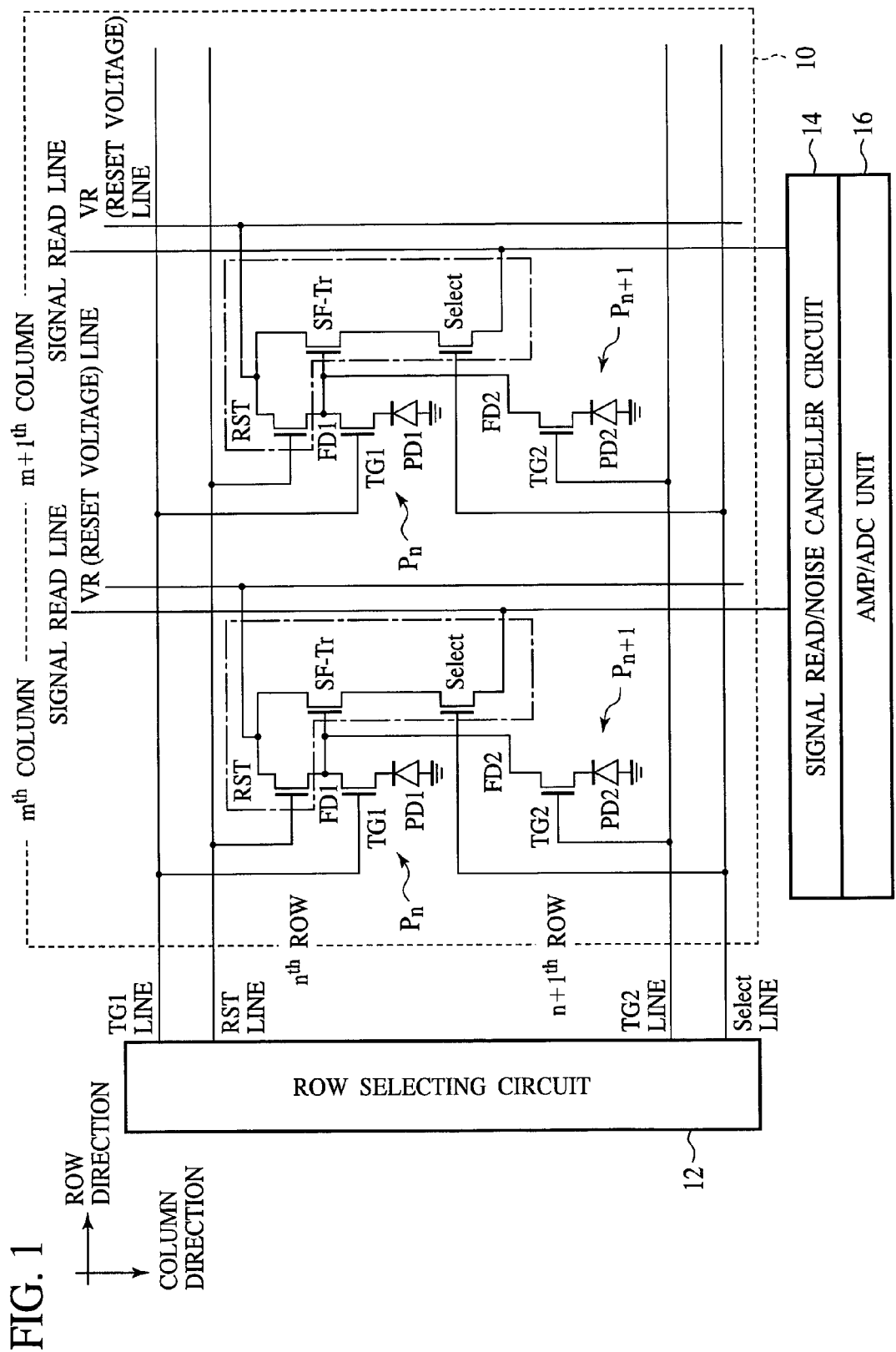
FIG. 1 is a circuit diagram of the solid-state image sensor according to a first embodiment of the present invention.
Figure 9:
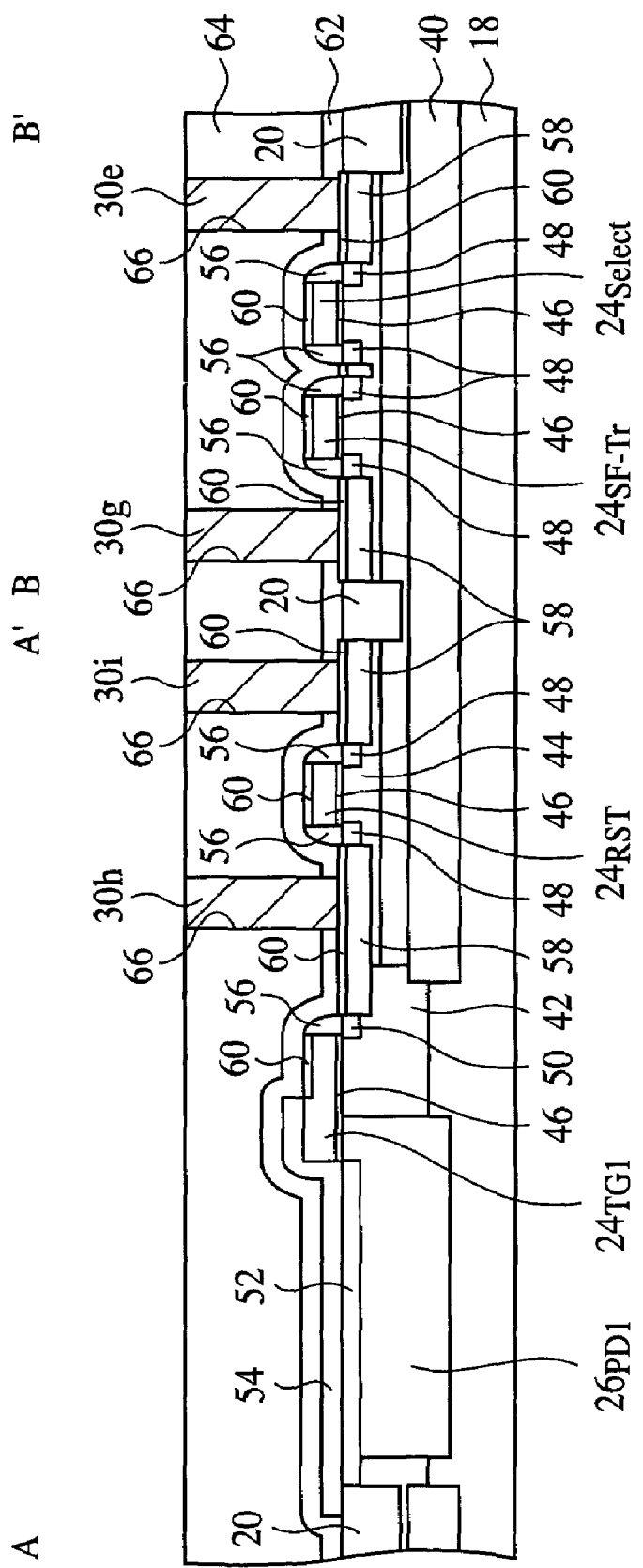
FIG. 9 is sectional views of the solid-state image sensor according to the first embodiment of the present invention in the steps of the method for fabricating the same, which shows the method (Part 4).
Figure 10:
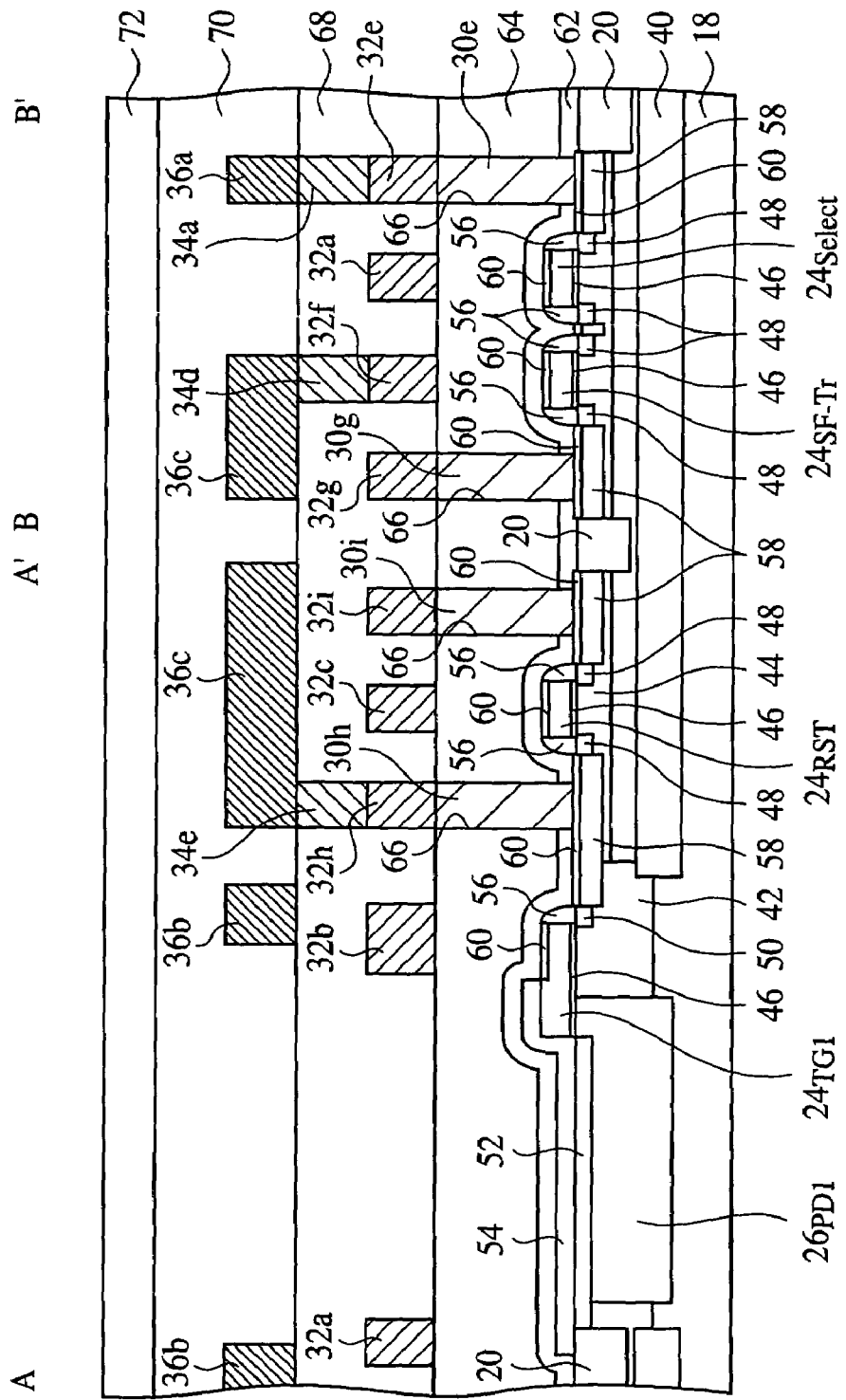
FIG. 10 is sectional views of the solid-state image sensor according to the first embodiment of the present invention in the steps of the method for fabricating the same, which shows the method (Part 5).

The solid-state image sensor according to a first embodiment of the present invention will be explained with reference to FIGS. 1 to 10. FIG. 1 is a circuit diagram of the solid-state image sensor according to the present embodiment. FIGS. 2 to 5 are plan views of the solid-state image sensor according to the present embodiment, which show a structure thereof. FIGS. 6A-6B to 10 are sectional views of the solid-state image sensor according to the present embodiment in the steps of the method for fabricating the same, which show the method.

First, the structure of the solid-state image sensor according to the present embodiment will be explained with reference to FIGS. 1 to 5.

The solid-state image sensor according to the present embodiment is a solid-state image sensor including 4-Tr-pixels having elements made common between the pixels. That is, in the solid-state image sensor according to the present embodiment, a plurality of pixels each including a photodiode PD and a transfer transistor TG which transfers signal charges generated in the photodiode are arranged in a matrix, and a read transistor part is made common between the pixels adjacent to each other in the column direction. Each read transistor part comprises a source follower transistor SF-Tr, a rest transistor RST and a select transistor Select. The source follower transistor SF-Tr converts signal charges transferred by the transfer transistor TG to voltages to output the signal charges in voltage. The reset transistor RST resets the input terminal of the source follower transistor SF-Tr. The select transistor Select reads a signal outputted by the source follower transistor SF-Tr.

First, the circuit of the solid-state image sensor according to the present embodiment will be explained with reference to FIG. 1. In FIG. 1, the pixel array part 10 is represented by 2×2 pixel units.

Of the pixels adjacent to each other in the column direction, the pixel $P_n$ positioned in the $n^{th}$ row includes a photodiode PD1 and a transfer transistor TG1. The pixel $P_{n+1}$ positioned in the $n+1^{th}$ row includes a photodiode PD2 and a transfer transistor TG2. As described above, the pixels $P_n$, $P_{n+1}$ each include the photodiode PD and the transfer transistor TG, but the pixels $P_n$, $P_{n+1}$ which are adjacent to each other in the column direction include 1 set of the read transistor part (the rest transistor RST, the select transistor Select and the source follower transistor SF-Tr) which is made common between the pixels $P_n$, $P_{n+1}$ adjacent to each other in the column direction.

The cathode terminal of the photodiodes PD1 of the pixel $P_n$ positioned in the $n^{th}$ row is connected to the source terminal of the transfer transistor TG1. The anode terminal of the photodiode PD1 is grounded. The drain terminal of the transfer transistor TG1 is connected to the source terminal of the reset transistor RST and the gate terminal of the source follower transistor SF-Tr. Floating diffusions FD1 for storing charges transferred from the photodiode PD1 is present in the region for the drain terminal of the transfer transistor TG1, the source terminal of the reset transistor RST and the gate terminal of the source follower transistor SF-Tr connected to. The source terminal of the source follower transistor SF-Tr is connected to the drain terminal of the select transistor Select.

The cathode terminal of the photodiode PD2 of the pixel $P_{n+1}$ positioned in the $n+1^{th}$ row is connected to the source terminal of the transfer transistor TG2. The anode terminal of the photodiode PD2 is grounded. The drain terminal of the transfer transistors TG2 is connected to the source terminal of the reset transistors RST and the gate terminal of the source follower transistor SF-Tr. Floating diffusion FD2 for storing charges transferred from the photodiode PD2 is present in the region for the drain terminal of the transfer transistor TG, the source terminal of the reset transistor RST and the gate terminal of the source follower transistor SF-Tr connected to. The floating diffusion FD2 is connected to the floating diffusions FD1 by an interconnection.

The pixels adjacent to each other in the row direction are connected to a reset (RST) line which commonly connects the gate terminals of the common reset transistors RST. The pixels adjacent to each other in the row direction are connected to a transfer gate (TG) line (TG1 line) commonly connecting the gate terminals of the transfer transistors TG1 of the pixels $P_n$ positioned in the $n^{th}$ row. The pixels adjacent to each other in the row direction are connected to a TG line (TG 2 line) commonly connecting the gate terminals of the transfer transistors TG2 of the pixels $P_{n+1}$ in the $n+1^{th}$ row.

The pixels adjacent to each other in the column direction are connected to a signal read line commonly connecting the source terminals of the common select transistors Select. The pixels adjacent to each other in the column direction are connected to a reset voltage (VR) line commonly connecting the drain terminals of the common reset transistors RST and the drain terminals of the common source follower transistors SF-Tr.

The RST lines, the Select lines, TG1 lines and the TG2 lines are respectively connected to a row selecting circuit 12. The signal read lines are connected to a signal read/noise canceller circuit 14. The signal read/noise canceller circuit 14 is connected to an AMP/ADC unit 16 including amplifiers and AD converters provided for the respective columns. The VR lines are connected to an electric power source whose voltage is substantially a source voltage, or an electric power source whose voltage is decreased in the chip.

As described above, in the solid-state image sensor according to the present embodiment, the pixels $P_n$, $P_{n+1}$ adjacent to each other in the column direction commonly include 1 common read transistor part (the reset transistor RST, the select transistor Select and the source follower transistor SF-Tr). In the circuit diagram shown in FIG. 1, the common read transistor parts are enclosed by the dash-dotted lines.

Figure 2:
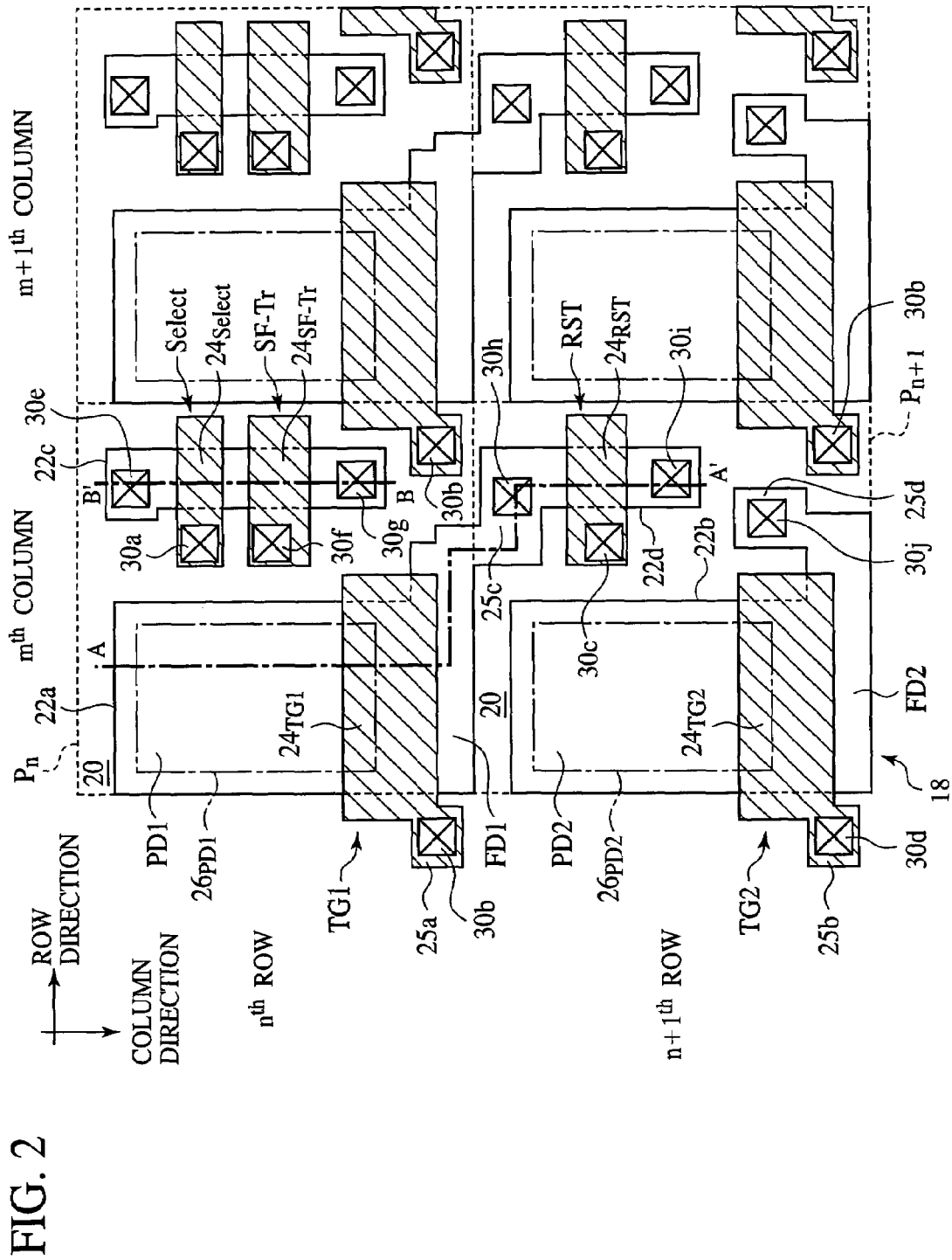
FIG. 2 is a plan view of the solid-state image sensor according to the first embodiment, which shows a structure thereof (part 1).
Figure 3:
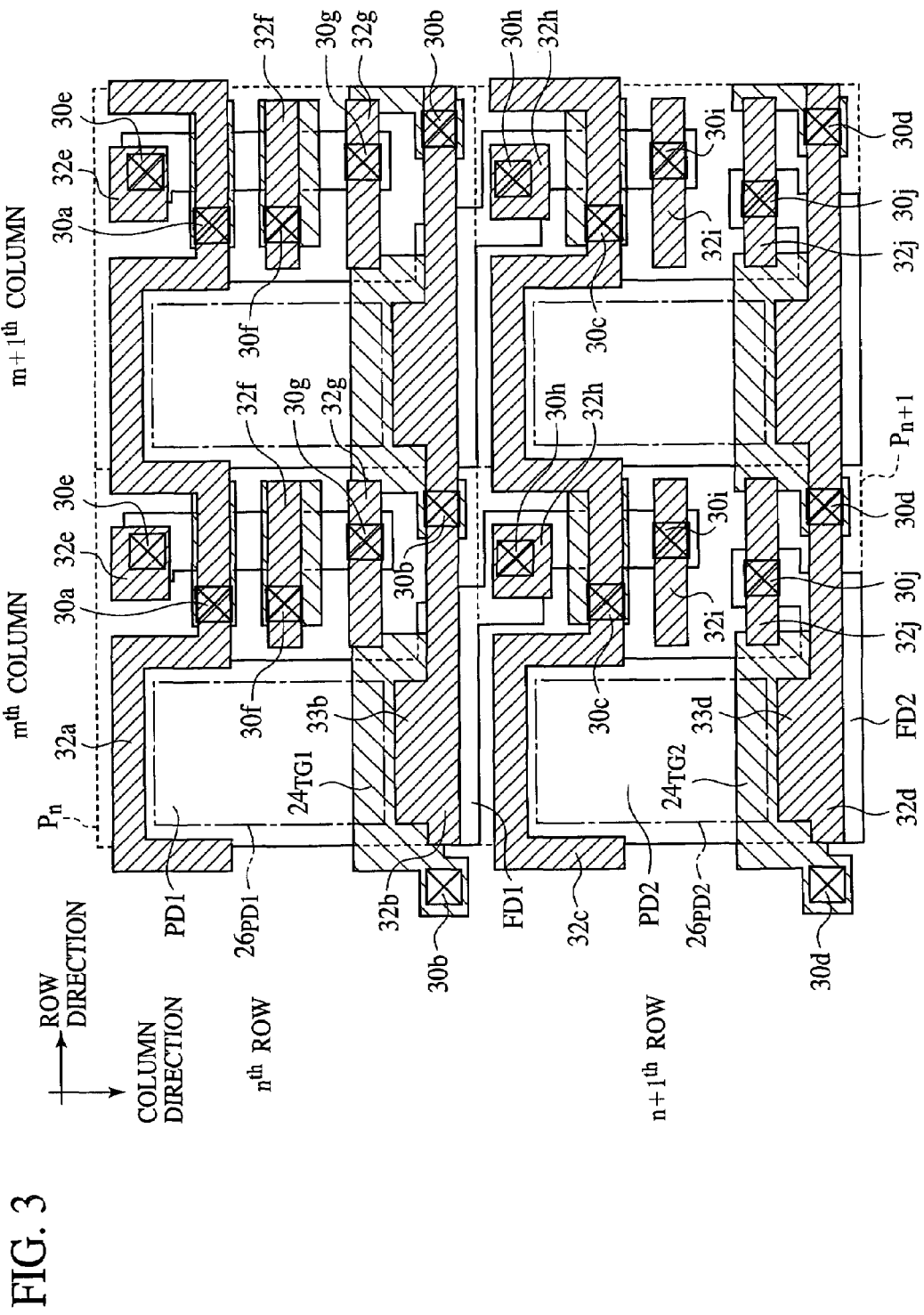
FIG. 3 is a plan view of the solid-state image sensor according to the first embodiment, which shows a structure thereof (part 2).
Figure 4:
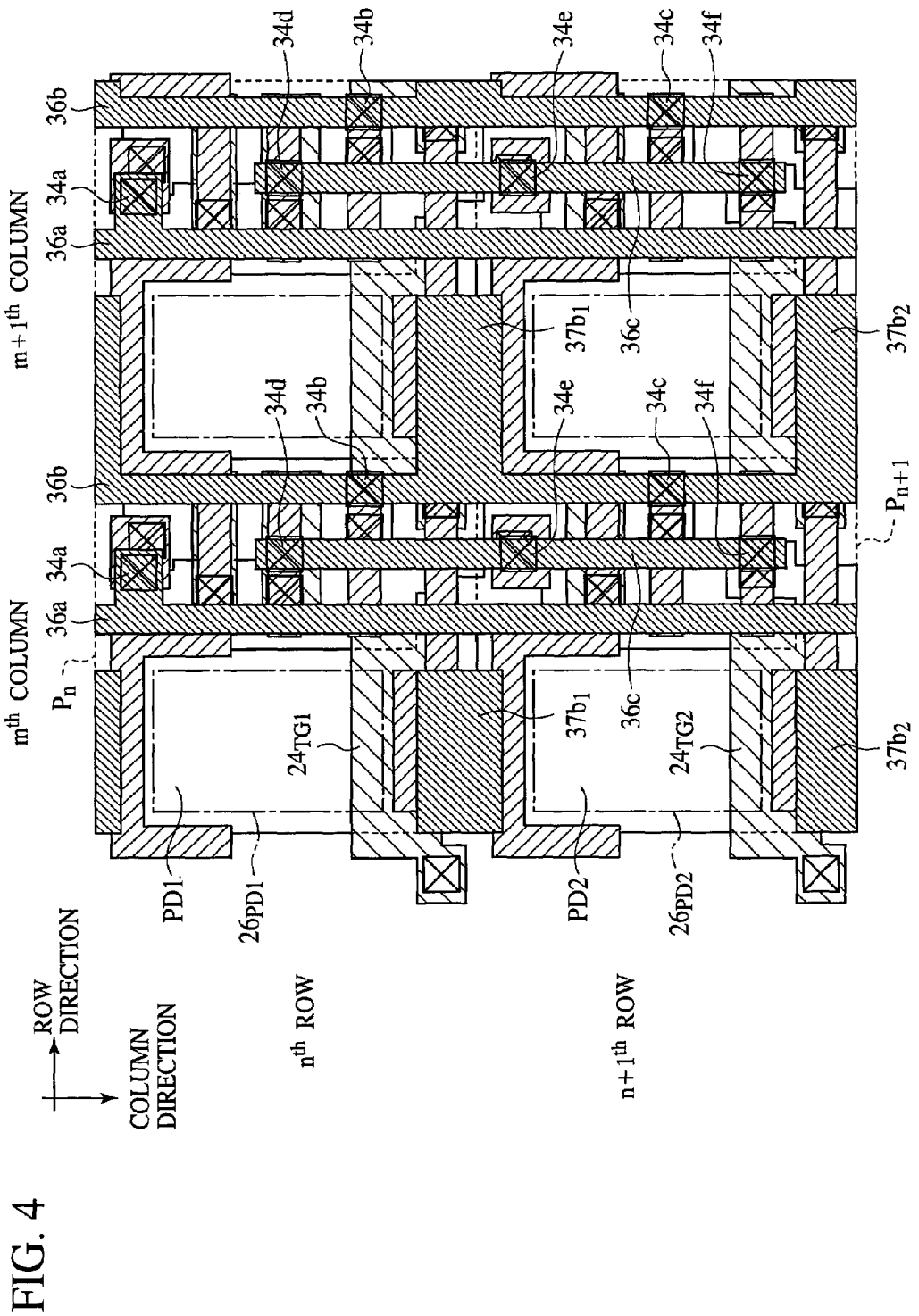
FIG. 4 is a plan view of the solid-state image sensor according to the first embodiment, which shows a structure thereof (part 3).
Figure 5:
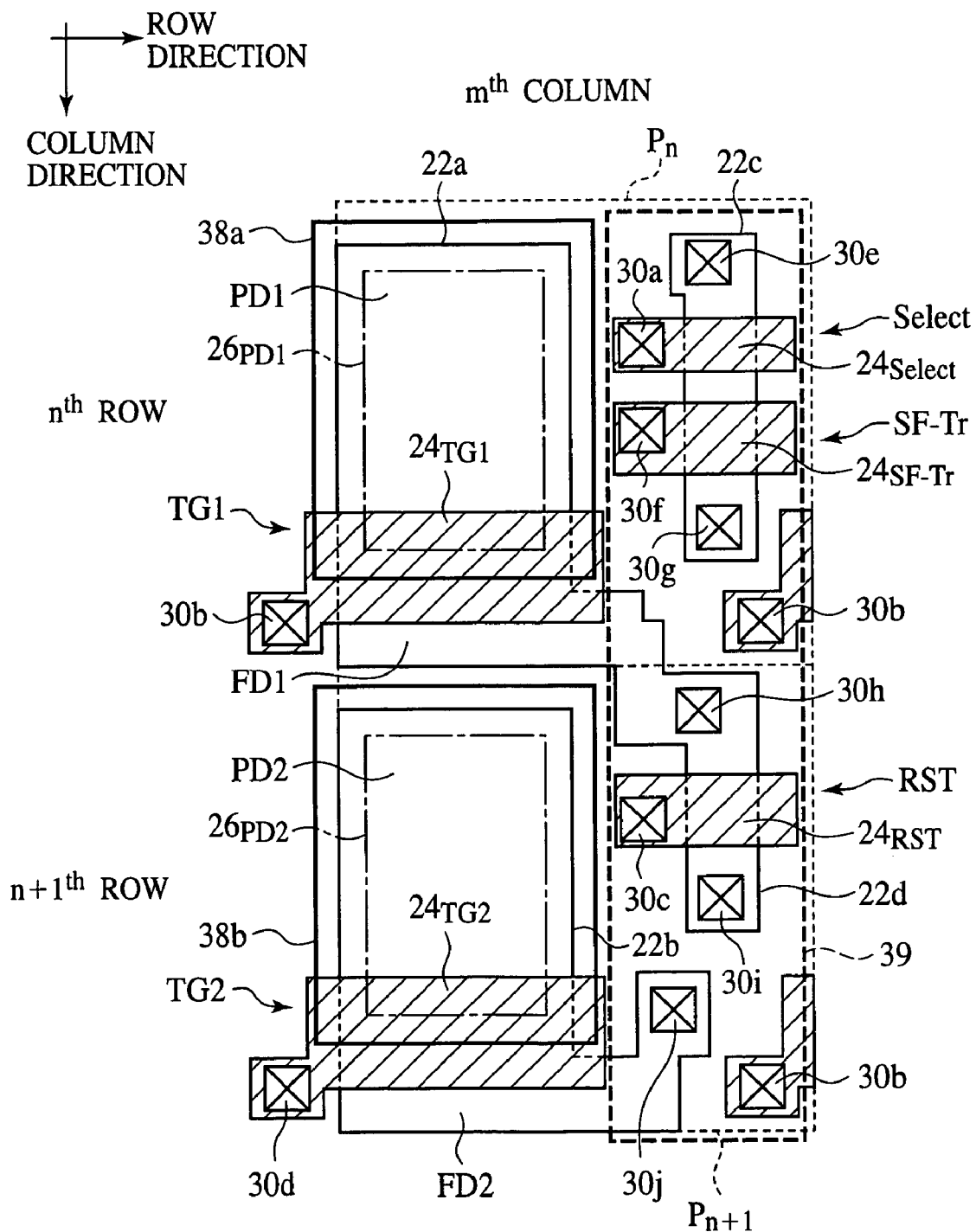
FIG. 5 is a plan view of the solid-state image sensor according to the first embodiment of the present invention, which shows a layout of the active regions and the gate interconnections of the pixel array part with silicidation.

Next, the structure of the solid-state image sensor according to the present embodiment will be explained with reference to FIGS. 2 to 5. FIG. 2 is a plan view of the pixel array part of the solid-state image sensor according to the present embodiment, which shows the layout of the active regions and the gate interconnections thereof. FIG. 3 is a plan view of the pixel array part of the solid-state image sensor according to the present embodiment, which shows the layout of a first metal interconnection layer thereof. FIG. 4 is a plan view of the pixel array part of the solid-state image sensor according to the present embodiment, which shows the layout of the second metal interconnection layer thereof. FIG. 5 is a plan view of the pixel array part of the solid-state image sensor according to the present embodiment, which shows the layout of the active regions and the gate interconnections having prescribed regions thereof silicided.

In FIGS. 2 to 4, of a plurality of substantially square pixels arranged in a matrix in the pixel array part 10, a set of pixels $P_n$, $P_{n+1}$ adjacent to each other in the column direction in the $m^{th}$ column and positioned in the $n^{th}$ row and the $n+1^{th}$ row where the pixels $P_n$, $P_{n+1}$ have the common read transistor part, and the set of pixels $P_n$, $P_{n+1}$ adjacent to each other in the column direction in the $m+1^{th}$ column and positioned in the $n^{th}$ row and the $n+1^{th}$ row where the pixels $P_n$, $P_{n+1}$ have the common read transistor part, totally 2 set of 4 pixels are illustrated. In the actual pixel array part 10, the sets of pixels $P_n$, $P_{n+1}$ adjacent to each other in the column direction having the common read transistor part are arranged with 1 pixel pitch in the row direction and with 2 pixel pitch in the column direction.

As shown in FIG. 2, active regions 22a~22d are defined by a element isolation region 20 on a silicon substrate 18. The active regions 22 of the pixels $P_n$, $P_{n+1}$ adjacent to each other in the column direction having the common read transistor part include a PD1/TG1/FD1 region 22a, a PD2/TG2/FD2 regions 22b, a Select/SF-Tr region 22c and an RST region 22d which will be described later. The PD1/TG1/FD1 region 22a and the RST region 22d are integrally continuous to each other.

The pixel $P_n$ positioned in the $n^{th}$ row has the PD1/TG1/FD1 region 22a including a wide rectangular region which is elongated in the column direction, and a projected region which is continuous to the wide rectangular region and projected from one of the sides of the wide rectangular region, which are parallel with the column direction, where the photodiode PD1, the transfer transistor TG1 and the floating diffusion FD1 are provided.

The pixel $P_{n+1}$ positioned in the $n+1^{th}$ row has the PD2/TG2/FD2 region 22b including a wide rectangular region which is elongated in the column direction, and a projected region which is continuous to the wide rectangular region and projected from one of the sides of the wide rectangular region, which are parallel with the column direction, where the photodiode PD2, the transfer transistor TG2 and the floating diffusion FD2 are provided.

The pixel $P_n$ positioned in the $n^{th}$ row has the Select/SF-Tr region 22c where the select transistor Select and the source follower transistor SF-Tr of the common read transistor part are formed. The Select/SF-Tr region 22c is positioned on the side of one side of the pixel $P_n$, which is parallel with the column direction, with respect to the PD1/TG1/FD1 region 22a. The Select/SF-Tr region 22c has a rectangular shape which is longer in the column direction.

The pixel $P_{n+1}$ positioned in the $n+1^{th}$ row has the RST region 22d where the reset transistor RST of the common read transistor part is provided. The RST region 22d is positioned on the side of one side of the pixel $P_{n+1}$, which is parallel with the column direction, with respect to the PD2/TG2/FD2 region 22b. The RST region 22d is continuous to the projected region of the PD1/TG1/FD1 region 22a provided in the pixel $P_n$ in the $n^{th}$ row and has a rectangular shape which is longer in the column direction.

The PD1/TG1/FD1 region 22a and the PD2/TG2/FD2 region 22b have wide rectangular shapes which are substantially the same. The position of the PD1/TG1/FD1 22a in the pixel $P_n$ and the position of the PD2/TG2/FD2 region 22b in the pixel $P_{n+1}$ are substantially the same. That is, the PD1/TG1/FD1 region 22a and the PD2/TG2/FD2 region 22b are spaced from each other substantially with 1 pixel pitch in the column direction.

The Select/SF-Tr region 22c and the RST region 22d are positioned on the same side in the row direction with respect to the PD1/TG1/FD1 region 22a and the PD2/TG2/FD2 22b.

The photodiode PD1 is formed in the rectangular wide region of the PD1/TG1/FD1 region 22a of the pixel $P_n$ positioned in the $n^{th}$ row. The gate electrode $24_{TG1}$ of the transfer transistor TG1 is formed, bridging the PD1/TG1/FD1 region 22a in the row direction near the lower end of the photodiode PD1 of the PD1/TG1/FD1 region 22a as viewed in the drawing. The end of the buried N-type diffused layer $26_{PD1}$ of the photodiode PD1 is positioned under the end of the gate electrode $24_{TG1}$ on the side of photodiode PD1.

The photodiode PD2 is formed in the wide rectangular region of the PD2/TG2/FD2 region 22b of the pixel $P_{n+1}$ positioned in the $n+1^{th}$ row. The gate electrode $24_{TG2}$ of the transfer transistor TG2 is formed, bridging the PD2/TG2/FD2 region 22b in the row direction near the lower end of the photodiode PD2 of the PD2/TG2/FD2 region 22b as viewed in the drawing. The end of the buried N-type diffused layer $26_{PD2}$ of the photodiode PD2 is positioned under the end of the gate electrode $24_{TG2}$ on the side of the photodiode PD2.

The photodiode PD1 and the photodiode PD2 have substantially the same shape. The gate electrode $24_{TG1}$ and the gate electrode $24_{TG2}$ have substantially the same shape. Furthermore, the positional relationship of the gate electrode $24_{TG1}$ with respect to the photodiode PD1, and the positional relationship of the gate electrode $24_{TG2}$ with respect to the photodiode PD2 are substantially the same. That is, the photodiode PD1 and the photodiode PD2 are spaced from each other substantially with 1 pixel pitch in the column direction, and the gate electrode $24_{TG1}$ and the gate electrode $24_{TG2}$ are spaced from each other substantially with 1 pixel pitch in the column direction. The overlap between the buried N-type diffused layer $26_{PD1}$ of the photodiode PD1 and the gate electrode $24_{TG1}$, and the overlap between the buried N-type diffused layer $26_{PD2}$ of the photodiode PD2 are substantially the same. That is, the area of the part of the buried N-type diffused layer $26_{PD1}$ immediately under the end of the gate electrode $24_{TG1}$, and the area of the part of the buried N-type diffused layer $26_{PD2}$ immediately under the end of the gate electrode $24_{TG2}$ are substantially the same.

As for the shapes of the gate electrodes $24_{TG1}$, $24_{TG2}$, the shapes of the gate electrodes $24_{TG1}$, $24_{TG2}$ may be substantially the same at least between one of edges of the photodiode PD1 which are parallel with the column direction and the other thereof and between one of the edges of the photodiode PD2 which are parallel with the column direction and the other thereof. In other words, at least the shape of the part of the gate electrode $24_{TG1}$ of the pixel $P_n$, which is present between the photodiode PD1 and the photodiode PD2 which are adjacent to each other in the column direction, and the shape of the part of the gate electrode $24_{TG2}$ of the pixel $P_{n+1}$, which is present between the photodiode PD2 and the photodiode PD1 which are adjacent to each other in the column direction are substantially the same.

Above the Select/SF-Tr region 22c of the pixel $P_n$ positioned in the $n^{th}$ row, the gate electrode $24_{Select}$ of the select transistor Select and the gate electrode $24_{SF-Tr}$ of the source follower transistor SF-Tr are formed sequentially from the $n^{th}$ row toward the $n+1^{th}$ row, bridging the Select/SF-Tr region 22c in the row direction.

Above the RST region 22d of the pixel $P_{n+1}$ in the $n+1^{th}$ row, the gate electrode $24_{RST}$ of the reset transistor RST is formed, bridging the RST region 22d in the row direction.

Thus, the common read transistor part (select transistor Select, source follower transistor SF-Tr and reset transistor RST) for the pixels $P_n$, $P_{n+1}$ adjacent in the column direction in the $m^{th}$ column is formed in the region between the photodiodes PD1, PD2 in the $m^{th}$ column and the photodiodes PD1, PD2 in the m+1$^{th}$ column.

The floating diffusion FD1 is formed at the part of the PD1/TG1/FD1 region 22a and the RST region 22d, which is between the gate electrode $24_{TG1}$ and the electrode $24_{RST}$.

The floating diffusion FD2 is formed in the part of the PD2/TG2/FD2 region 22b, which is between the gate electrode $24_{TG2}$ and the contact part 25d provided in the projected region of the PD2/TG2/FD2 region 22b. An FD-SF interconnection 36c (see FIG. 4) for electrically connecting the floating diffusion FD1 and the floating diffusion FD2 with each other, which will be explained later, is electrically connected to the contact part 25d via a contact plug 30j, a lead interconnection (relay interconnection) 32j (see FIG. 3) and a contact plug 34f (see FIG. 4).

Thus, the floating diffusion FD1 and the floating diffusion FD2 are formed respectively at least in regions positioned on the same side in the column direction with respect to the gate electrode $24_{TG1}$ of the transfer transistor TG1 and the gate electrode $24_{TG2}$ of the transfer transistor TG2.

As shown in FIG. 3, the first metal interconnection layer 32 includes the Select line 32a electrically connected to the gate electrode $24_{Select}$ via the contact plug 30a, the TG line (TG1 line) 32b electrically connected to the gate electrode $24_{TG1}$ via a contact plug 30b, the RST line 32c electrically connected to the gate electrode $24_{RST}$ via a contact plug 30c, and the TG line (TG2 line) electrically connected to the gate electrode $24_{TG2}$ via a contact plug 30d. The first metal interconnection layer 32 also includes a lead interconnection 32e electrically connected to the source regions of the select transistor Select via a contact plug 30e, a lead interconnection 32f electrically connected to the gate electrode SF-Tr via a contact plug 32f, a lead interconnection 32g electrically connected to the drain region of the source follower transistor SF-Tr via a contact plug 30g, a lead interconnection 32h electrically connected to the floating diffusion FD1 via a contact plug 30h, a lead interconnection 32i electrically connected to the drain region of the reset transistor RST via a contact plug 30i and a lead interconnection 32j electrically connected to the floating diffusion FD2 via a contact plug 30j.

The Select line 32a is extended sinuously in the row direction, getting around the photodiode PD1. That is, near the photodiode PD1, the Select line 32a is extended along the edge of the photodiode PD1 with a prescribed space from the edge of the photodiode PD1.

The RST line 32c is extended sinuously in the row direction, getting around the photodiode PD2. That is, near the photodiode PD2, the RST line 32c is extended along the edge of the photodiode PD2 with a prescribed space from the edge of the photodiode PD2. The space between the RST line 32c extended along the edge of the photodiode PD2 and the edge of the photodiodes PD2 is substantially equal to the space between the Select line 32a extended along the edge of the photodiode PD1 and the edge of the photodiode PD1. The length of the part of the RST line 32c opposed to the photodiode PD2 is substantially equal to the length of the part of the Select line 32a opposed to the photodiode PD1.

The TG1 line 32b electrically connected to the gate electrode $24_{TG1}$ is extended in the row direction. The TG1 line 32b has a widened part 33b having the width increased toward the photodiode PD1. The widened part 33b is opposed to the edge of the photodiode PD1 with a prescribed space.

Similarly, the TG2 line 32d electrically connected to the gate electrode $24_{TG2}$ is extended in the row direction. The TG2 line 32d has a widened part 33d having the width increased to the photodiode PD2. The widened part 33d is opposed to the edge of the photodiode PD2 with a prescribed space. The space between the widened part 33d of the TG2 line 32d and the edge of the photodiode PD2 is substantially equal to the space between the widened part 33b of the TG1 line 32b and the edge of the photodiode PD1. The length of the widened part of the TG2 line 32d opposed to the photodiode PD2 is substantially equal to the length of the widened part 33b of the TG1 line 32b opposed to the photodiode PD1.

The contact plug 30b electrically connecting the TG1 line 32b to the gate electrode $24_{TG1}$ is connected to the contact part 25a of the gate electrode $24_{TG1}$ projected from a corner of the gate electrode $24_{TG1}$ toward the region between the Select/SF-Tr region 22c and the RST region 22d. The contact part 25a is projected between the Select/SF-Tr region 22c and the RST region 22d of the adjacent pixels in the row direction. Thus, the contact part 25a of the gate electrode $24_{TG1}$ connected to the contact plug 30b is not formed in the region between the photodiode PD1 and photodiode PD2 adjacent to each other in the column direction.

The contact plug 30d electrically connecting the TG2 line 32d to the gate electrode $24_{TG2}$ is connected to the contact part 25b of the gate electrode $24_{TG2}$ projected from a corner of the gate electrode $24_{TG2}$ toward the region between the RST region 22d and the Select/SF-Tr region 22c. The contact part 25b is projected between the Select/SF-Tr region 22c and the RST region 22d of the adjacent pixels in the row direction. Thus, the contact part 25b of the gate electrode $24_{TG2}$ connected to the contact plug 30d is not formed in the region between the photodiode PD1 and photodiode PD2 adjacent to each other in the column direction.

The contact plug 30h electrically connecting the lead interconnection 32h to the floating diffusion FD1 is connected to a contact part 25c provided at a part of the PD1/TG1/FD1 region 22a and the RST region 22d, which is between the gate electrode $24_{TG1}$ and the gate electrode $24_{RST}$. The contact part 25c of the floating diffusion FD1 is not formed in the region between the photodiode PD1 and photodiode PD2 adjacent to each other in the column direction.

The contact plug 30j electrically connecting the lead interconnection 32j to the floating diffusion FD2 is connected to a contact part 25d provided in the projected region of the PD2/TG2/FD2 region 22b. The contact part 25d of the floating diffusion FD2 is not formed in the region between the photodiode PD1 and photodiode PD2 adjacent to each other in the column direction.

As shown in FIG. 4, the second metal interconnection layer 36 includes the signal read line 36a electrically connected to the source region of the select transistor Select via a contact plug 34a, the VR line 36b electrically connected to the drain region of the source follower transistor SF-Tr and the drain region of the reset transistor RST, and an FD-SF interconnection 36c electrically connected to the gate electrode $24_{SF-Tr}$ of the source follower transistor SF-Tr, the floating diffusion FD1 and the floating diffusion FD2 respectively via contact plugs 34d, 34e, 34f.

The signal read line 36a, the VR line 36b and the FD-SF interconnection line 36c are extended in the column direction, respectively. The FD-SF interconnection 36c is disposed between the signal read line 36a and the VR line 36b.

The signal read line 36a is electrically connected to source region of the select transistor Select via the contact plug 30e, the lead interconnection 32e of the first metal interconnection layer 32 and the contact plug 34a.

The VR line 36b has a widened part $37b_1$ having the width increased toward the floating diffusion FD1 and a widened part $37b_2$ having the width increased toward the floating diffusion FD2. The widened part $37b_1$ shields the floating diffusion FD1 against light, and the widened part $37b_2$ shields the floating diffusion FD2 against light. The VR line 36b is electrically connected to the drain region of the source follower transistor SF-Tr via the contact plug 30g, the lead interconnection 32g of the first metal interconnection layer 32 and the contact plug 34b. The VR line 36b is electrically connected to the drain region of the reset transistor RST via the contact plug 30i, the lead interconnection 32i of the first metal interconnection layer 32 and the contact plug 34c.

The FD-SF interconnection 36c is electrically connected to the gate electrode $24_{SF-Tr}$ of the source follower transistor SF-Tr via the contact plug 30f, the lead interconnection 32f of the first metal interconnection layer 32 and the contact plug 34d. The FD-SF interconnection 36c is electrically connected also to the floating diffusion FD1 via the contact plug 30h, the lead interconnection 32h of the first metal interconnection layer 32 and the contact plug 34e. The FD-SF interconnection is electrically connected further to floating diffusion FD2 via the contact plug 30j, the lead interconnection 32j of the first metal interconnection layer 32 and the contact plug 34f. Thus, the floating diffusion FD1, the floating diffusion FD2 and the gate electrode $24_{SF-Tr}$ of the source follower transistor SF-Tr are electrically connected with each other via the FD-SF interconnection 36c and the lead interconnections 32f, 32h, 32j.

Thus the solid-state image sensor according to the present embodiment is constituted.

The solid-state image sensor according to the present embodiment is characterized mainly in that the pixels $P_n$, $P_{n+1}$ adjacent to each other in the column direction having the common read transistor part including the transfer transistor TG1 of the pixel $P_n$ and the transfer transistor TG2 of the pixel $P_{n+1}$ formed in regions which are positioned on the same side in the column direction with respect to the photodiode PD1 of the pixel $P_n$ and the photodiode PD2 of the pixel $P_{n+1}$, and the common read transistor part is formed in a region positioned on the same side in the row direction with respect to the photodiode PD1 of the pixel $P_n$ and the photodiode PD2 of the pixel $P_{n+1}$.

As described above, the common read transistor part is not formed in the region between the photodiodes PD1, PD2 adjacent to each other in the column direction, and the position of the transfer transistor TG1 with respect to the photodiode PD1 and the position of the transfer transistor TG2 with respect to the photodiode PD2 are the same, whereby sufficient areas of the photodiodes PD1, PD2 can be ensured, and the photosensitivities and charge transfer characteristics can be made uniform between the pixels $P_n$, $P_{n+1}$.

In the solid-state image sensor according to the present embodiment, the shape of the photodiode PD1 and the shape of the photodiode are substantially the same. The shape of the gate electrode $24_{TG1}$ of the transfer transistor TG1 and the shape of the gate electrode $24_{TG2}$ are substantially the same. This can make the photosensitivities and charge transfer characteristics further uniform between the pixels $P_n$, $P_{n+1}$. Regarding the shape of the gate electrode $24_{TG1}$ and the gate electrode $24_{TG2}$, it is possible that the shape of the part of the gate electrode $24_{TG1}$ of the pixel $P_n$, which is between the photodiodes PD1, PD2 adjacent to each other in the column direction, and the shape of the part of the gate electrode $24_{TG2}$ of the pixel $P_{n+1}$, which is between photodiodes PD2, PD1 adjacent to each other in the column direction are at least the same each other.

In the solid-state image sensor according to the present embodiment, the positional relationship of the gate electrode $24_{TG1}$ of the transfer transistor TG1 with respect to the photodiode PD1 and the positional relationship of the gate electrode $24_{TG2}$ of the transfer transistor TG2 with respect to the photodiode PD2 are the same. That is, the photodiode PD1 and the photodiode PD2 are spaced from each other with 1 pixel pitch in the column direction, and the gate electrode $24_{TG1}$ of the transfer transistor TG1 and the gate electrode $24_{TG2}$ of the transfer transistor TG2 are spaced from each other with 1 pixel pitch in the column direction. Thus, the photosensitivities and charge transfer characteristics can be made further uniform between the pixels $P_n$, $P_{n+1}$.

Even when a displacement takes place in forming the photodiodes PD1, PD2 and the transistors TG1, TG2, the above-described layout makes a change of the layout of the photodiode PD1 and the transfer transistor TG1 and a change of the layout of the photodiode PD2 and the transfer transistor TG2 substantially equal to each other. Accordingly, even when a displacement takes place, the photosensitivities and charge transfer characteristics between the pixels $P_n$, $P_{n+1}$ can be retained uniform.

The solid-state image sensor according to the present embodiment is characterized also in that the width in the row direction of the active region where the photodiode PD1 is formed, and the width in the row direction of the active region under the gate electrode $24_{TG1}$ of the transfer transistor TG1 are substantially the same, and the width in the row direction of the active region where the photodiode PD2 is formed and the width in the row direction of the active region under the gate electrode $24_{TG2}$ of the transfer transistor TG2 are substantially the same. Thus, the charge transfer from the photodiode PD1 to the floating diffusion FD1, and the charge transfer from the photodiode PD2 to the floating diffusion FD2 can be highly efficient.

In the layout illustrated in FIG. 4 of Japanese published unexamined patent application No. 2000-232216, adjacent pixels in the column direction including a common read transistor have the transfer transistors positioned on the same side in the row direction with respect to the photodiodes, and the positional relationship between the transfer transistor with respect to the photodiode is symmetric between the adjacent pixels with respect to the border line between the pixels. In this case, because the position of the transfer transistor with respect to the photodiode is different between the adjacent pixels in the column direction, there is a possibility that manners of the reflection of light incident on the pixels may be different. Because the position of transfer transistor with respect to the PD is different between the adjacent pixels in the column direction, impurity diffused regions of PD1 and PD2 can not be the same shapes. Because the width of the active region from the photodiode to the transfer transistor is narrowed, it will be difficult to obtain high charge transfer rate. Furthermore, the transfer transistors and the common read transistor part are positioned on the same side with respect to the photodiodes, and the width of the transfer transistors and the width of the read transistor part are traded off each other. Accordingly, it will be difficult to ensure a sufficient width of the gate electrodes of the transfer transistors.

In the layouts of the pixels shown in FIG. 2 of Japanese published unexamined patent application No. 2000-232216, FIG. 2 of Japanese published unexamined patent application No. Hei 11-126895 (1999) and FIG. 10 of Japanese published unexamined patent application No. Hei 10-256521 (1998), column-wide adjacent pixels including a common read transistor part have the transfer transistors positioned on the side of the border between the pixels with respect to the photodiodes, and the positional relationship of the transfer transistor with respect to the photodiode is symmetric between the pixels with respect to the border line. In this case, the positions of the transfer transistors with respect to the photodiodes are opposite in the column direction between the adjacent pixels in the column direction. Accordingly, when the photodiodes and the transfer transistors are formed with displacement in the column direction, the photodiode and the transfer transistor are nearer in one of the pixels, and in the other pixel, the photodiode and the transfer transistor are remoter. Resultantly, the charge transfer characteristics are different between the adjacent pixels in the column direction.

In the pixel layout shown in FIG. 1 of Japanese published unexamined patent application No. Hei 10-150182 (1998) as well as the pixel layout shown in FIG. 2 of Japanese published unexamined patent application No. 2000-232216, etc. described above, the position of the transfer transistor with respect to the photodiode is opposite between the pixels adjacent in the column direction. When the photodiodes and the transfer transistors are formed with the displacement in the column direction, the charge transfer characteristics differ between the adjacent pixels in the column direction.

In FIG. 3 of Japanese published unexamined patent application No. 2001-298177, adjacent pixels in the column direction including a common read transistor include the transfer transistors positioned on the same side in the row direction with respect to the photodiodes, but no specific layout of the pixels is referred to.

Furthermore, the solid-state image sensor according to the present embodiment is characterized also in that the metal interconnections are constituted as follows.

In the first metal interconnection layer 32, the space between the interconnection layers (Select line 32a and TG1 line 32b) extended along the edge of the photodiode PD1 and the edge of the photodiode PD1, and the space between the interconnection layers (RST line 32c, and TG2 line 32d) extended along the edge of the photodiode PD2 and the edge of the photodiode PD2 are substantially equal to each other. The length of the parts of the interconnection layers (Select line 32a and TG1 line 32b) extended along the edge of the photodiode PD1, which are opposed to the photodiode PD1, and the length of the parts of the interconnection layers (RST line 32c and TG2 line 32d) extended along the edge of the photodiode PD2, which are opposed to the photodiode PD2 are substantially equal to each other.

Thus, light incident on the pixels $P_n$, $P_{n+1}$ including the common read transistor part and positioned in the $n^{th}$ row and the n+1$^{th}$ row can be equally shut off, and uniform light receiving characteristics can be obtained. Especially in the pixels at the peripheral edge of the pixel array part 10, on which light is slantingly incident, the incident light can be shut off by the first metal layer equally in the adjacent pixels. Uniform light receiving characteristics can be obtained.

In the second metal interconnection layer 36 as well, the space between the interconnection layers (signal read line 36a and VR line 36b) adjacent to the photodiode PD1 and the edge of the photodiode PD1, and the space between the interconnection layers (signal read line 36a and VR line 36b) adjacent to the photodiode PD2 and the edge of the photodiode PD2 are substantially equal to each other. The length of the part of the interconnection layers (signal read line 36a and VR line 36b), which are opposed to the photodiode PD1, and the length of the part of the interconnection layers (signal read line 36a and VR line 36b), which are opposed to the photodiode PD2 are substantially equal to each other.

Thus, as in the first metal interconnection layer 32, light incident on the pixels $P_n$, $P_{n+1}$ including the common read transistor part and positioned in the $n^{th}$ row and the n+1$^{th}$ row can be equally shut off by the second metal interconnection layer 36, and uniform light receiving characteristics can be obtained. Especially in the pixels at the peripheral edge of the pixel array part 10, on which light is slantingly incident, the incident light can be shut off by the second metal interconnection layer 36 equally in the adjacent pixels. Uniform light receiving characteristics can be obtained.

The floating diffusion FD1, the floating diffusion FD2 and the gate electrode $24_{SF-Tr}$ of the source follower transistor SF-Tr are electrically connected to one another via the FD-SF interconnection 36c extended in the column direction formed in the second metal interconnection layer 36, and the lead interconnections 32f, 32h, 32j formed in the first meal interconnection layer 32. In the first metal interconnection layer 32, which includes the interconnections extended in the row direction, no interconnection extended in the column direction is formed, but the lead interconnections 32f, 32h, 32j are formed so as to electrically connect the floating diffusions FD1, FD2 and the gate electrode $24_{SF-Tr}$ of the source follower transistor SF-Tr arranged in the column direction. Accordingly, floating diffusions FD1, FD2 and the gate electrode $24_{SF-Tr}$ of the source follower transistor SF-Tr can be electrically connected to each other without a complicated interconnection layout.

In the layout of the active regions and the gate interconnections, the contact parts 25a, 25b of the gate electrodes $24_{TG1}$, $24_{TG2}$ of the transfer transistors TG1, TG2, and the contact parts 25c, 25d of the floating diffusions FD1, FD2 are not formed in the region between the photodiodes PD1, PD2 adjacent to each other in the column direction. Such layout of the contact parts permits the length of the photodiodes PD1, PD2 to be increased in the column direction, and the light receiving amount per 1 pixel can be increased.

Furthermore, the number of the contact plugs connected to the floating diffusions is smaller in comparison with the conventional number, which can decrease the junction leak.

In the structure shown in FIGS. 2 to 4, both active regions where the floating diffusions FD1, FD2 are formed are extended up to the side of the active region where the common read transistor part is formed. The shape of the active region where the floating diffusion FD1 is formed and the shape of the active region where the floating diffusion FD2 is formed are different from each other. Accordingly, it may be difficult to completely shield against light the active regions where the floating diffusions FD1, FD2 are formed, by the first and the second metal interconnection layers 32, 36. In such case, a third metal interconnection layer is formed on the second metal interconnection layer 36 with an insulation film formed therebetween to thereby shield against light the active regions where the floating diffusions FD1, FD2 are formed. However, when a metal interconnection layer is formed at a position which is high above the silicon substrate 18, even light incident on the photodiodes PD1, PD2 is shielded off by the metal layer, depending on an incident angle of the light, and there is a risk that the light amounts incident on the photodiodes PD1, PD2 may be decreased.

To shield from light the active regions where the floating diffusions FD1, FD2 are formed while preventing the above-described decrease of the light amount incident on the photodiodes PD1, PD2, the surfaces of the active regions where the floating diffusions FD1, FD2 are silicided. FIG. 5 is a plan view of the active regions and the gate interconnections in the pixel array part with the surfaces silicided, which illustrate the layout thereof. In FIG. 5, the layout is represented by 1 set of a pixel $P_n$, and a pixel $P_{n+1}$ in the $n^{th}$ row and the $n+1^{th}$ row, which include the common read transistor part and are adjacent to each other in the column direction.

As shown in FIG. 5, a rectangular silicidation preventing pattern 38a for preventing the silicidation is formed on the active region where the photodiode PD1 is formed and on the part of the gate electrode $24_{TG1}$, which overlaps the photodiode PD1, covering them. Similarly, a rectangular silicidation preventing pattern 38b for preventing the silicidation is formed on the active region where the photodiode PD2 is formed and on the part of the gate electrode $24_{TG2}$, which overlaps the photodiode PD2, covering them.

A metal silicide film of a CoSi film, a TiSi film or others is formed on the rest active regions which are not covered by the silicidation preventing patterns 38a, 38b and the gate electrodes.

Thus, the silicidation of the surfaces of the active regions where the floating diffusions FD1, FD2 are formed can sufficiently prevent the incidence of light on floating diffusions FD1, FD2 between the metal interconnection layers.

In FIG. 5, entire surfaces of the active regions where the floating diffusions FD1, FD2 are formed are silicided. However, at least the region (the region 39 enclosed by the thick dotted line in FIG. 5) of the active regions where the floating diffusions FD1, FD2 are formed, which is other than the region between the photodiodes PD1, PD2 adjacent to each other in the column direction may be silicided. Such partial silicidation can sufficiently prevent the incidence of light on the floating diffusions FD1, FD2 between the metal interconnection layers.

In the above-described silicidation, preferably, the surfaces of the gate electrodes $24_{TG1}$, $24_{TG2}$ on the buried N-type diffused layer $26_{PD1}$, $26_{PD2}$ are not silicided. This permits the incident light to be received even at the parts of the photodiodes PD1, PD2, which overlap the gate electrodes $24_{TG1}$, $24_{TG2}$ and the decrease of the light receiving area of the photodiodes PD1, PD2 due to the silicidation can be prevented.

Furthermore, it is preferable to make the positional relationship of the metal silicide film formed on the gate electrode $24_{TG1}$ and the photodiode PD1 substantially the same as the positional relationship of the metal silicide film formed on the gate electrode $24_{TG2}$ and the photodiode PD2. This makes it possible to make the light receiving characteristics uniform between the photodiodes PD1, PD2.

Next, the method for fabricating the solid-state image sensor according to the present embodiment will be explained with reference to FIGS. 6A-6B to 10. FIGS. 6A-6B to 10 are sectional views of the solid-state image sensor according to the present embodiment along the line A-A' and the line B-B' in the steps of the method for fabricating the same. In FIGS. 6A-6B to 10, the A-A' line sectional views and the B-B' line sectional views are shown side by side. In the following description, the surfaces of the active regions where the floating diffusions are formed, etc. are silicided as shown in FIG. 5.

First, the element isolation regions 20 are formed on the silicon substrate 18 by, e.g., STI (see FIG. 6A). Thus, the active regions 22 having the patterns as shown in FIG. 2 are defined in the respective pixels. The element isolation regions 20 may be formed by STI or, e.g., LOCOS.

Then, prescribed wells, etc. are formed in the silicon substrate 18 as follows.

First, in the region except the region $23_{PD1}$ for the photodiode PD1 to be formed in, the region $23_{TG1}$ for the transfer transistor to be formed in, a partial region of the region $23_{FD1}$ for the floating diffusion FD1 to be formed in, which is nearer to the photodiode PD1, boron ions, for example, are implanted at a 300 keV acceleration energy and a $1\times10^{13} \sim 3\times10^{13}$ cm$^{-2}$ dose. Thus, a deep P-type well 40 is buried in the silicon substrate 18 at an about 750~850 nm-depth.

Next, in the region $23_{PD1}$ for the photodiode PD1 to be formed in, the region $23_{TG1}$ for the transfer transistor to be formed in, a partial region of the region $23_{FD1}$ for the floating diffusion FD1 to be formed in, which is nearer to the photodiode PD1, boron ions, for example, are implanted at a 30 keV acceleration energy and a $0.5\times10^{12} \sim 3\times10^{12}$ cm$^{-2}$ dose. Further, boron ions are implanted at a 150 keV acceleration energy and a $1\times10^{12} \sim 2\times10^{12}$ cm$^{-2}$ dose. Thus, a shallow P-type well 42 which is shallower than the deep P-type well 40 is formed.

Then, in the region $23_{RST}$ for the reset transistor RST to be formed in, the region $23_{SF-Tr}$ for the source follower transistor SF-Tr to be formed in and the region $23_{Select}$ for the select transistor Select to be formed in, boron ions, for example, are implanted at a 30 keV acceleration energy and a $\sim5\times10^{12}$ cm$^{-2}$. Thus, a threshold voltage control layer 44 which is shallower than the P-type well 42 is formed. The threshold voltage control layer 44 controls the threshold voltages of the reset transistor RST, the source follower transistor SF-Tr and the select transistor Select.

Thus, the prescribed well, etc. are formed in the silicon substrate 18 (see FIG. 6B).

Then, the impurity for forming the buried N-type diffused layer $26_{PD1}$ for the photodiode PD1 to be formed in is implanted at different acceleration energies. That is, phosphorus ions, for example, are implanted at a 135 keV acceleration energy and a $1\times10^{12} \sim 2\times10^{12}$ cm$^{-2}$ dose. Subsequently, phosphorus ions, for example, are implanted at a 207 keV acceleration energy and a $1\times10^{12} \sim 2\times10^{12}$ cm$^{-2}$ dose. Subsequently, furthermore, phosphorus ions, for example, are implanted at a 325 keV acceleration energy and a $1\times10^{12} \sim 2\times10^{12}$ cm$^{-2}$ dose. In addition to the first implantation of phosphorus ions at a 135 keV acceleration energy, arsenic ions may be implanted at a 250-300 keV acceleration energy. Thus, the buried N-type diffused layer $26_{PD1}$ is formed in the region $23_{PD1}$ for the photodiode PD1 to be formed in (see FIG. 7A). The element isolation region 20 and the buried N-type diffused layer $26_{PD1}$ are spaced from each other by, e.g., about 0.2~0.3 μm.

Then, for example, the gate insulation film 46 of, e.g., an about 8 nm-thickness silicon oxide film is formed in the active region defined by the element isolation regions 20 by, e.g., thermal oxidation.

Then, a polysilicon film of, e.g., a ~180 nm-thickness is deposited by, e.g., CVD method.

Then, phosphorus ions, for example, are implanted in the polysilicon film at a 20 keV acceleration energy and a $4\times10^{15} \sim 5\times10^{15}$ cm$^{-2}$.

Then, thermal processing of, e.g., 800° C. is performed for 30~60 minutes to activate the implanted impurity.

Thus, the polysilicon film of the pixel array part 10 and the N-type transistor region of the peripheral circuit (not shown) becomes N$^+$-type.

Figure 7A:
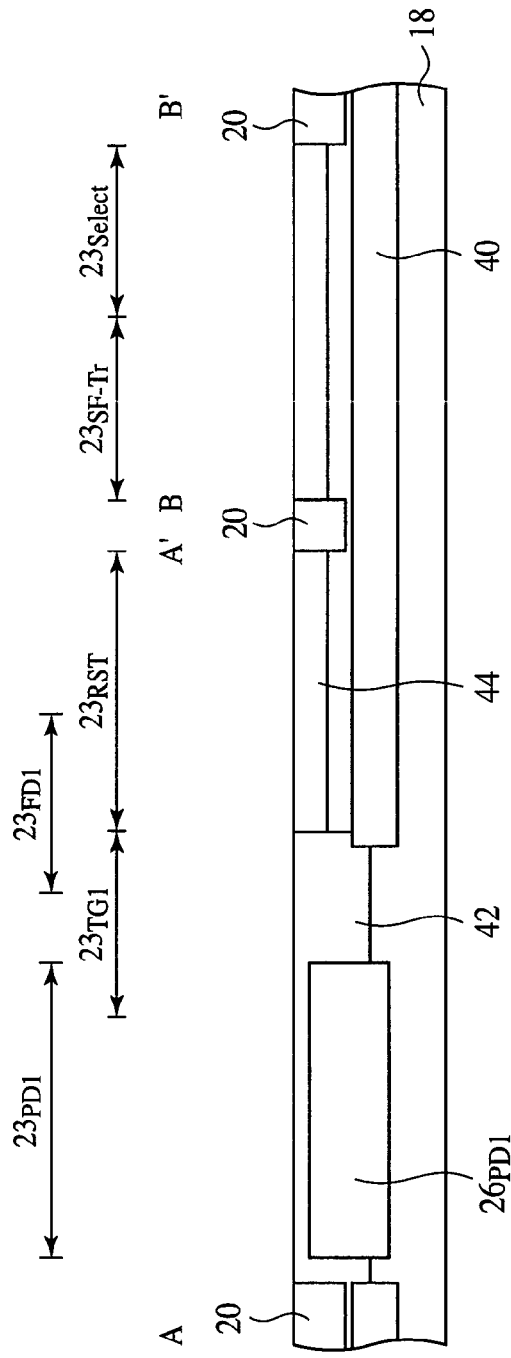
FIGS. 7A and 7B are sectional views of the solid-state image sensor according to the first embodiment of the present invention in the steps of the method for fabricating the same, which show the method (Part 2).
Figure 7B:
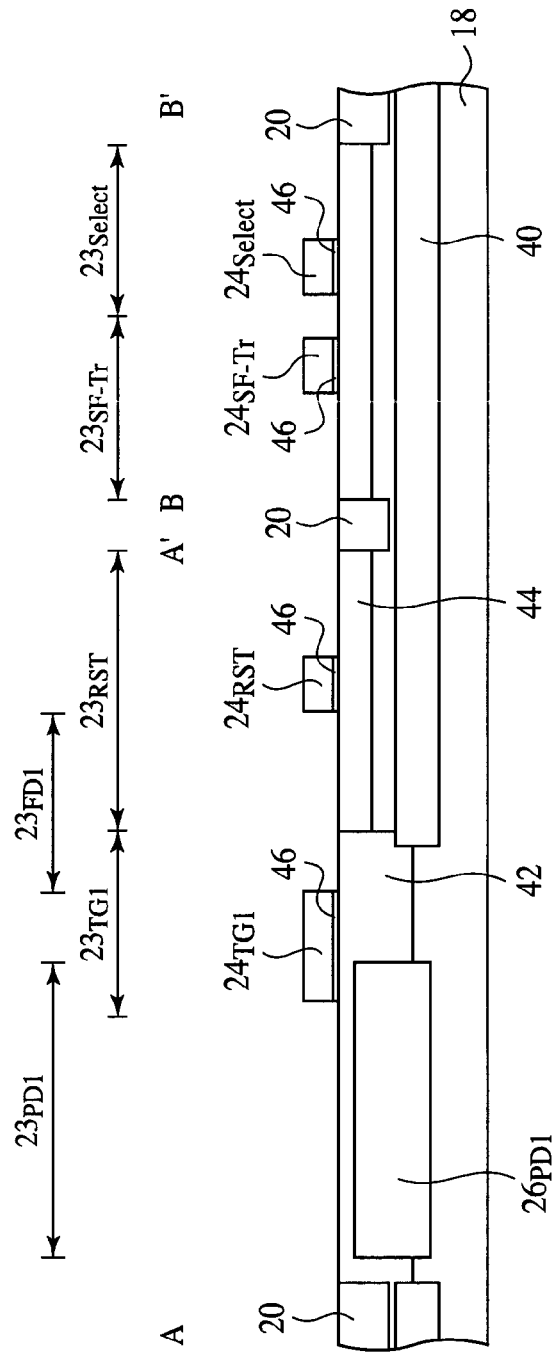

Then, the polysilicon film is patterned by photolithography and dry etching to form the gate electrodes 24 (see FIG. 7B).

At this time, the gate electrode $24_{TG1}$ is formed, overlapping the buried N-type diffused layer $26_{PD1}$ of the photodiode PD1 in, e.g., an about 0.3 μm-width.

The gate electrodes 24 are formed in the relationship of the gate lengths that the gate electrode $24_{SF-Tr}$ of the source follower transistor SF-Tr and the gate electrode $24_{RST}$ are substantially equal to each other, the gate electrode $24_{TG1}$ of the transfer transistor TG1 is longest, the gate electrode $24_{SF-}$ $_{Tr}$ of the source follower transistor SF-Tr and the gate electrode $24_{RST}$ of the select transistor RST are second longest, and the gate electrode $24_{Select}$ of the select transistor Select is shortest, or otherwise in the relationship of the gate lengths that the gate electrode $24_{RST}$ of the reset transistor RST and the gate electrode $24_{Select}$ of the select transistor Select are substantially equal to each other, the gate electrode $24_{TG1}$ of the transfer transistor TG1 is longest, the gate electrode $24_{SF-Tr}$ of the source follower transistor SF-Tr is second longest, and the gate electrode $24_{RST}$ of the reset transistor RST and the gate electrode $24_{Select}$ of the select transistor Select are shortest. Thus, the gate electrodes 24 are so formed that the gate length of the gate electrode $24_{TG1}$ of the transfer transistor TG1 is largest in the transistors of the pixel. It is preferable that the gate length of the source follower transistor SF-Tr desirably with a suppressed variation is larger than that of the select transistor Select, which is used only as the switch.

After the gate electrodes 24 have been formed, the impurity diffused regions to be the LDD regions of the respective transistors, etc. are formed.

First, a photoresist film (not shown) for covering the region $23_{PD1}$ for the photodiode PD1 to be formed in, the region $23_{TG1}$ for the transfer transistor TG1 to be formed in, and a region of the region $23_{FD1}$ for the floating transistor FD1 to be formed in, which is nearer to the region $23_{TG1}$ for the transfer transistor TG1 to be formed in is formed by photolithography. Subsequently, with the photoresist film and the gate electrodes 24 as a mask, phosphorus ions, for example, are implanted at a 20 keV acceleration energy and a ~$4\times10^{13}$ cm$^{-2}$ dose to form an impurity diffused region 48 to be the LDD regions of the reset transistor RST, the source follower transistor SF-Tr and the select transistor Select. After the impurity diffused region 48 has been formed, the photoresist film used as the mask is removed.

Then, a photoresist film (not shown) for exposing a region of the region $23_{TG1}$ for the transfer transistor TG1 to be formed in, which is on the side of the region $23_{FD1}$ for the floating diffusion FD1 to be formed in, and a region of the region $23_{FD1}$ for the floating diffusion FD1 to be formed in, which is nearer to the region $23_{TG1}$ for the transfer transistor TG1 to be formed in is formed. Subsequently, with the resist film and the gate electrodes 24 as a mask, phosphorus ions, for example, are implanted at a 20 keV acceleration energy and a $5\times10^{12}$~$5\times10^{14}$ cm$^{-2}$ to form the impurity diffused region 50 which is to be the LDD region of the transfer transistor TG1. The impurity diffused region 50 is formed by self-alignment with the gate electrode $24_{TG1}$ of the transfer transistor TG1. After the impurity diffused region 50 has been formed, the resist film used as the mask is removed.

Then, boron ions, for example, are implanted in the region $23_{PD1}$ for the photodiode PD1 to be formed in at a 5~10 keV acceleration energy and $1\times10^{13}$~$5\times10^{13}$ cm$^{-2}$ dose to form the P$^+$-type shield layer 52 on the surface of the region $23_{PD1}$ for the photodiode PD1 to be formed in. The P$^+$-type layer 52 is formed by self-alignment with the gate electrode $24_{TG1}$ of the transfer transistor TG1. The P$^+$-type layer 52 buries the photodiode PD1 so that the depletion layer extended from the buried N-type diffused layer $26_{PD1}$ may not contact with the silicon/silicon oxide film interface. Thus, the photodiode PD1 can be invulnerable to the junction leak.

Figure 8A:
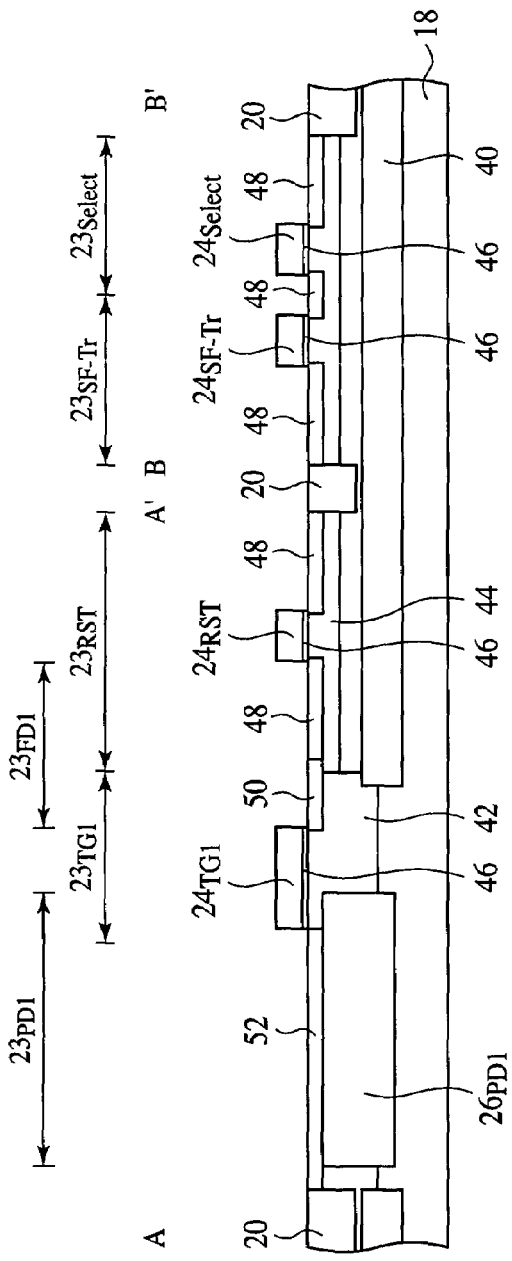
FIGS. 8A and 8B are sectional views of the solid-state image sensor according to the first embodiment of the present invention in the steps of the method for fabricating the same, which show the method (Part 3).
Figure 8B:
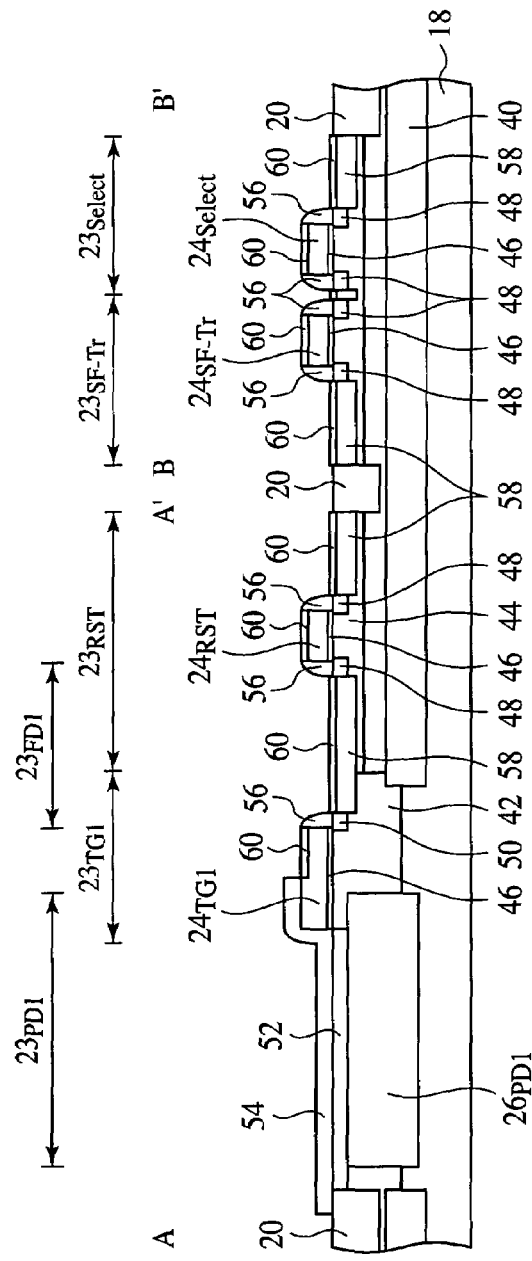

Thus, the impurity diffused regions 48, 50 and the P$^+$-type shield layer 52 are formed (see FIG. 8A).

Then, a 100 nm-thickness silicon oxide film 54, for example, is formed by, e.g., CVD method.

Then, a resist film (not shown) for covering the region $23_{PD1}$ for the photodiode PD1 to be formed in and a part of the gate electrode $24_{TG1}$ of the transfer transistor TG1, which is on the side of the region $23_{PD1}$ for the photodiode PD1 to be formed in is formed by photolithography, and then the silicon oxide film 54 is anisotropically etched. Thus, a sidewall insulation film 56 of the silicon oxide film 54 is formed, while the silicon oxide film 54 is left in the region $23_{PD1}$ for the photodiode PD1 to be formed in and the part of the gate electrode $24_{TG1}$ of the transfer transistor TG1 on the side of the region $23_{PD1}$ for the photodiode PD1 to be formed in. The silicon oxide film 54 left in the region $23_{PD1}$ for the photodiode PD1 to be formed in and in the part of the gate electrode $24_{TG1}$ of the transfer transistor TG1, which is one the side of the region $23_{PD1}$ for the photodiode PD1 to be formed in functions as a silicidation preventing pattern 38a for preventing the silicidation shown in FIG. 5.

Then, with the silicon oxide film 54, the gate electrode 24 and the sidewall insulation film 56 as a mask, phosphorus ions, for example, are implanted at an about 15 keV acceleration energy and an about $2\times10^{15}$ cm$^{-2}$ dose to form a heavily impurity diffused region 58. After the heavily impurity implanted region 58 has been formed, thermal processing of, e.g., 1000° C. is performed for about 10 seconds to activate the impurity ion implanted.

Then, an about 10 nm-thickness cobalt film, for example, is deposited by, e.g., sputtering and is subjected to RTA thermal processing of, e.g., about 10's seconds and 500~600° C., and the silicidation reaction is made. Then, the Co film which remains unreacted is removed, and RTA processing of 800~900° C. and about 10's seconds is performed. Thus, a metal silicide film 60 is formed selectively in the region on the surface of which the silicon is exposed. At this time, because of the silicon oxide film 54 formed in the region $23_{PD1}$ for the photodiode PD1 is to be formed in and the part of the gate electrode $24_{TG1}$ of the transfer transistor TG1, which is on the side of the region $23_{PD1}$ for the photodiode PD1 to be formed in, the metal silicide film 60 is not formed there (see FIG. 8B).

Then, an about 70 nm-thickness silicon nitride film 62, for example, and an about 1000 nm-thickness silicon oxide film 64, for example, are deposited by, e.g., plasma CVD method.

Next, the surface of the silicon oxide film 64 is polished by, e.g., CMP method to be flattened.

Then, contact holes 66 are formed in the silicon oxide film 64 and the silicon nitride film 62 down to the metal silicide film 60 on the gate electrodes 24 or the source/drain diffused layers by photolithography and dry etching.

Next, a ~30 nm-thickness titanium film, for example, and a ~50 nm-thickness titanium nitride film, for example, are sequentially deposited by, e.g., sputtering. Subsequently, a ~300 nm-thickness tungsten film is deposited on the titanium nitride film by, e.g., CVD method.

Then, the tungsten film, the titanium nitride film and the titanium film are polished by, e.g., CMP method until the surface of the silicon oxide film 64 is exposed to form contact plugs buried in the contact holes 66. In FIGS. 9 and 10, the contact plugs 30 are represented by the contact plugs 30h, 30i, 30e, 30g.

Next, on the silicon oxide film 64 with the contact plugs 30 buried in, a ~30 nm-thickness titanium film, for example, a ~50 nm-thickness titanium nitride film, for example, a 400 nm-thickness aluminum film, for example, a ~5 nm-thickness titanium film, for example, and a ~50 nm-thickness titanium nitride film are sequentially deposited by, e.g., sputtering. Then, these metal films are patterned by photolithography and dry etching to form the first metal interconnection layer 32. In the FIG. 10, the first metal layer 32 is represented by the Select lines 32a, the TG1 line 32b, the RST line 32c and the lead interconnections 32e, 32f, 32g, 32h, 32i.

Then, on the inter-layer insulation film 64 with the first metal interconnection layer 32 formed on, a ~750 nm-thickness silicon oxide film, for example, is deposited by, e.g., high density plasma CVD method. Subsequently, a ~1100 nm-thickness silicon oxide film, for example, is formed by plasma CVD method. After the silicon oxide films have been deposited, the surface of the silicon oxide film is polished by, e.g., CMP method to be flattened. Thus, the inter-layer insulation film 68 of the silicon oxide film is formed on the inter-layer insulation film 64 with the first metal interconnection layer 32 formed on.

After the inter-layer insulation film 68 has been formed, contact plugs 34 buried in the inter-layer insulation film 68, and the second interconnection layer 36 connected to the first metal interconnection layer 32 via the contact plugs 34 buried in the inter-layer insulation film 68 are formed. In FIG. 10, the contact plugs 34 are represented by the contact plugs 34$a$, 34$d$, 34$e$, and the second metal interconnection layer 36 is represented by the signal lead line 36$a$, the VR line 36$b$ and the FD-SF interconnection 36$c$.

Next, an inter-layer insulation film 70 is formed on the inter-layer insulation film 68 with the second metal interconnection layer 36 formed on in the same way as the inter-layer insulation film 68 has been formed.

Next, on the inter-layer insulation film 70, a cover film 72 of a silicon nitride film is deposited by, e.g., plasma CVD method (see FIG. 10).

Thus, the solid-state image sensor according to the present embodiment shown in FIGS. 2 to 5 is fabricated.

As described above, according to the present embodiment, the pixels $P_n$, $P_{n+1}$ which have the read transistor part made common between them and are adjacent to each other in the column direction have the transfer transistors TG1, TG2 formed in the regions which are positioned on the same side in the column direction with respect to the photodiode PD1 of the pixel $P_n$ and the photodiode PD2 of the pixel $P_{n+1}$ and have the common read transistor part formed in the region which is on the same side with respect to the photodiode PD1 of the pixel $P_n$ and the photodiode PD2 of the pixel $P_{n+1}$, whereby sufficient areas of the photodiodes PD1, PD2 can be ensured, and the photosensitivities and the charge transfer characteristics can be made uniform between the pixels $P_n$, $P_{n+1}$.

According to the present embodiment, in the above-described layout, the shape of the photodiode PD1 and the shape of the photodiode PD2 are substantially the same, and the shape of the gate electrode $24_{TG1}$ of the transfer transistor TG1 and the shape of the gate electrode $24_{TG2}$ of the transfer transistor TG2 are substantially the same, whereby the photosensitivities and the charge transfer characteristics can be made further uniform between the pixels $P_n$, $P_{n+1}$.

According to the present embodiment, in the above-described layout, the positional relationship between the gate electrode $24_{TG1}$ of the transfer transistor TG1 with respect to the photodiode PD1, and the positional relationship between the gate electrode $24_{TG2}$ of the transfer transistor TG2 with respect to the photodiode PD2 are the same. That is, the photodiode PD1 and the photodiode PD2 are spaced from each other with 1 pixel pitch in the column direction, and the gate electrode $24_{TG1}$ of the transfer transistor TG1 and the gate electrode $24_{TG2}$ of the transfer transistor TG2 are spaced from each other with 1 pixel pitch in the column direction, whereby the photosensitivities and the charge transfer characteristics can be made further uniform between the pixels $P_n$, $P_{n+1}$.

According to the present embodiment, even when displacement takes place in forming the photodiodes PD1, PD2 and the transfer transistors TG1, TG2, changes of the layout of the pixels $P_n$, $P_{n+1}$ are substantially the same, whereby the photosensitivities and the charge transfer characteristics can be retained uniform between the pixels $P_n$, $P_{n+1}$.

According to the present embodiment, the width in the row direction of the active region where the photodiode PD1 is formed, and the width in the row direction of the active region under the gate electrode $24_{TG1}$ of the transfer transistor TG1 are substantially equal to each other, and the width in the row direction of the active region where the photodiode PD2 is formed, and the width in the row direction of the active region under the gate electrode $24_{TG2}$ of the transfer transistor TG2 are substantially equal to each other, whereby the charge transfer from the photodiode PD1 to the floating diffusion FD1 and the charge transfer from the photodiode PD2 to the floating diffusion FD2 can be made highly efficient.

According to the present embodiment, the contact parts 25$a$, 25$b$ of the gate electrodes $24_{TG1}$, $24_{TG2}$ of the transfer transistors TG1, TG2, and the contact parts 25$c$, 25$d$ of the floating diffusions FD1, FD2 are formed in the regions other than the region between the photodiode PD1 and photodiode PD2 adjacent to each other in the column direction, whereby the length of the photodiodes PD1, PD2 can be made large in the column direction, and the light receiving amount per 1 pixel can be made large.

According to the present embodiment, the space between the first and the second metal interconnection layers 32, 36 adjacent to the photodiode PD1 and the edge of the photodiode PD1 and the space between the first and the second metal interconnection layers 32, 36 adjacent to the photodiode PD2 and the edge of the photodiode PD2 are substantially equal to each other, and the length of the parts of the first and the second metal interconnection layers 32, 36 adjacent to the photodiode PD1, which are opposed to the photodiode PD1 and the length of the parts of the first and the second metal interconnection layers 32, 36 adjacent to the photodiode PD2, which are opposed to the photodiode PD2 are substantially equal to each other, whereby the first and the second metal interconnection layers 32, 36 shield the incident light substantially equally between the pixels $P_n$, $P_{n+1}$ having the read transfer unit made common therebetween, and the light receiving characteristics can be made uniform between the pixels $P_n$, $P_{n+1}$.

A SECOND EMBODIMENT

Figure 11:
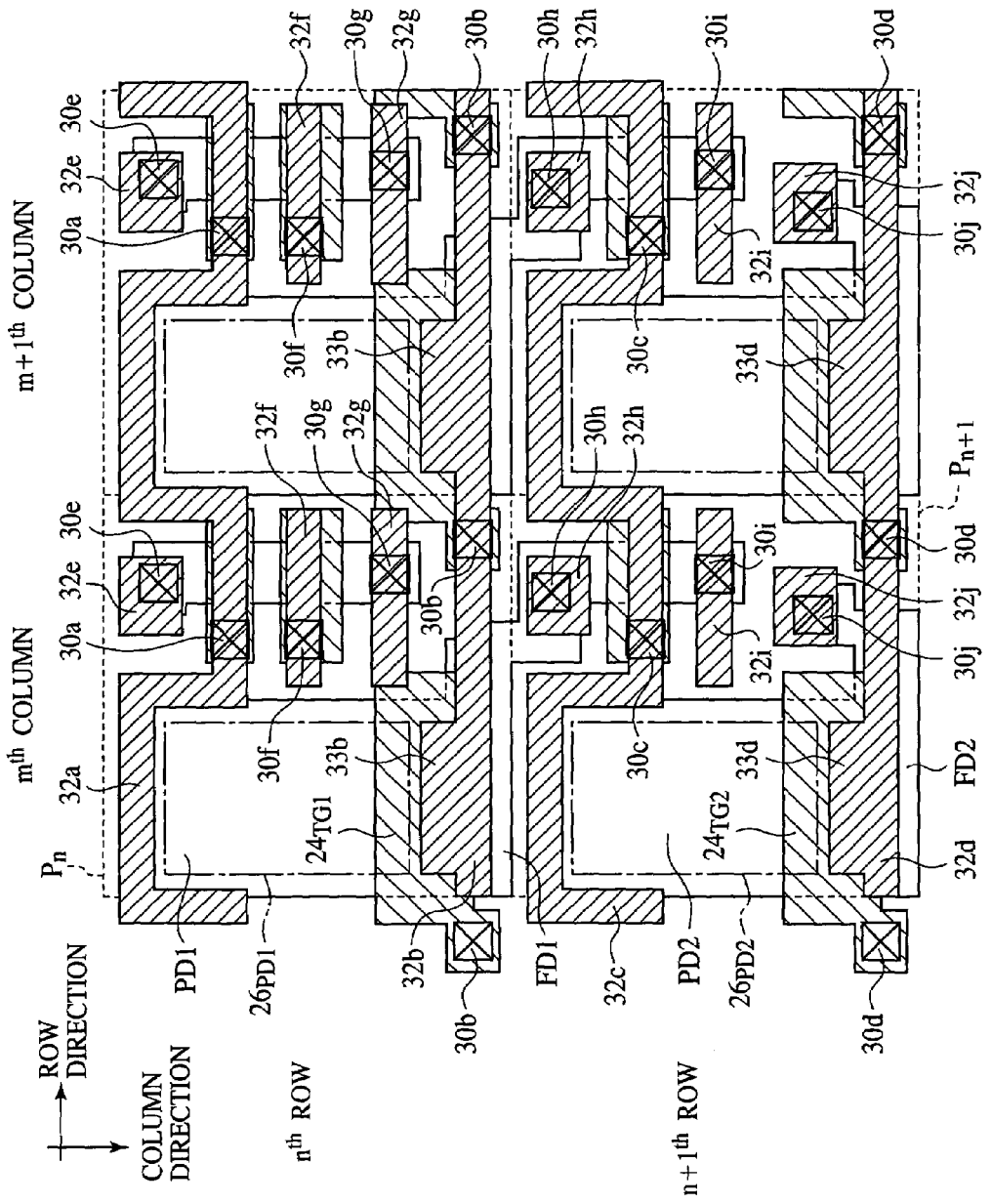
FIG. 11 is a plan view of the solid-state image sensor according to a second embodiment, which shows a structure thereof (part 1).
Figure 12:
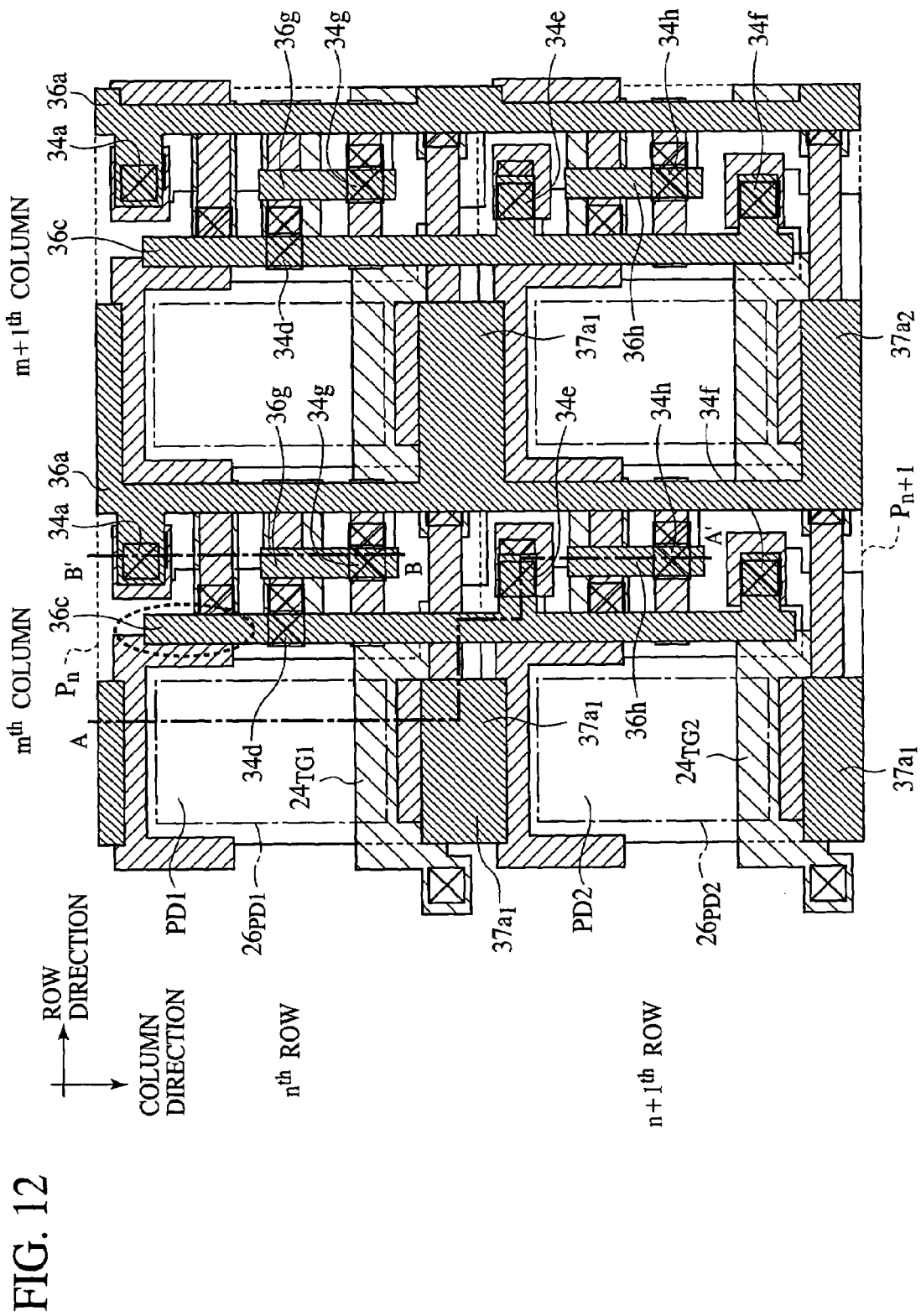
FIG. 12 is a plan view of the solid-state image sensor according to the second embodiment, which shows a structure thereof (part 2).
Figure 13:
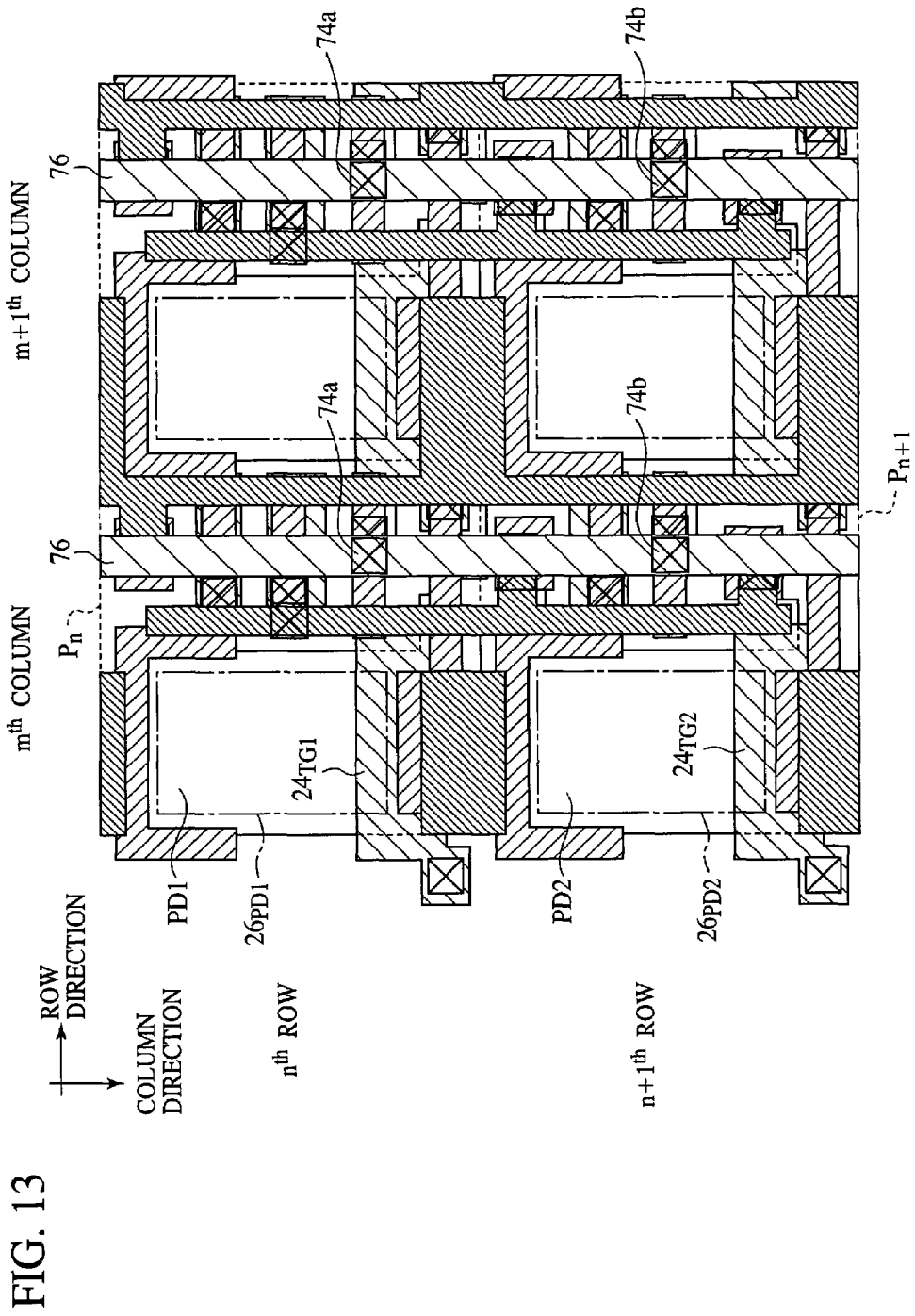
FIG. 13 is a plan view of the solid-state image sensor according to the second embodiment, which shows a structure thereof (part 3).
Figure 14:
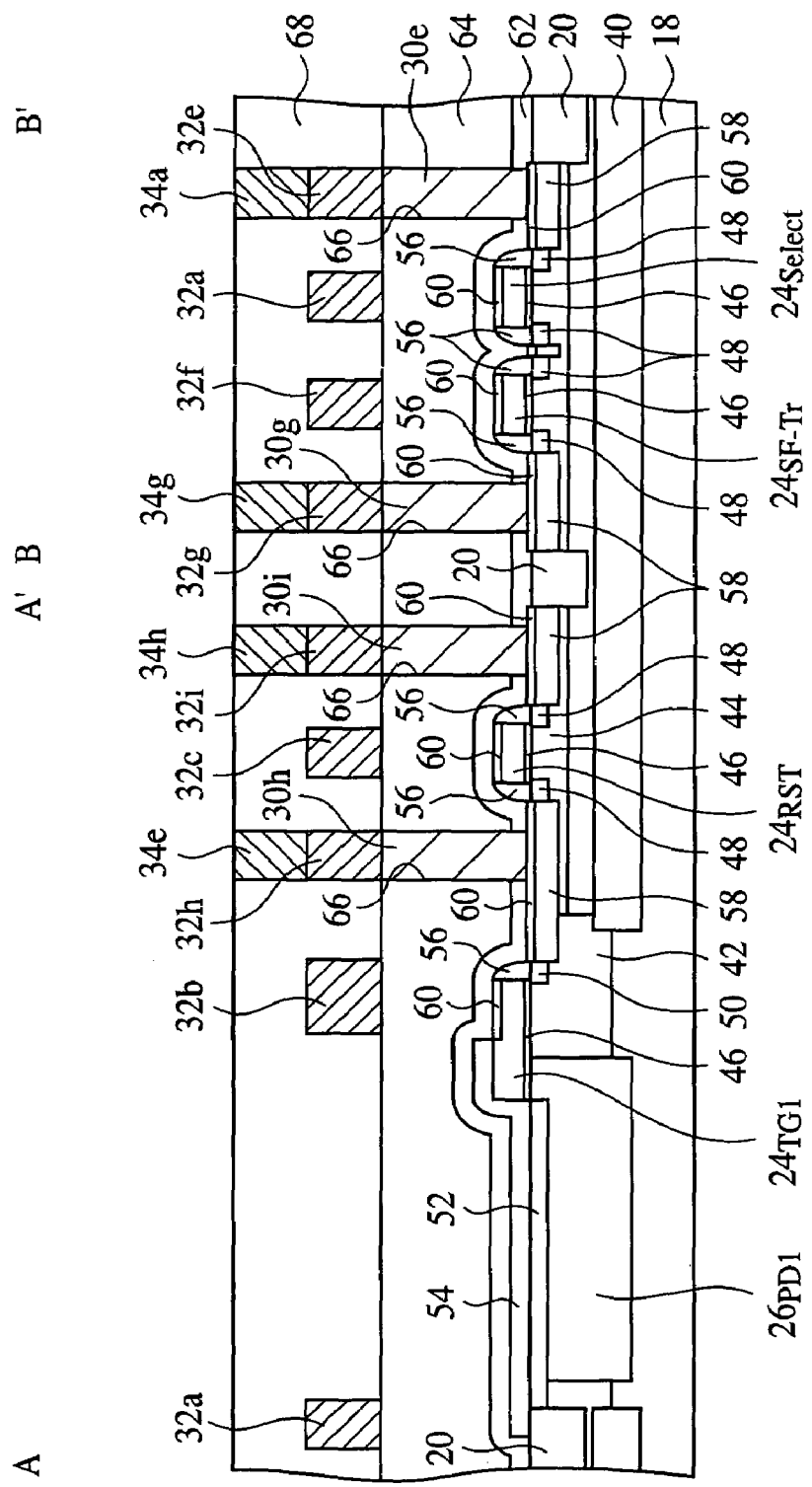
FIG. 14 is sectional views of the solid-state image sensor according to the second embodiment of the present invention in the steps of the method for fabricating the same, which shows the method (Part 1).
Figure 15:
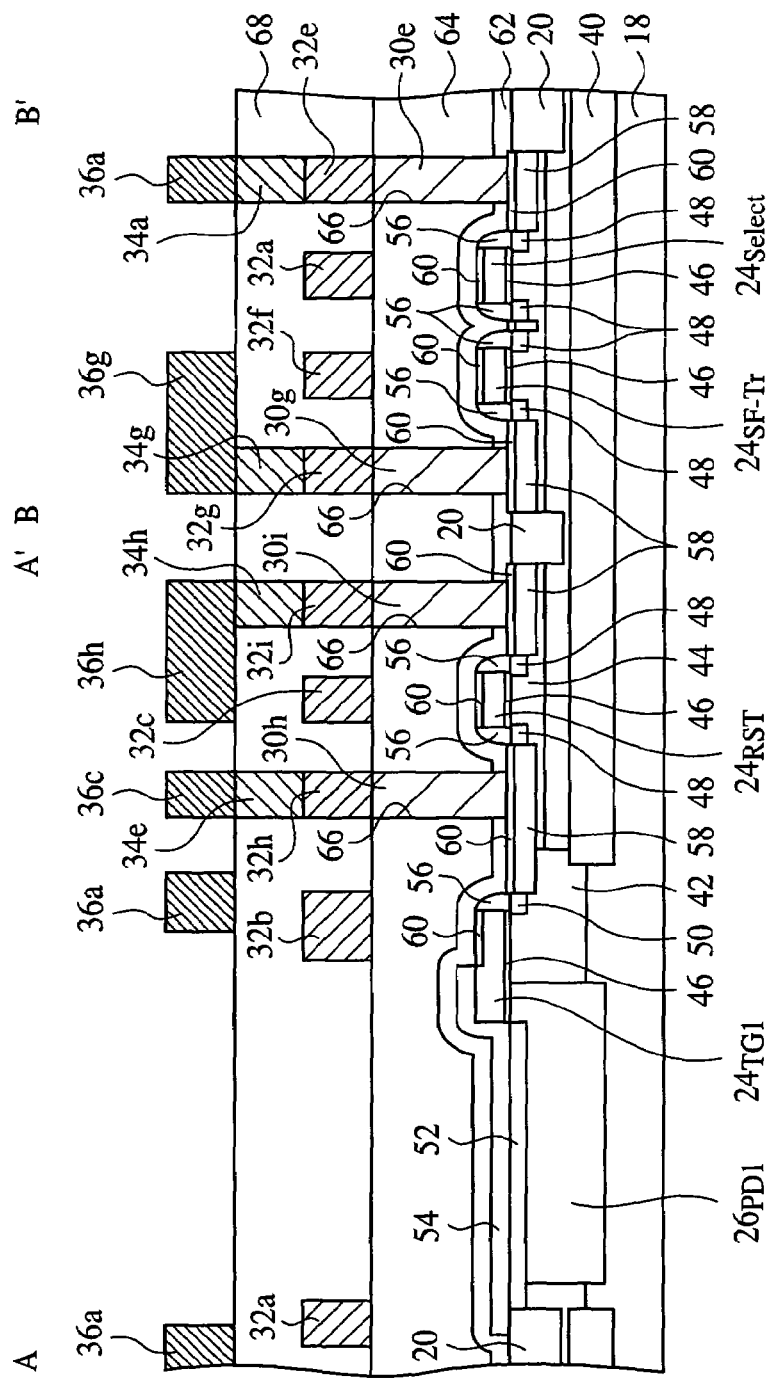
FIG. 15 is sectional views of the solid-state image sensor according to the second embodiment of the present invention in the steps of the method for fabricating the same, which shows the method (Part 2).
Figure 16:
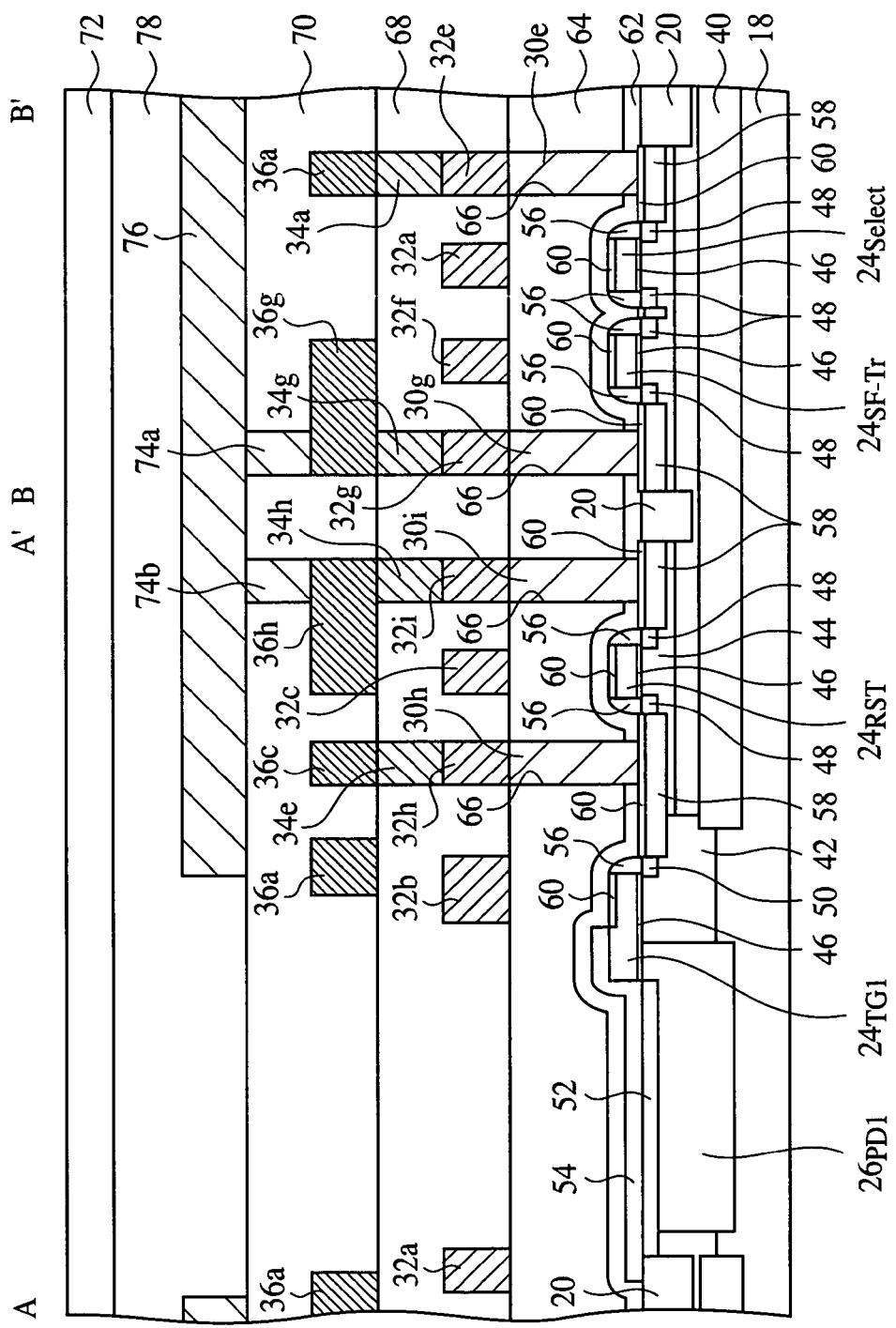
FIG. 16 is sectional views of the solid-state image sensor according to the second embodiment of the present invention in the steps of the method for fabricating the same, which shows the method (Part 3).

The solid-state image sensor according to a second embodiment of the present invention will be explained with reference to FIGS. 11 to 16. FIGS. 11 to 13 are plan view of the solid-state image sensor according to the present embodiment, which show a structure thereof. FIGS. 14 to 16 are sectional view of the solid-state image sensor according to the present embodiment in the steps of the method for fabricating the same, which show the method. The same members of the present embodiment as those of the solid-state image sensor according to the first embodiment are represented by the same reference numbers not to repeat or to simplify their explanation.

The solid-state image sensor according to the present embodiment is the same in the circuit diagram, the basic structure and the fabrication method as the solid-state image sensor according to the first embodiment except that the first and the second metal interconnection layers 32, 26 are different from each other in the layout, and furthermore, a third metal interconnection layer is provided. The structure of the solid-state image sensor according to the present embodiment will be explained with reference to FIGS. 11 to 13. FIG. 11 is a plan view of the first metal interconnection layer in the pixel array part of the solid-state image sensor according to the present embodiment, which shows the layout thereof. FIG. 12 is a plan view of the second metal interconnection layer in the pixel array part of the solid-state image sensor according to the present embodiment, which shows the layout thereof. FIG. 13 is a plan view of the third metal interconnection layer in the pixel array part of the solid-state image sensor according to the present embodiment, which shows the layout thereof.

The layout of the active regions and the gate interconnections in the pixel array part 10 is the same as in the solid-state image sensor according to the first embodiment shown in FIG. 2, and its explanation will be omitted.

As shown in FIG. 11, the first metal interconnection layer 32 includes a Select line 32a electrically connected to the gate electrode $24_{Select}$ via a contact plug 30a, a TG1 line 32b electrically connected to the gate electrode $24_{TG1}$ via a contact plug 30b, an RST line 32c electrically connected to the gate electrode $24_{RST}$ via a contact plug 30c, and a TG2 line 32d electrically connected to the gate electrode $24_{TG2}$ a via contact plug 30d. The first metal interconnection layer 32 also includes a lead interconnection 32e electrically connected to the source region of the select transistor Select via a contact plug 30e, a lead interconnection 32f electrically connected to the gate electrode $24_{SF-Tr}$ via a contact plug 30f, a lead interconnection 32g electrically connected to the drain region of the source follower transistor SF-Tr via a contact plug 30g, a lead interconnection 32h electrically connected to the floating diffusion FD1 via a contact plug 30h, a lead interconnection 32i electrically connected to the drain region of the reset transistor RST via a contact plug 30i and a lead interconnection 32j electrically connected to the floating diffusion FD2 a via contact plug 30j.

In the solid-state image sensor according to the present embodiment, the lead interconnection 32h electrically connected to the floating diffusion FD1 via the contact plug 30h and the lead interconnection 32j electrically connected to the floating diffusion FD2 via the contact plug 30j have substantially the same shape. The space between the lead interconnection 32h electrically interconnected to the floating diffusion FD1 and the TG1 line 32b and the space between the lead interconnection 32j electrically connected to the floating diffusion FD2 and the TG2 line 32d are substantially equal to each other. The length of the part of the lead interconnection 32h electrically connected to the floating diffusion FD1, which is opposed to the TG1 line 32b and the length of the part of the lead interconnection 32j electrically connected to the floating diffusion FD2, which is opposed to the TG2 line 32d are substantially equal to each other.

As shown in FIG. 12, the second metal interconnection layer 36 includes a signal lead line 36a electrically connected to the source region of the select transistor Select via a contact plug 34a, and a FD-SF interconnection 36c electrically connected to the gate electrode $24_{SF-Tr}$ of the source follower transistor, the floating diffusion FD1 and the floating diffusion FD2 respectively via contact plugs 34d, 34e, 34f. The second metal interconnection layer 36 further includes lead interconnections (relay interconnections) 36g, 36h electrically connected to the drain region of the source follower transistor SF-Tr and the drain region of the reset transistor RST respectively via contact plugs 34g, 34h. The second metal interconnection layer 36 includes no VR line electrically connected to the drain region of the source follower transistor SF-Tr and the drain region of the reset transistor RST respectively via the contact plugs, as is in the solid-state image sensor according to the first embodiment.

The signal read line 36a and the FD-SF interconnection line 36c are extended respectively in the column direction. The lead interconnection 36g and the lead interconnection 36h are provided respectively between the signal read line 36a and the FD-SF interconnection line 36c.

The signal read line 36a has a widened part $37a_1$ having the width increased toward the floating diffusion FD1 and a widened part $37a_2$ having the width increased toward the floating diffusion FD2. The widened part $37a_1$ covers the floating diffusion FD1 to shield the floating diffusion FD1 against light, and the widened part $37a_2$ covers the floating diffusion FD2 to shield the floating diffusion FD2 against light.

The FD-SF interconnection 36c is opposed along a short length to the signal lead line 36a and the lead interconnections 36g, 36h electrically connected to each VR line (see FIG. 13) formed of the third metal interconnection layer 76, which will be described later.

The space between the interconnection layers (signal read line 36a, FD-SF interconnection 36c) adjacent to the photodiode PD1 and the edge of the photodiode PD1, and the space between the interconnection layers (signal read lines 36a, FD-SF interconnections 36c) and the edge of the photodiode PD2 are substantially equal to each other. The length of the part of the interconnection layers (signal read line 36a, FD-SF interconnection 36c) adjacent to the photodiode PD1, which is opposed to the photodiode PD1, and the length of the interconnection layers (signal read line 36a, FD-SF interconnection 36c) adjacent to the photodiode PD2, which is opposed to the photodiode PD2 are substantially equal to each other.

Especially, the FD-SF interconnection 36c adjacent to the photodiode PD1, PD2 is extended not only between the contact plugs 34d, 34f, but also from the contact plug 34d to the end of the photodiode PD1 as enclosed by the dotted-line ellipse in FIG. 12. Thus, the length of the part of the FD-SF interconnection 36c, which is opposed to the photodiode PD1, and the length of the part of the FD-SF interconnection 36c, which is opposed to the photodiode PD2 are substantially equal to each other.

The length of the widened part $37a_1$ of the signal read line 36a, which is opposed to the photodiode PD1, and the length of the widened part $37a_2$ of the signal read line 36a, which is opposed to the photodiode PD2 are substantially equal to each other.

Thus, the length of the part of the second metal interconnection layer 36 adjacent to the photodiode PD1, which is opposed to the photodiode PD1, and the length of the part of second metal interconnection layer 36 adjacent to the photodiode PD2, which is opposed to the photodiode PD2 are substantially equal to each other.

The solid-state image sensor according to the present embodiment further comprises the third metal interconnection layer 76 formed on the second metal interconnection layer 36 with an inter-layer insulation film formed therebetween.

As shown in FIG. 13, the third metal interconnection layer 76 forms a VR line electrically connected to the drain region of the source follower transistors SF-Tr and the drain region of the reset transistors RST respectively via contact plugs 74a, 74b.

The VR line 76 is extended in the column direction. The VR line 76 is electrically connected to the drain region of the source follower transistors SF-Tr via the contact plug 34g, the lead interconnection 32g of the first metal interconnection layer 32, the contact plug 34g, the lead interconnection 36g of the second metal interconnection layer 36 and the contact plug 74a. The VR line 76 is electrically connected to the drain region of the reset transistor RST via the lead interconnection 32*i* of the first metal interconnection layer 32, the contact plug 34*h*, the lead interconnection 36*b* of the second metal interconnection layer 36 and the contact plug 74*b*.

The solid-state image sensor according to the present embodiment is characterized mainly in that, in the first metal interconnection layer 32, the space between the lead interconnection 32*h* electrically connected to the floating diffusion FD1 and the TG1 line 32*b*, and the space between the lead interconnection 32*j* electrically connected to the floating diffusion FD2 and the TG2 line 32*d* are substantially equal to each other, and the length of the part of the lead interconnection 32*h* electrically connected to the floating diffusion FD1, which is opposed to the TG1 line 32*b*, and the length of the part of lead interconnection 32*j* electrically connected to the floating diffusion FD2, which is opposed to the TG2 line 32*d* are substantially equal to each other.

Thus, the inter-connection capacitance between the lead interconnection 32*h* electrically connected to the floating diffusion FD1 and the TG1 line 32*b*, and the inter-interconnection capacitance between the lead interconnection 32*j* electrically connected to the floating diffusion FD2 and the TG2 line 32*d* can be made substantially equal to each other. Resultantly, the influence of the voltage of the TG1 line 32*b* on the floating diffusion FD1, and the influence of the voltage of the TG2 line 32*d* on the floating diffusion FD2 can be made substantially the same. Accordingly, no large difference can be generated between the voltage of the floating diffusion FD1 upon the charge transfer with the transfer transistor TG1 being on, and the voltage of the floating diffusion FD2 upon the charge transfer with the transfer transistor TG2 being on.

In the first metal interconnection layer 32, the space between the interconnection layers (Select line 32*a*, TG1 line 32*b*) adjacent to the photodiode PD1 and the edge of the photodiode PD1, and the space between the interconnection layers (RST line 32*c*, TG2 line 32*d*) adjacent to the photodiode PD2 and the edge of the photodiode PD2 are substantially equal to each other. The length of the parts of the interconnection layers (Select line 32*a*, TG1 line 32*b*) adjacent to the photodiode PD1, which are adjacent to the photodiode PD1, and the length of the parts of the interconnection layers (RST line 32*c*, TG2 line 32*d*) adjacent to the photodiode PD2, which are opposed to the photodiode PD2 are substantially equal to each other. Accordingly, in the pixels $P_n$, $P_{n+1}$ positioned in the $n^{th}$ and the $n+1^{th}$ rows and having the read transistor part made common, the incident light can be substantially equally shielded by the first metal interconnection layer 32, and uniform light receiving characteristics can be obtained. Especially, even in the pixels at the periphery of the pixel array part 10, on which light is slantingly incident, the incident light can be shielded by the first metal interconnection layer 32 substantially equally in the adjacent pixels, and uniform light receiving characteristics can be obtained.

The solid-state image sensor according to the present embodiment is also characterized in that in the second metal interconnection layer 36, the FD-SF interconnection line 36*c* is opposed along a short length to the lead interconnection lines 36*g*, 36*h* electrically connected to the VR line formed of the third metal interconnection layer 76.

Thus, the inter-interconnection capacitance between the FD-SF interconnection 36*c* and the signal read line 36*a*, and the inter-interconnection capacitance between the FD-SF interconnection 3*c* and the VR line 76 can be respectively decreased, and the capacitances of the floating diffusions FD1, FD2 can be decreased. Accordingly, the conversion efficiency of the signal charges can be improved.

Furthermore, in the second metal interconnection layer 36, the space between the interconnection layers (signal read line 36*a*, FD-SF interconnection line 36*c*) adjacent to the photodiode PD1 and the edge of the photodiode PD1, and the space between the interconnection layers (signal read line 36*a*, FD-SF interconnection 36*c*) adjacent to the photodiode PD2 and the edge of the photodiode PD2 are substantially equal to each other. The length of the parts of the interconnection layers (signal read line 36*a*, FD-SF interconnection 36*c*) adjacent to the photodiode PD1, which are opposed to the photodiode PD1, and the length of the parts of the interconnection layers (signal read line 36*a*, FD-SF interconnection 36*c*) adjacent to the photodiode PD2, which are opposed to the photodiode PD2 are substantially equal to each other. Accordingly, in the pixels $P_n$, $P_{n+1}$ positioned in the $n^{th}$ and the $n+1^{th}$ rows and having the read transistor part made common, the incident light can be substantially equally shielded by the second metal interconnection layer 36, and uniform light receiving characteristics can be obtained. Especially, even in the pixels at the periphery of the pixel array part 10, on which light is slantingly incident, the incident light can be shielded by the second metal interconnection layer 36 substantially equally in the adjacent pixels, and uniform light receiving characteristics can be obtained.

Next, the method for fabricating the solid-state image sensor according to the present embodiment will be explained with reference to FIGS. 14 to 16. FIGS. 14 to 16 are sectional views of the solid-state image sensor according to the present embodiment along the A-A' line and the B-B' line in FIG. 12 in the steps of the method for fabricating the same, which show the method. In FIGS. 14 to 16, the A-A' line sectional views and the B-B' line sectional views are shown side by side.

First, in the same way as in the method for fabricating the solid-state image sensor according to the first embodiment, the fabrication steps from the first step to the step of forming the contact plugs 34 connected to the first metal interconnection layer 32 buried in the inter-layer insulation film 68 are performed (see FIG. 14).

Next, in the same way as in the method for fabricating the solid-state image sensor according to the first embodiment, the second metal interconnection layer 36 is formed. In the present embodiment, the VR line are not formed in the second metal interconnection layer 36, but the lead interconnections 36*g*, 36*h* are formed in the second metal interconnection layer 36 (see FIG. 15).

Then, after the inter-layer insulation film 70 is formed to bury the second metal interconnection layer 36, the contact plugs 74 buried in the inter-layer insulation film 70 and the third metal interconnection layer 76 connected to the second metal interconnection layer 36 via the contact plugs 74 are formed in the same way as in forming the other metal interconnection layers. The VR line is formed in the third metal interconnection layer 76.

Next, on the inter-layer insulation film 70 with the third metal interconnection layer 76 formed on, the inter-layer insulation film 78 is formed in the same way as in forming the inter-layer insulation films 68, 70.

Then, the cover film 72 of a silicon nitride film is deposited on the inter-layer insulation film 78 by, e.g., plasma CVD method (see FIG. 16).

Thus, the solid-state image sensor according to the present embodiment is fabricated.

(Modification)

Figure 17:
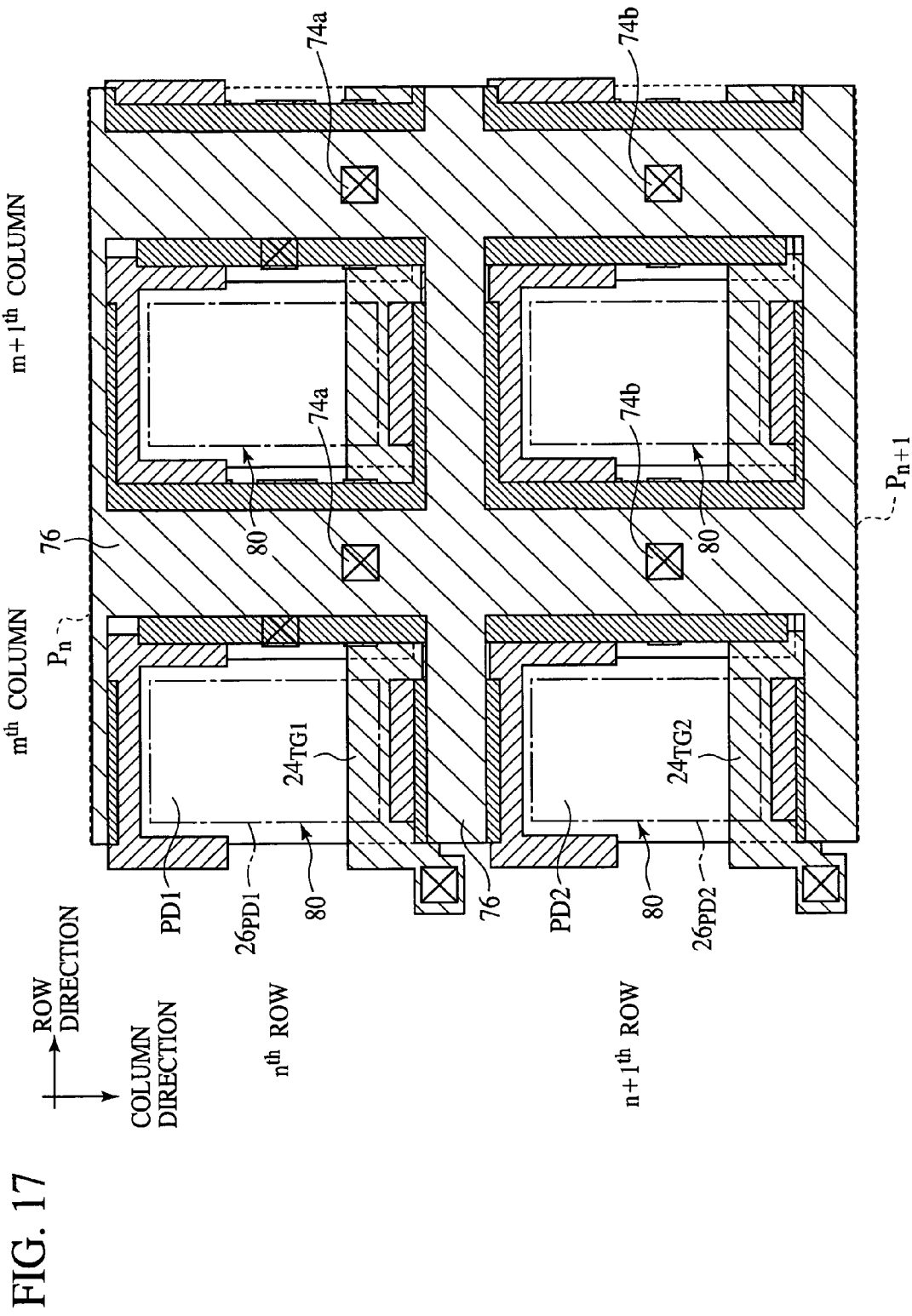
FIG. 17 is a sectional view of the solid-state image sensor according to one modification of the second embodiment of the present invention, which shows a structure thereof.

Next, the solid-state image sensor according to one modification of the present embodiment will be explained with reference to FIG. 17. FIG. 17 is a plan view of the third metal interconnection layer in the pixel array part of the solid-state image sensor according to the present modification, which shows the layout thereof.

In the solid-state image sensor according to the present modification, as shown in FIG. 17, the VR line 76 is formed, extended in the row direction and in the column direction. That is, the VR line 76 is formed in a matrix, which permits the VR line 76 to function as a light shielding film. In the openings 80 where the VR lines 76 are not formed, the photodiodes PD1, PD2 are positioned.

The ends of the first metal interconnection layer 32 and the second metal interconnection layer 36, which are adjacent to the photodiodes PD1, PD2 are positioned inside the openings 80.

As described above, in the first metal interconnection layer 32, the space between the interconnection layers (Select line 32a, TG1 line 32b) adjacent to the photodiode PD1 and the edge of the photodiode PD1, and the space between the interconnection layers (RST lien 32c, TG2 line 32d) adjacent to the photodiode PD2 and the edge of the photodiode PD2 are substantially equal to each other. The length of the parts of the interconnection layers (Select line 32a, TG1 line 32b) adjacent to the photodiode PD1, which are opposed to the photodiode PD1, and the length of the parts of the interconnection layer (RST line 32c, TG2 line 32d) adjacent to the photodiode PD2, which are opposed to the photodiode PD2 are substantially equal to each other.

In the second metal interconnection layer as well, as described above, the space between the interconnection layers (signal read line 36a, FD-SF interconnection line 36c) adjacent to the photodiode PD1 and the edge of the photodiode PD1, and the space between the interconnection layers (signal read line 36a, FD-SF interconnection line 36c) and the edge of the photodiode PD2 are substantially equal to each other. The length of the parts of the interconnection layers (signal read line 36a, FD-SF interconnection line 36c) adjacent to the photodiode PD1, which are opposed to the photodiode PD1, and the length of the parts of the interconnection layers (signal read line 36a, FD-SF interconnection line 36c) adjacent to the photodiode PD2, which are opposed to the photodiode PD2 are substantially equal to each other.

In the VR line formed of the third metal interconnection layer 76, the space between the VR line 76 adjacent to the photodiode PD1 and the edge of the photodiode PD1, and the space between the VR line 76 adjacent to the photodiode PD2 and the edge of the photodiode PD2 are substantially equal to each other. The length of the part of the VR line 76 adjacent to the photodiode PD1, which is opposed to the photodiode PD1, and the length of the part of the VR line 76 adjacent to the photodiode PD2, which is opposed to the photodiode PD2 are substantially equal to each other.

Accordingly, the peripheries of the photodiodes PD1, PD2 are equally shielded from light by the first to the third metal interconnection layer 32, 36, 37, and the photosensitivities can be made uniform between the pixel $P_n$ in the $n^{th}$ row and the pixel $P_{n+1}$ in the $n+1^{th}$ row.

As described above, the VR lines 76 are extended in the row direction and in the column direction to thereby function as the light shielding film.

A THIRD EMBODIMENT

Figure 18:
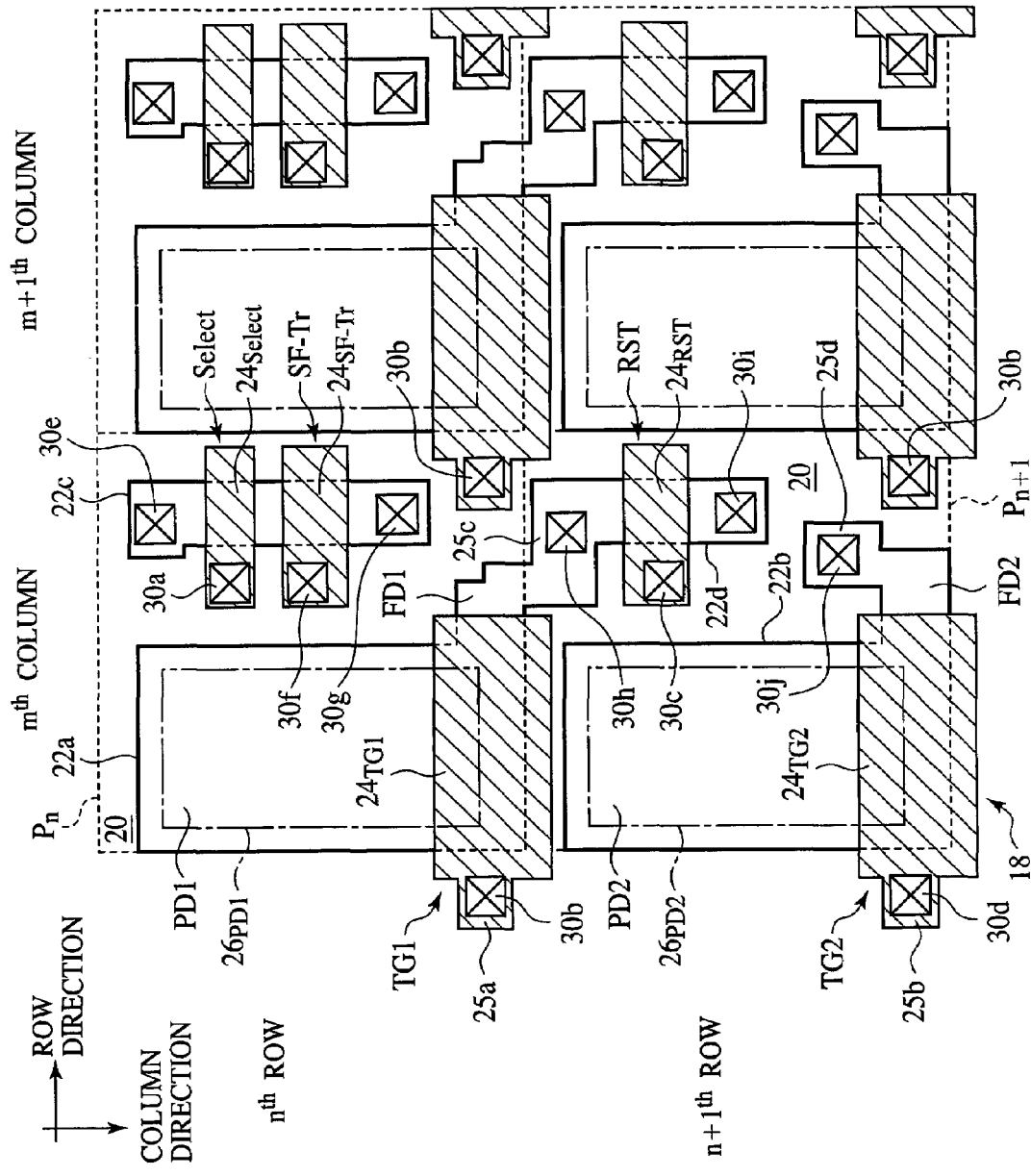
FIG. 18 is a plan view of the solid-state image sensor according to a third embodiment of the present invention, which shows a structure thereof.

Next, the solid-state image sensor according to a third embodiment of the present invention will be explained with reference to FIG. 18. FIG. 18 is a plan view of the solid-state image sensor according to the present embodiment, which shows a structure thereof. The same members of the present embodiment as those of the solid-state image sensor according to the first embodiment are represented by the same reference numbers not to repeat or to simplify their explanation.

The solid-state image sensor according to the present embodiment is the same in the circuit diagram, the basic structure and the fabrication method as the solid-state image sensor according to the first embodiment except that the plane shape of the gate electrodes $24_{TG1}$, $24_{TG2}$ of the transfer transistors TG1, TG2 are different. The structure of the solid-state image sensor according to the present embodiment will be explained with reference to FIG. 18. FIG. 18 is a plan view of the layout of the active regions and the gate interconnections of the pixel array part.

In the solid-state image sensor according to the present embodiment, as shown in FIG. 18, the gate electrode $24_{TG1}$ of a transfer transistor TG1 is formed, covering the end of the PD1/TG1/FD1 region 22a, which is parallel with the row direction. Accordingly, the floating diffusion FD1 is formed in the projected region of the PD1/TG1/FD1 region 22a and the RST region 22a between the gate electrode $24_{TG1}$ and the gate electrode $24_{RST}$. That is, the floating diffusion FD1 is not formed in the region between the transfer transistor TG1 and the photodiode PD2, which are adjacent in the column direction. The edge of the gate electrode $24_{TG1}$, which is on the side of the photodiode PD1 and the edge of the gate electrode $24_{TG1}$, which is on the side of the floating diffusion FD1 intersect each other substantially orthogonally. The width of the edge of the gate electrode $24_{TG1}$, which is on the side of the photodiode PD1 is larger than the width of the edge of the gate electrode $24_{TG1}$, which is on the side of the floating diffusion FD1.

The gate electrode $24_{TG2}$ of the transfer transistor TG2 also has the same plane shape as the gate electrode $24_{TG1}$ of the transfer transistor TG1 described above. the gate electrode $24_{TG2}$ of the transfer transistor TG2 is formed, covering the end of the PD2/TG2/FD2 region 22b, which is parallel with the row direction. Accordingly, the floating diffusion FD2 is formed in the projected region of the PD2/TG2/FD2 region 22b in which the contact part 25d is formed. That is, the floating diffusion FD2 is not formed in the region between the transfer transistor TG2 and the photodiode PD1, which are adjacent in the column direction. The edge of the gate electrode $24_{TG2}$, which is on the side of the photodiode PD2 and the edge of the gate electrode $24_{TG2}$, which is on the side of the floating diffusion FD2 intersect each other substantially orthogonally. The width of the edge of the gate electrode $24_{TG2}$, which is on the side of the photodiode PD2 is larger than the width of the edge of the gate electrode $24_{TG2}$, which is on the side of the floating diffusion FD2.

Thus, the floating diffusion FD1 and the floating diffusion FD2 are formed in the regions positioned respectively on the same side in the row direction with respect to the gate electrode $24_{TG1}$ of the transfer transistor TG1 and the gate electrode $24_{TG2}$ of the transfer transistor TG2.

The layouts of the first and second metal interconnection layer 32, 36 in the pixel array part 10 are same as those of the solid-state image sensor according to the present embodiment, and thus the explanations for these layers are omitted.

The solid-state image sensor according to the present embodiment is characterized mainly in that in the pixels $P_n$, $P_{n+1}$ including the common read transistor part and positioned in the $n^{th}$ row and the $n+1^{th}$ row adjacent to each other in the column direction, the floating diffusion FD1 is not formed in the region between the transfer transistor TG1 and the photodiode PD2 adjacent to each other in the column direction, and the floating diffusion FD2 is not formed in the region between the transfer transistor TG2 and the photodiode PD1 adjacent to each other in the column direction. That is, the solid-state image sensor according to the present embodiment is characterized mainly in that the floating diffusion FD1 and the floating diffusion FD2 are formed in the regions positioned respectively on the same side in the row direction with respect to the gate electrode $24_{TG1}$ of the transfer transistor TG1 and the gate electrode $24_{TG2}$ of the transfer transistor TG2.

In the set of pixels including the common read transistor part, the floating diffusions of both pixels are electrically connected by the metal interconnection. Accordingly, it is often that the capacitance of the floating diffusions is increased as a whole, and the efficiency of the charge voltage conversion is lowered.

In the solid-state image sensor according to the present embodiment, the floating diffusion FD1 is not formed in the region between the transfer transistor TG1 and the photodiode PD2 adjacent to each other in the column direction, and the floating diffusion FD2 is not formed in the region between the transfer transistor TG2 and the photodiode PD1 adjacent to each other in the column direction. Thus, in comparison with the solid-state image sensor according to the first embodiment, the total area of the floating diffusions FD1, FD2 can be made smaller. Accordingly, in comparison with the solid-state image sensor according to the first embodiment, the total capacitance of the floating diffusions FD1, FD2 can be made smaller, and the decrease of the efficiency of the charge voltage conversion can be suppressed.

The floating diffusion FD1 is not formed in the region between the transfer transistor TG1 and photodiode PD2 adjacent to each other in the column direction, and the floating diffusion FD2 is not formed in the region between the transfer transistor TG2 and the photodiode PD1 adjacent to each other in the column direction. This allows the photodiodes PD1, PD2 to be longer in the column direction.

(Modification)

Figure 19:
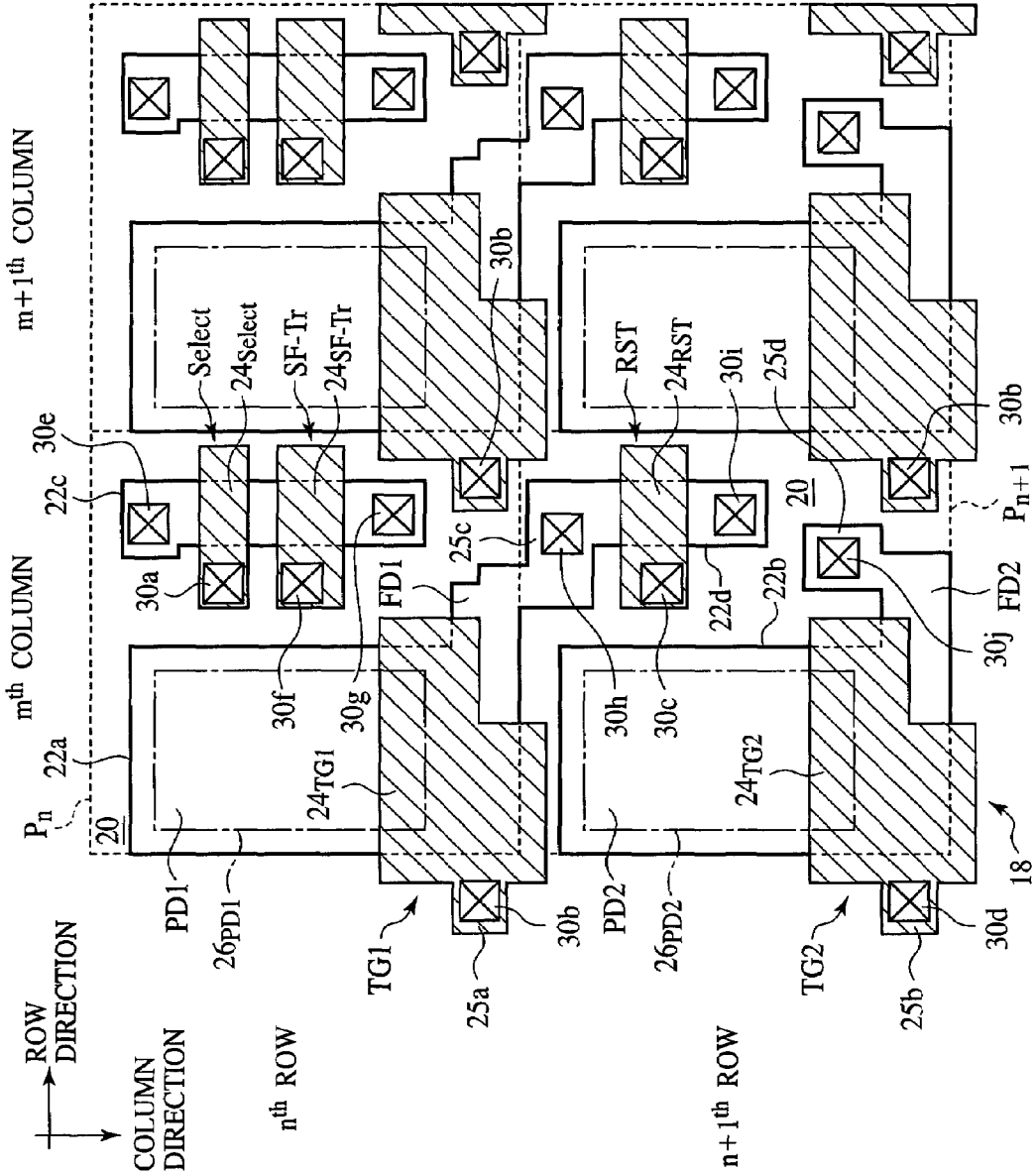
FIG. 19 is a plan view of the solid-state image sensor according to one modification of the third embodiment of the present invention, which shows a structure thereof.

Next, the solid-state image sensor according to one modification of the present embodiment will be explained with reference to FIG. 19. FIG. 19 is a plan view of the active regions and the gate interconnections in the pixel array part of the solid-state image sensor according to the present modification, which shows a layout thereof.

In the solid-state image sensor according to the present modification, as shown in FIG. 19, the gate electrode $24_{TG1}$ of the transfer transistor TG1 is formed with a part thereof covering a part of the end of the PD1/TG1/FD1 region 22a, which is parallel with the row direction. The plane shape of the gate electrode $24_{TG1}$ is the shape of the gate electrode $24_{TG1}$ shown in the above-described FIG. 18 having the corner near the floating diffusion FD1 cut off. The edge of the gate electrode $24_{TG1}$ on the side of the photodiode PD1 and a part of the edge of the gate electrode $24_{TG1}$ on the side of the floating diffusion FD1 intersect each other substantially orthogonally. The width of the edge of the gate electrode $24_{TG1}$ on the side of the photodiode PD1 is larger than the width of the edge of the gate electrode $24_{TG1}$ on the side of the floating diffusion FD1. Thus, the floating diffusion FD1 is formed not only in the region shown in the above-described FIG. 18, but also in the active region 22 exposed in the region where the corner of the gate electrode $24_{TG1}$ is cut off.

The gate electrode $24_{TG2}$ of the transfer transistor TG2 also has the same plane shape as the gate electrode $24_{TG1}$ of the transfer transistor TG1 described above. That is, a part of the gate electrode $24_{TG2}$ of the transfer transistor TG2 is formed, covering a part of the ends of the PD2/TG2/LD2 region 22b, which is parallel with the row direction. The plane shape of the gate electrode $24_{TG2}$ is the shape of the gate electrode $24_{TG2}$ shown in the above-described FIG. 18 having the corner near the floating diffusion FD2 cut off. The edge of the gate electrode $24_{TG2}$ on the side of the photodiode PD2 and a part of the edge of the gate electrode $24_{TG2}$ on the side of the floating diffusion FD2 intersect each other substantially orthogonally. The width of the edge of the gate electrode $24_{TG2}$ on the side of the photodiode PD2 is larger than the width of the edge thereof on the side of the floating diffusion FD2. Thus, the floating diffusion FD2 is formed not only in the region shown in the above-described FIG. 18, but also in the active region 22 exposed in the region where the corner of the gate electrode $24_{TG2}$ is cut off.

As described above, in the solid-state image sensor according to the present modification, the floating diffusions FD1, FD2 are formed also in the active region exposed in the regions defined by cutting off the corners of the gate electrodes $24_{TG1}$, $24_{TG2}$. Accordingly, the transfer of charges to the floating diffusion FD1 by the transfer transistor TG1, and the transfer of charges to the floating diffusion FD2 by the transfer transistor TG2 can be made smooth, and the charge transfer efficiency can be higher in comparison with that of the solid-state image sensor shown in FIG. 18.

A FOURTH EMBODIMENT

Figure 20:
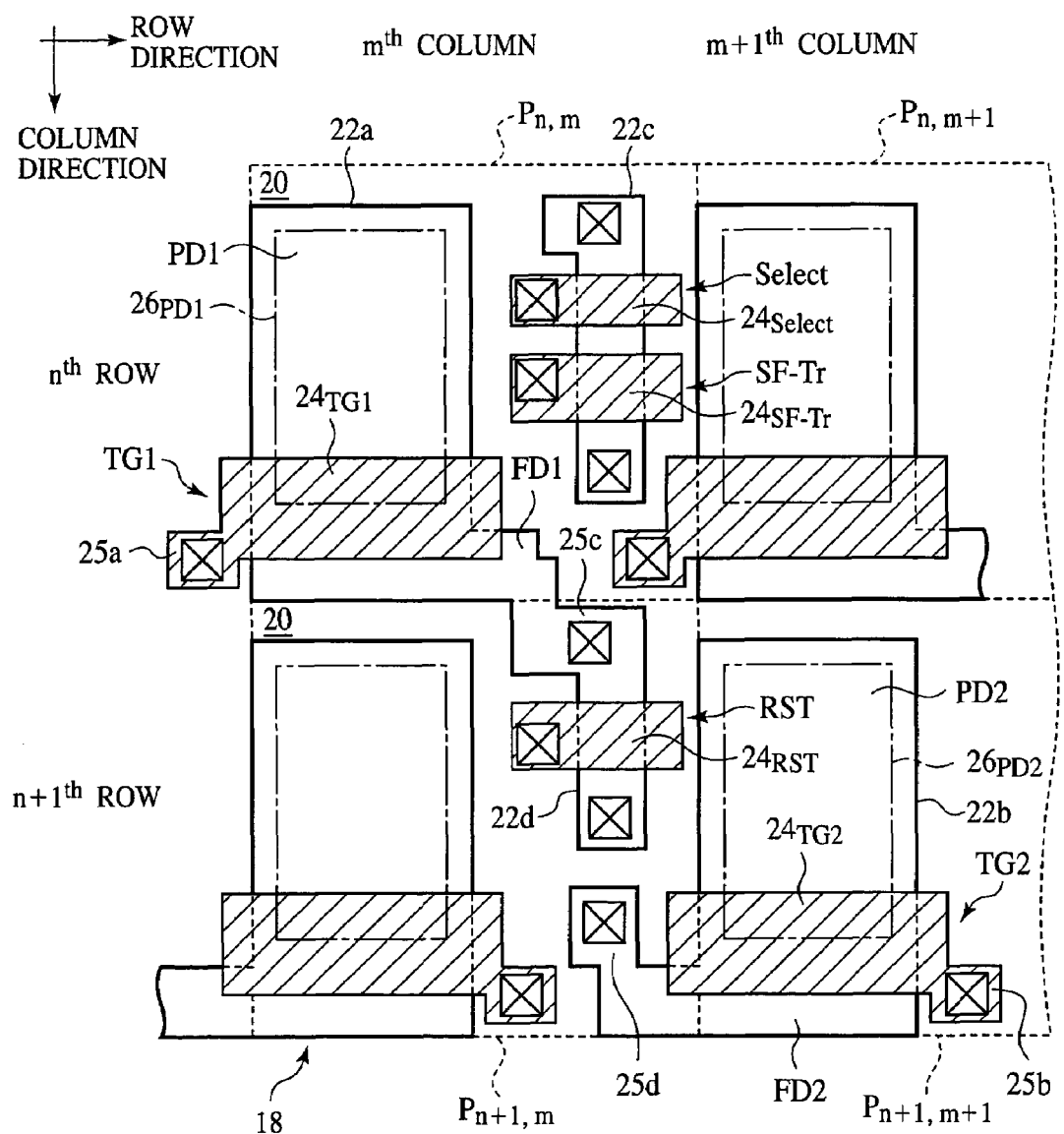
FIG. 20 is a plan view of the solid-state image sensor according to a fourth embodiment of the present invention, which shows a structure thereof.

The solid-state image sensor according to a fourth embodiment will be explained with reference to FIG. 20. FIG. 20 is a plan view of the solid-state image sensor according to the present embodiment, which shows a structure thereof. The same members of the present embodiment as those of the solid-state image sensor according to the first embodiment are represented by the same reference number not to repeat or to simplify their explanation.

The solid-state image sensor according to the present embodiment is the same in the circuit diagram, the basic structure and the fabrication method as the solid-state image sensor according to the first embodiment except that the pixels including the common read transistor part have positional relations which are different from each other in the pixel array part 10. The structure of the solid-state image sensor according to the present embodiment will be explained with reference to FIG. 20. FIG. 20 is a plan view of the layout of the active regions and the gate interconnections in the pixel array part.

In the solid-state image sensor according to the present embodiment, as shown in FIG. 20, the read transistor part is made common between the pixels diagonally adjacent to each other in the pixel array part 10, i.e., the pixel $P_{n,m}$ positioned in the $n^{th}$ row and the $m^{th}$ column and the pixel $P_{n+1,m+1}$ positioned in the $n+1^{th}$ row and the $m+1^{th}$ column.

The pixels $P_{n,m}$, $P_{n+1,m+1}$ including the common read transistor part respectively include, as in the solid-state image sensor according to the first embodiment, the phododiodes PD1, PD2, the transfer transistors TG1, TG2 and the floating diffusions FD1, FD2. The photodiodes PD1, PD2 of the pixels $P_{n,m}$, $P_{n+1,m+1}$ have substantially the same shape and are spaced from each other with 1 pixel pitch respectively in the row direction and in the column direction. The gate electrodes 24TG1, TG2 of the transfer transistors TG1, TG2 of the pixels $P_{n,m}$, $P_{n+1,m+1}$ have substantially the same shape except the contact parts 25a, 25b and are spaced from each other with 1 pixel pitch respectively in the row direction and in the column direction.

The active regions 22 for the common read transistor part formed in are provided in the pixel $P_{n,m}$ positioned in the $n^{th}$ row and the $m^{th}$ column and provided in the pixel $P_{n+1,m}$ which is adjacent to the pixel $P_{n,m}$ in the column direction and adjacent to the pixel $P_{n+1,m+1}$ in the row direction, the pixel $P_{n+1,m}$ being positioned in the n+1$^{th}$ row and the m$^{th}$ column.

That is, in the pixel $P_{n,m}$, the Select/SF-Tr region 22c of the common read transistor part, where the select transistor Select and the source follower transistor SF-Tr are formed is provided. In the pixel $P_{n+1,m}$, the RST region 22d of the common read transistor part, where the reset transistor RST is formed is provided. The RST region 22d provided in the pixel $P_{n+1,m}$ is integrally continuous to the PD1/TG1/FD1 region 22a provided in the pixel $P_{n,m}$.

The Select/SF-Tr region 22c and the RST region 22d are formed in the region respectively between the set of photodiode PD1 of the pixel $P_{n,m}$ and the photodiode PD2 of the pixel $P_{n+1,m}$ and the set of the photodiode PD1 of the pixel $P_{n,m+1}$ and the photodiode PD2 of the pixel $P_{n+1,m+1}$. Thus the common read transistor part is formed in the region respectively between the set of photodiode PD1 of the pixel $P_{n,m}$ and the photodiode PD2 of the pixel $P_{n+1,m}$ and the set of the photodiode PD1 of the pixel $P_{n,m+1}$ and the photodiode PD2 of the pixel $P_{n+1,m+1}$.

In the pixel $P_{n+1,m+1}$, the contact part 25b of the gate electrode $24_{TG2}$ of the transfer transistor TG2 is led out oppositely to the direction in which the contact part 25a of the gate electrode $24_{TG1}$ of the transfer transistor TG1 is led out. The contact part 25d of the floating diffusion FD2 is led out into the pixel $P_{n+1,m}$ to be positioned between the photodiode PD2 of the of the pixel $P_{n+1,m}$ and the photodiode PD2 of the pixel $P_{n+1,m+1}$, where the contact part 25c of the floating diffusion FD1 is positioned.

As described above, the read transistor part may be made common between the pixels diagonally adjacent to each other in the pixel array part 10.

(Modification)

Figure 21:
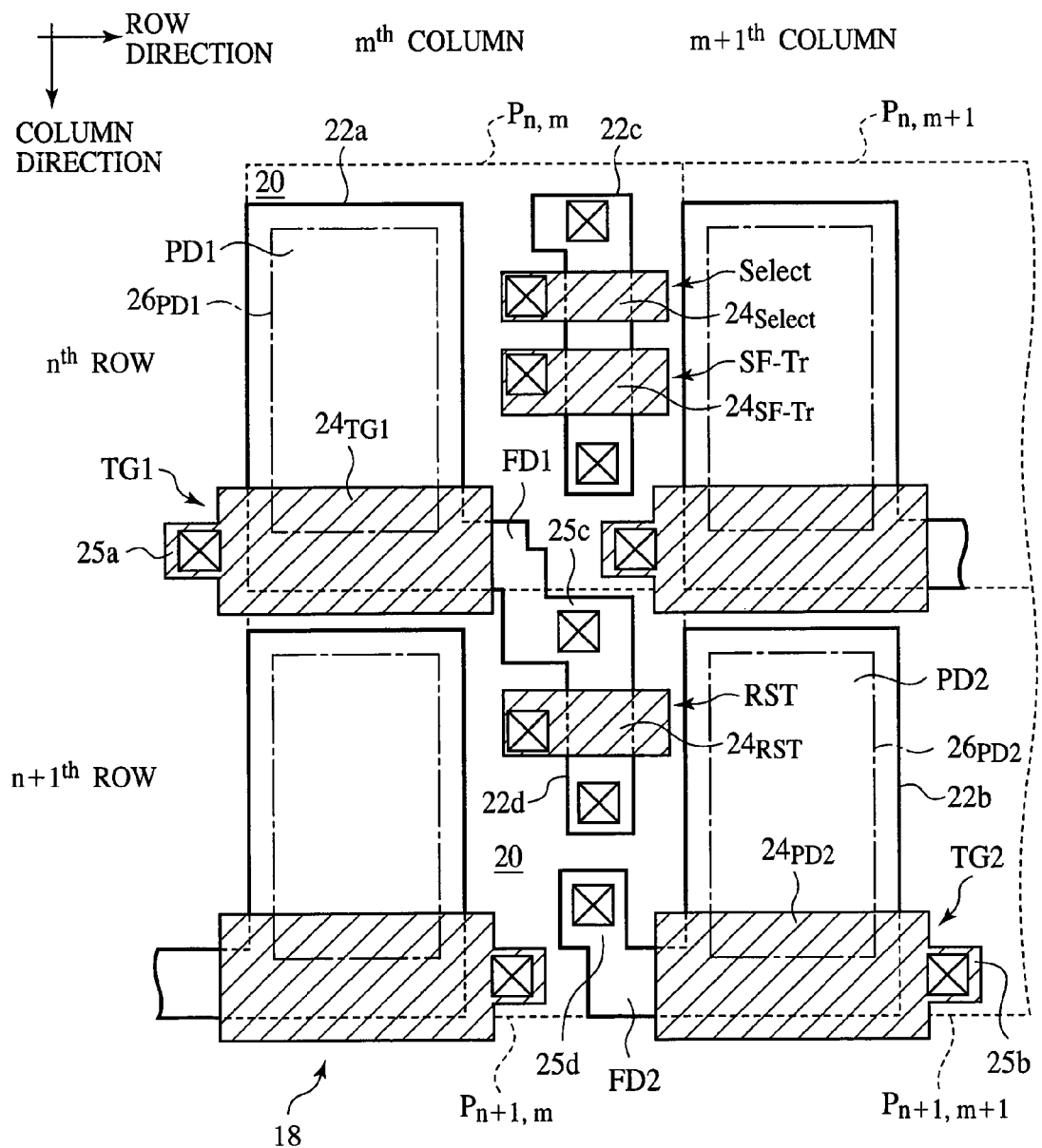
FIG. 21 is a plan view of the solid-state image sensor according to one modification of the fourth embodiment of the present invention, which shows a structure thereof.

Next, the solid-state image sensor according to one modification of the present embodiment will be explained with reference to FIG. 21. FIG. 21 is a plan view of the layout of the active regions and the gate interconnections in the pixel array part of the solid-state image sensor according to the present modification.

In the solid-state image sensor according to the present modification, the gate electrodes of the transfer transistors of the respective pixels which, as described above, are diagonally adjacent to each other and include the common read transistor part have the same shape as in the solid-state image sensor according to the third embodiment shown in FIG. 18.

As shown in FIG. 21, the gate electrode $24_{TG1}$ of the transfer transistor TG1 of the pixel $P_{n,m}$ positioned in the n$^{th}$ row and the m$^{th}$ column is formed, covering the edge of the PD1/TG1/FD1 region 22a, which is parallel with the row direction. Thus, the floating diffusion FD1 is formed in the projected region of the PD1/TG1/FD1 region 22a and the RST region 22d between the gate electrode $24_{TG1}$ and the gate electrode $24_{RST}$. That is, the floating diffusion FD1 is not formed in the region between the transfer transistor TG1 and the photodiode PD2 which are adjacent to each other in the column direction. The edge of the gate electrode $24_{TG1}$ on the side of the photodiode PD1 and the edge of the gate electrode $24_{TG1}$ on the side of the floating diffusion FD1 are intersect each other substantially orthogonally. The width of the edge of the gate electrode $24_{TG1}$ on the side of the photodiode PD1 is larger than the width of the edge of the gate electrode $24_{TG1}$ on the side of the floating diffusion FD1.

The plane shape of the gate electrode $24_{TG2}$ of the transfer transistor TG2 of the pixel $P_{n+1,m+1}$ positioned in the n+1$^{th}$ row and the m+1$^{th}$ column is the same as that of the gate electrode $24_{TG1}$ of the transfer transistor TG1 described above. The gate electrode $24_{TG2}$ of the transfer transistor TG2 is formed, covering the edge of the PD2/TG2/FD2 region 22b, which is parallel with the row direction. Thus, the floating diffusion FD2 is formed in the projected region of the PD2/TG2/FD2 region 22b, where the contact part 25d is provided. That is, the floating diffusion FD2 is not formed in the region between the transfer transistor TG2 and the photodiode PD1 which are adjacent to each other in the column direction. The edge of the gate electrode $24_{TG2}$ on the side of the photodiode PD2 and the edge of the gate electrode $24_{TG2}$ on the side of the floating diffusion FD1 intersect each other substantially orthogonally. The width of the edge of the gate electrode $24_{TG2}$ on the side of the photodiode PD2 is larger than the width of the edge of the gate electrode $24_{TG2}$ on the side of the floating diffusion FD2.

The edge of the gate electrode $24_{TG1}$ of the pixel $P_{n,m}$ on the side of the floating diffusion FD1 and the edge of the gate electrode $24_{TG2}$ of the pixel $P_{n+1,m+1}$ on the side of the floating diffusion FD2, which have been described above, are opposed to each other.

In the above-described layout, when a displacement takes place in the row direction during the fabrication process, a change amount of the area of the floating diffusion FD1 is very opposite to the change amount of the area of the floating diffusion FD2. Specifically, the area of the floating diffusion FD2 is decreased by an increase of the area of the floating diffusion FD1, and the area of the floating diffusion FD2 is increased by a decrease of the area of the floating diffusion FD1.

In the above-described layout, even when a displacement takes place in the row direction, the total area of the floating diffusions FD1, FD2 is never changed. That is, the total capacitance of the floating diffusions FD1, FD2 is never changed.

As described above, the shape of the gate electrodes of the transfer transistors of the respective pixels which are diagonally adjacent to each other and include the common read transistor part is the same of that of the solid-state image sensor according to the third embodiment shown in FIG. 18, whereby even when a displacement in the row direction takes place during the fabrication process, the change of the total capacitance of the floating diffusions FD1, FD2 can be prevented.

A FIFTH EMBODIMENT

Figure 22:
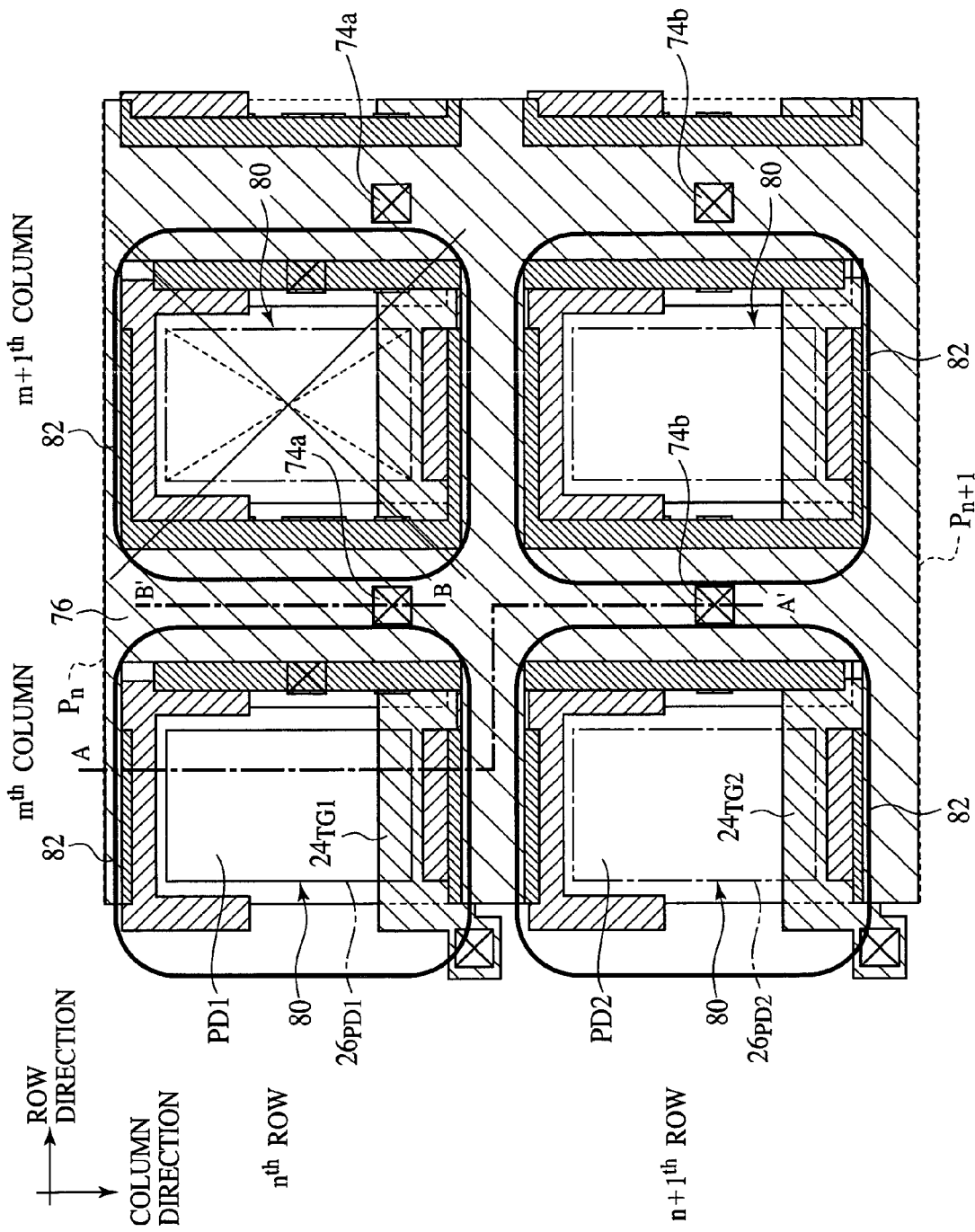
FIG. 22 is a plan view of the solid-state image sensor according to a fifth embodiment of the present invention, which shows a structure thereof.
Figure 23:
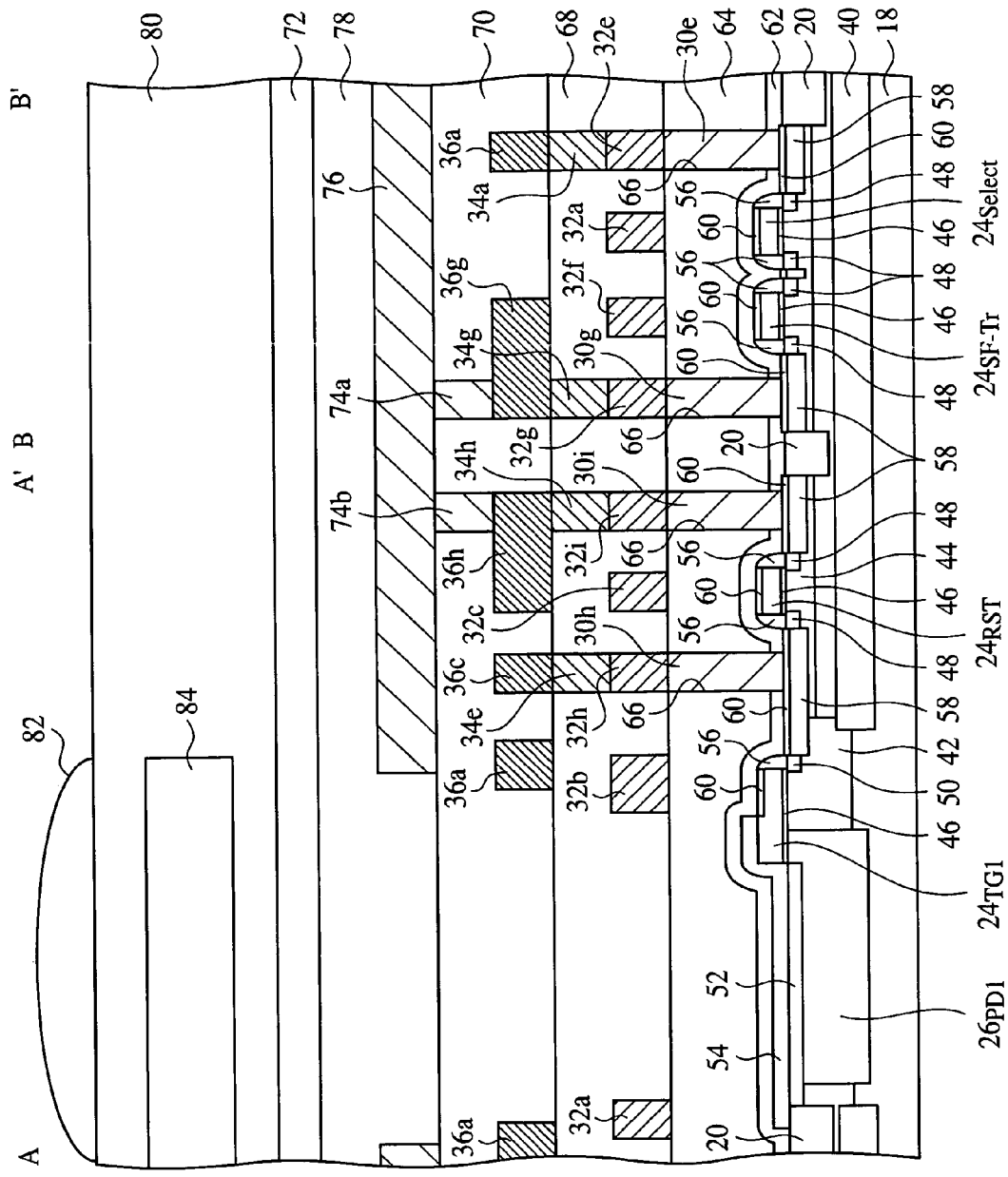
FIG. 23 is a sectional view of the solid-state image sensor according to a fifth embodiment of the present invention, which shows the structure thereof.

The solid-state image sensor according to a fifth embodiment of the present invention will be explained with reference to FIGS. 22 and 23. FIG. 22 is a plan view of the solid-state image sensor according to the present embodiment, which shows a structure thereof. FIG. 23 is a sectional view of the solid-state image sensor according to the present embodiment, which shows the structure. The same members of the present embodiment as those of the solid-state image sensor according to the first and the second embodiments are represented by the same reference numbers not to repeat or to simplify their explanation.

The solid-state image sensor according to the present embodiment is the solid-state image sensor according to the modification of the second embodiment shown in FIG. 17 which includes microlenses for condensing light incident on the photodiodes. The structure of the solid-state image sensor according to the present embodiment will be explained with reference to FIGS. 22 and 23. FIG. 22 is a plan view of the layout of the microlenses in the pixel array part. FIG. 23 is a sectional view along the line A-A' and the line B-B' in FIG. 22. In FIG. 23, the A-A' line sectional view and the B-B' line sectional view are shown side by side.

As shown in FIG. 23, a cover film 72 is formed on an inter-layer insulation film 78 burying the VR line formed of a third metal interconnection layer 76. An insulation film 80 is formed on the cover film 72. A microlens 82 is arranged in the region of the cover film 72, which is over the photodiode PD1. A color filter 84 is buried in the insulation film 80 under the microlens 82.

Thus, the microlens 82 is arranged on the photodiode PD1 with the color filter 84 disposed therebetween.

On the respective pixels in the pixel array part 10, the microlenses 82 are disposed with the color filters 84 disposed therebetween. That is, as shown in FIG. 22, the microlenses 82 are arranged for the photodiodes of the respective pixels in the pixel array part 10 with the same pitches as the pitches in the row and column directions of the photodiodes. Near the center of the pixel array part 10, the microlenses 82 are arranged with the centers of the photodiodes substantially in agreement with the centers of the microlenses 82.

As described above, the solid-state image sensor according to the present embodiment is characterized mainly in that the microlenses 82 are arranged for the respective photodiodes with the same pitches as the pitches in the row and column directions of the photodiodes, and the centers of the photodiodes and the centers of the microlenses 82 are substantially in agreement with each other near the center of pixel array part 10. The mcirolenses 82 are so arranged, whereby with the read transistor part made common between the pixels, the light receiving characteristics can be made uniform between the pixels.

In the present embodiment, the microlenses 82 are arranged in the solid-state image sensor according to the modification of the second embodiment shown in FIG. 17, but the microlenese 82 can be arranged, as in the present embodiment, in the solid-state image sensor according to the other embodiments.

A SIXTH EMBODIMENT

Figure 24:
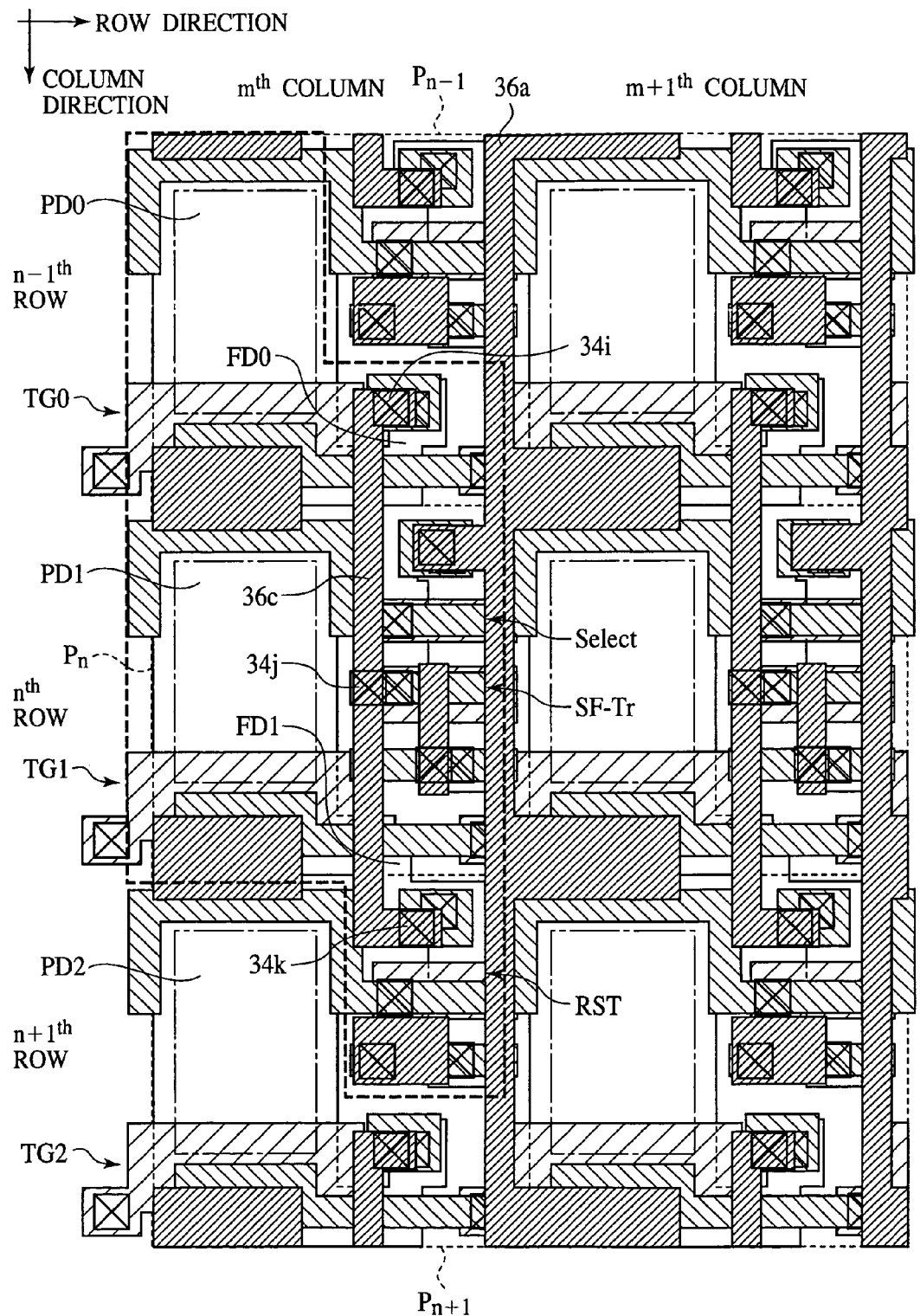
FIG. 24 is a plan view of the solid-state image sensor according to a sixth embodiment of the present invention, which shows a structure thereof (Part 1).
Figure 25:
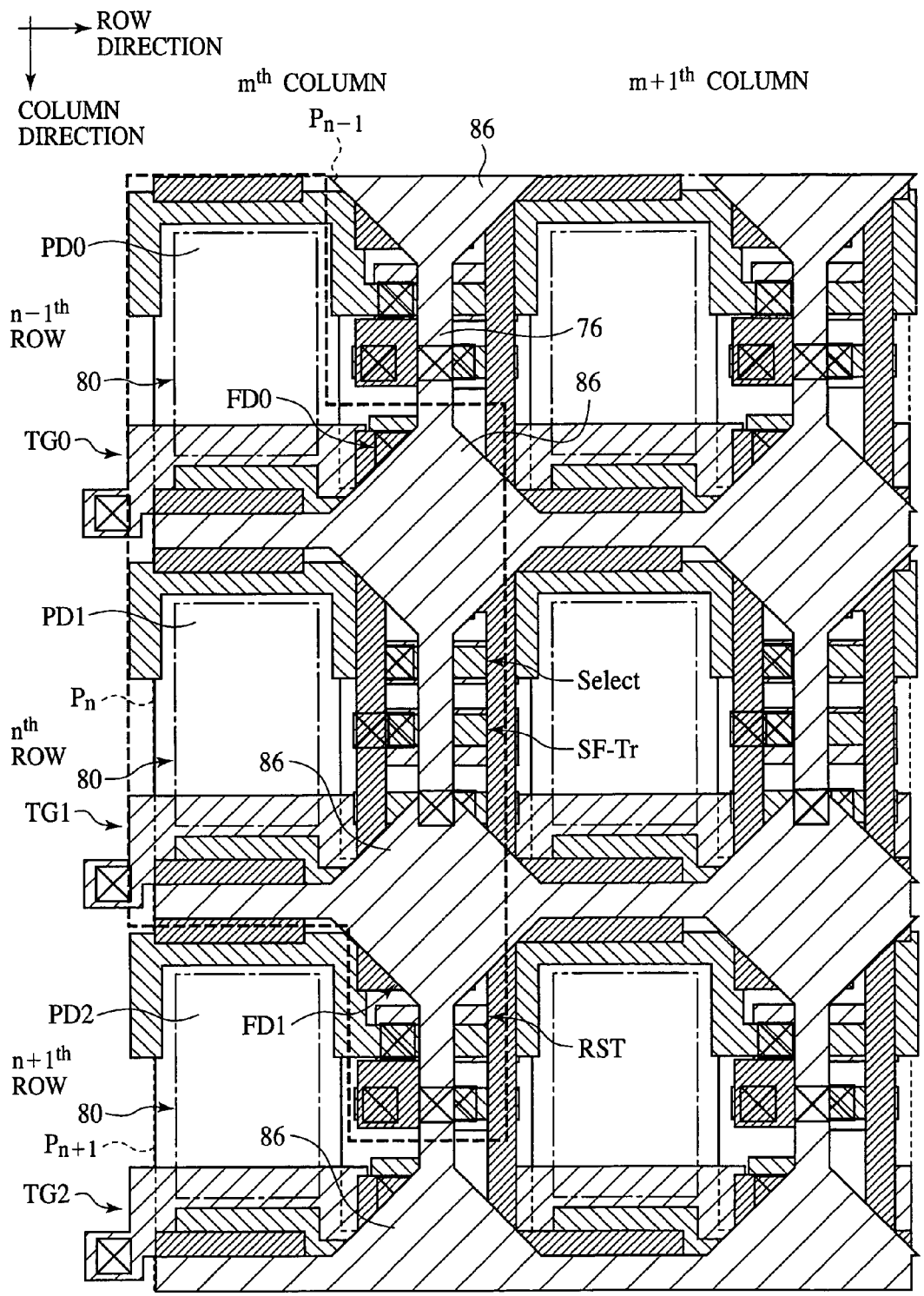
FIG. 25 is a plan view of the solid-state image sensor according to the sixth embodiment of the present invention, which shows the structure thereof (Part 2).

The solid-state image sensor according to the present invention will be explained with reference to FIGS. 24 and 25. FIGS. 24 and 25 are plan views of the solid-state image sensor according to the present embodiment, which show a structure thereof. The same members of the present embodiment as the solid-state image sensor according to the first and the second embodiments are represented by the same reference number not to repeat or to simplify their explanation.

The solid-state image sensor according to the present embodiment is the same as the solid-state image sensor according to the second embodiment in the basic structure and the fabrication method except that the layouts of the second and the third metal interconnection layers 36, 76 in the pixel array part 10 of pixels having the read transistor parts made common therebetween, and the set of the pixels including the common read transistor part is different from that of the pixels in the second embodiment. The structure of the solid-state image sensor according to the present embodiment will be explained with reference to FIGS. 24 and 25. FIG. 24 is a plan view of the layout of the second metal interconnection layer in the pixel array part of the solid-state image sensor according to the present embodiment. FIG. 25 is a plan view of the layout of the third metal interconnection layer in the pixel array part of the solid-state image sensor according to the present embodiment. In FIGS. 24 and 25, the pixel array part 10 is represented by 2×3 pixel units of substantially square.

Of the pixels adjacent in the column direction, the pixels $P_n$, $P_{n+1}$ positioned in the $n^{th}$ row and the n+1$^{th}$ row have the same layouts of the active regions and the gate interconnections as those of the solid-state image sensor according to the second embodiment. On the other hand, the pixel $P_{n-1}$ positioned in the n-1$^{th}$ row has the same layouts of the active regions and the gate interconnections as those of the pixel $P_{n+1}$ positioned in the n+1$^{th}$ row. That is, the photodiode PD0, the transfer transistor TG0, the floating diffusion FD0 of the pixel $P_{n-1}$ are the same as those of the photodiode PD2, the transfer transistor TG2 and the floating diffusion FD2 of the pixel $P_{n+1}$.

In the solid-state image sensor according to the present embodiment, of the pixels adjacent in the column direction, the pixel $P_{n-1}$ positioned in the n-1$^{th}$ row and the pixel $P_n$ in the $n^{th}$ row have the read transistor part made common therebetween.

Of the common read transistor part, the select transistor Select and the source follower transistor SF-Tr are arranged in the pixel $P_n$ positioned in the $n^{th}$ row, and the reset transistor RST is arranged in the pixel $P_{n+1}$ positioned in the n+1$^{th}$ row.

With the read transistor part thus made common, in the second metal interconnection layer 36, as shown in FIG. 24, an FD-SF interconnection 36c is electrically connected to the floating diffusion FD0 of the pixel $P_{n-1}$ positioned in the n-1$^{th}$ row, the gate electrode $24_{SF-Tr}$ of the source follower transistor SF-Tr of the pixel $P_n$ positioned in the $n^{th}$ row, and the floating diffusion FD1 of the pixel $P_n$ positioned in the $n^{th}$ row, the contact part 25c of the floating diffusion FD1 being led into the pixel $P_{n+1}$ positioned in the n+1$^{th}$ row, in the stated order respectively via contact plugs 34i, 34j, 34k.

Thus, in the pixels $P_{n-1}$ and $P_n$ which are adjacent each other in the column direction and including the common read transistor part, the floating diffusion FD0, the gate electrode $24_{SF-Tr}$ of the source follower transistor SF-Tr and the floating diffusion FD1 are arranged in the column direction in the stated order and electrically connected to one another by the FD-SF interconnection 36c.

The VR line formed of the third metal interconnection layer 76 are extended, as shown in FIG. 25, in the row direction and in the column direction and functions as a light shielding film. In the openings 80 where the VR line 76 are not formed, the photodiodes of the respective pixels are positioned. A metal layer 86 is formed in a rectangular shape integrally with the VR line 76 in the regions where the VR line extended in the row direction and the VR line 76 extended in the column direction intersect each other.

As in the present embodiment, the layouts of the metal interconnections are suitably changed, whereby the pixel $P_{n-1}$ positioned in the n-1$^{th}$ row having the same layout of the active regions and gate interconnections as the pixel $P_{n+1}$ positioned in the n+1$^{th}$ row, and the pixel $P_n$ positioned in the $n^{th}$ row may have the read transistor part made common therebetween.

The openings 80 formed in the third metal interconnection layer 76 are formed in a shape which is more approximate to a circle, whereby the light receipt of the photodiodes can be made more uniform among the pixels.

A SEVENTH EMBODIMENT

The solid-state image sensor according to a seventh embodiment of the present invention will be explained with reference to FIGS. 26 to 29. FIGS. 26 to 29 are plan views of the solid-state image sensor according to the present embodiment, which show a structure thereof. The same members of the present embodiment as those of the solid-state image sensor according to the first and the second embodiments are represented by the same reference numbers not to repeat or to simplify their explanation.

Figure 26:
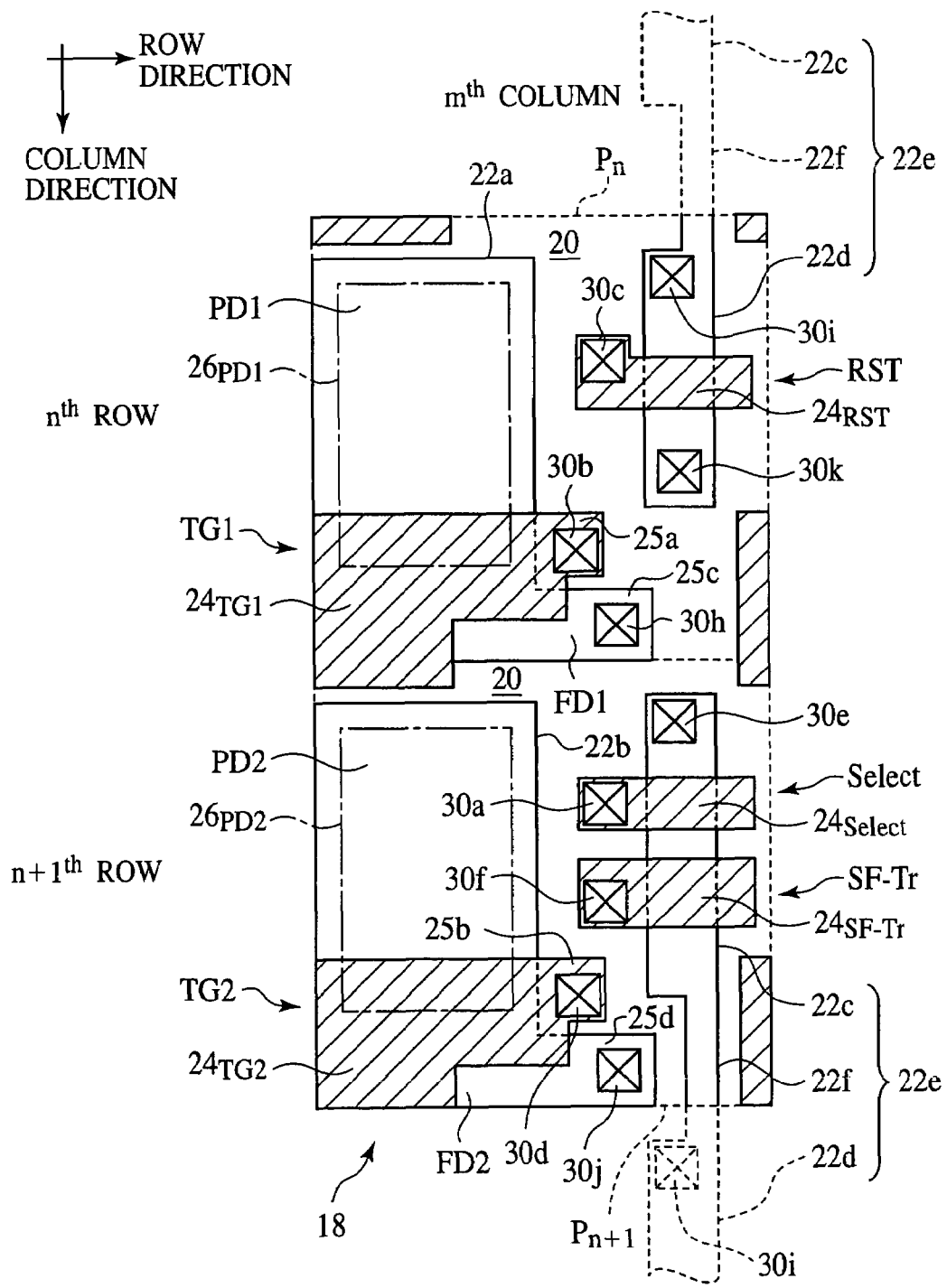
FIG. 26 is a plan view of the solid-state image sensor according to a seventh embodiment of the present invention, which shows a structure thereof (Part 1).
Figure 27:
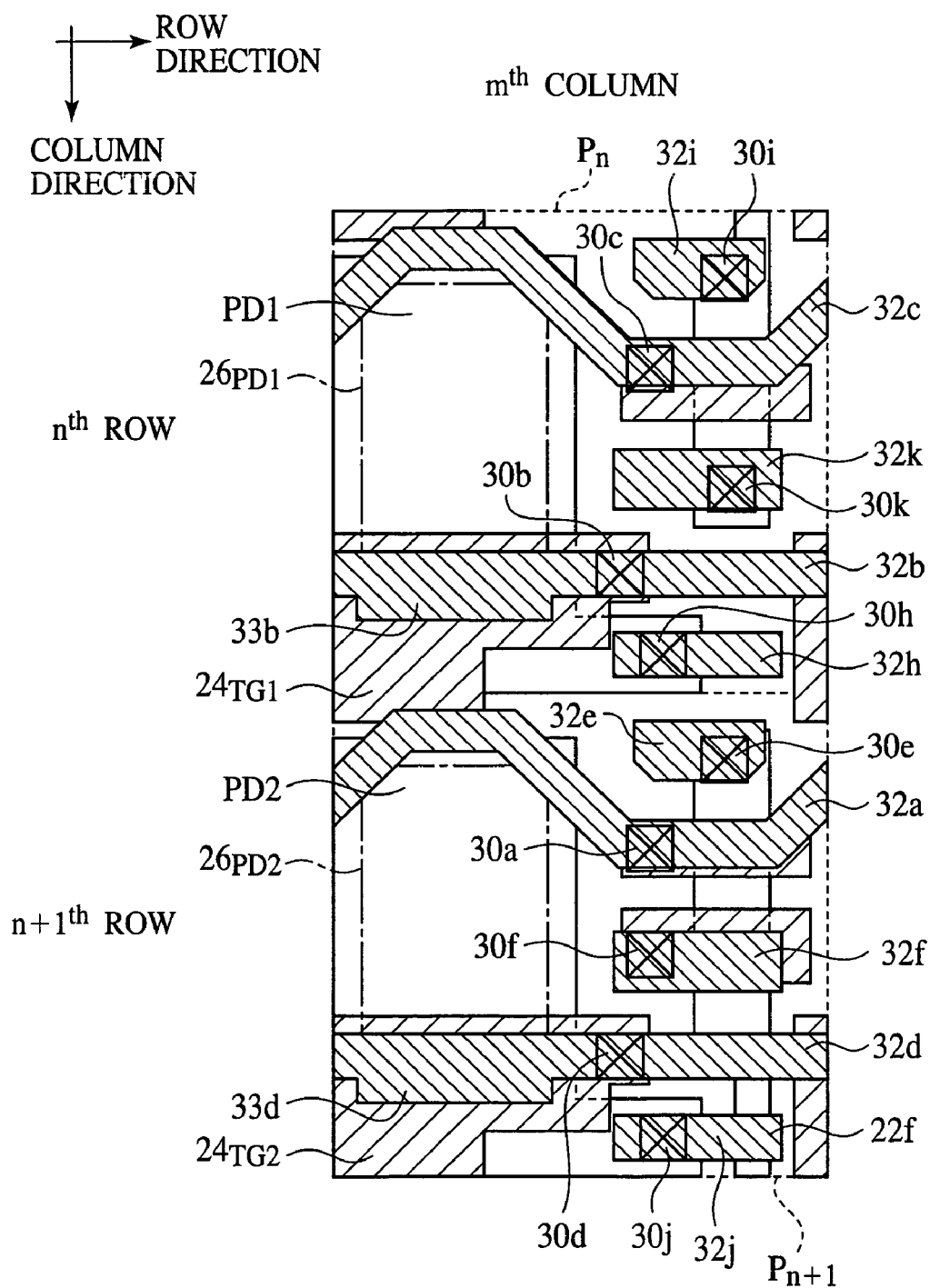
FIG. 27 is a plan view of the solid-state image sensor according to the seventh embodiment of the present invention, which shows the structure thereof (Part 2).
Figure 28:
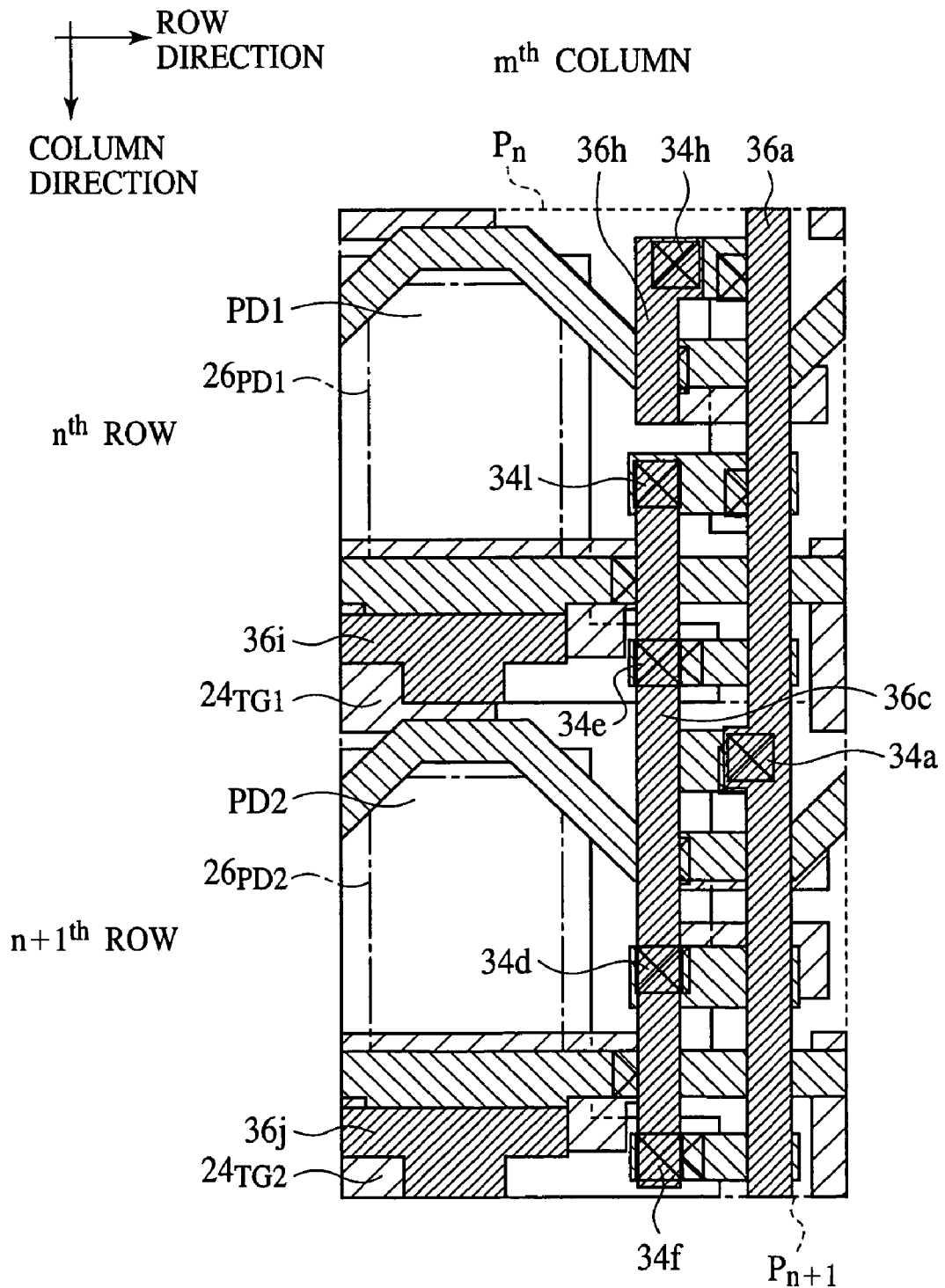
FIG. 28 is a plan view of the solid-state image sensor according to the seventh embodiment of the present invention, which shows the structure thereof (Part 3).
Figure 29:
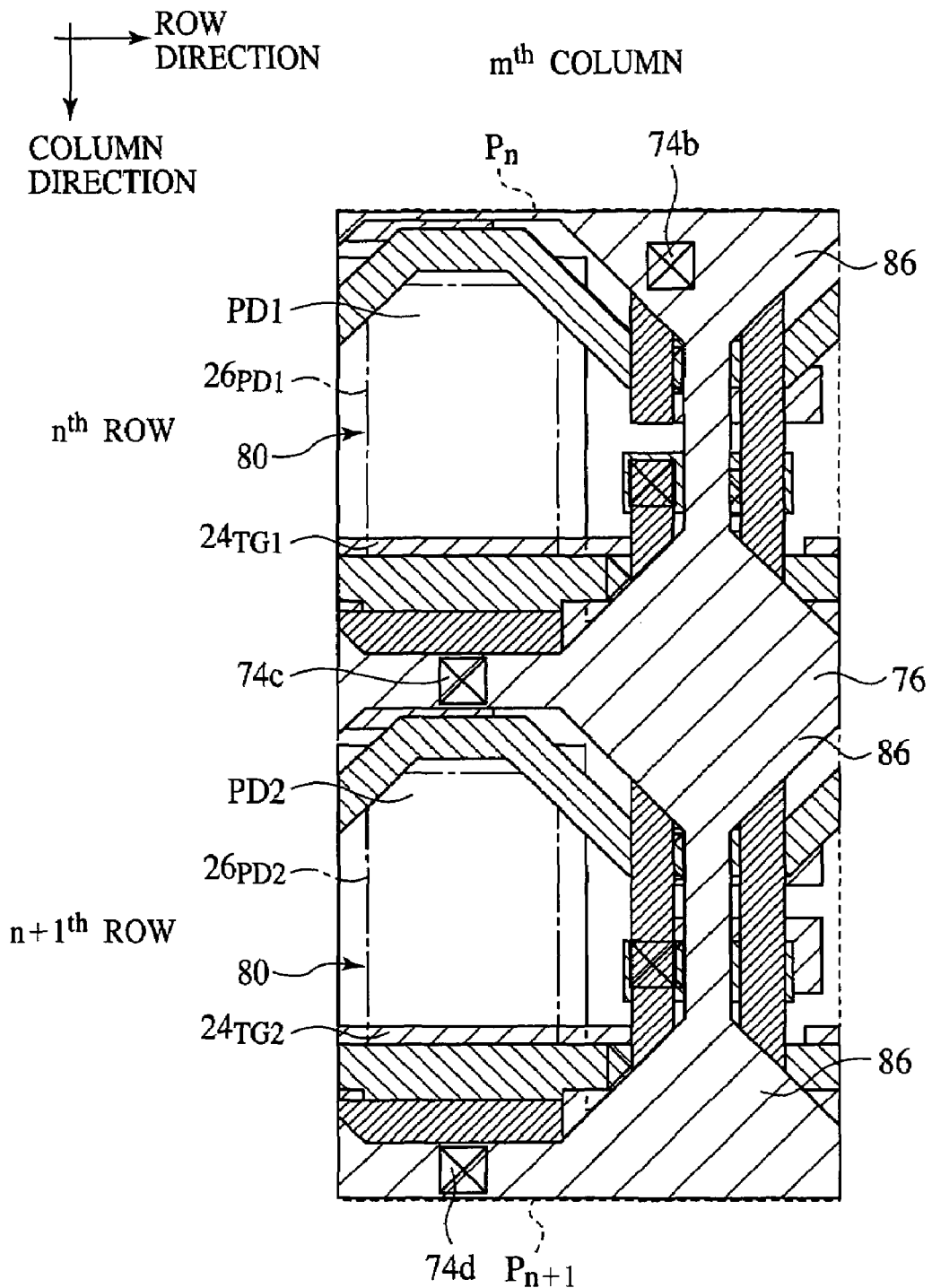
FIG. 29 is a plan view of the solid-state image sensor according to the seventh embodiment of the present invention, which shows the structure thereof (Part 4).

The solid-state image sensor according to the present embodiment is characterized in that the shape of the floating diffusion FD1 of a pixel $P_n$ and the shape of the floating diffusion FD2 of a pixel $P_{n+1}$ are substantially the same, and is characterized also in that a select transistor, a source follower transistor SF-Tr and a reset transistor RST which are made common between the pixels are formed in one continuous active region. The structure of the solid-state image sensor according to the present embodiment will be explained with reference to FIGS. 26 to 29. FIG. 26 is a plan view of the layout of the active regions and the gate interconnections in the pixel array part of the solid-state image sensor according to the present embodiment. FIG. 27 is a plan view of a first metal interconnection layer in the pixel array part of the solid-state image sensor according to the present embodiment. FIG. 28 is a plan view of the layout of a second metal interconnection layer in the pixel array part of the solid-state image sensor according to the present embodiment. FIG. 29 is a plan view of the layout of a third metal interconnection layer in the pixel array part of the solid-state image sensor according to the present embodiment.

In FIGS. 26 to 29, a plurality of pixel arranged in a matrix in the pixel array part 10 are represented by the pixels $P_n$, $P_{n+1}$ positioned in the $n^{th}$ row and the $n+1^{th}$ row adjacent to each other in the column direction in the $m^{th}$ column including the common read transistor part. The sets of the pixels $P_n$, $P_{n+1}$ adjacent to each other in the column direction including the common read transistor part are arranged with 1 pixel pitch in the row direction and with 2 pixel pitch in the column direction.

As shown in FIG. 26, active regions 22a~22f are defined on a silicon substrate 18 by element isolation regions 20. The active regions 22 of the pixels $P_n$, $P_{n+1}$ adjacent to each other in the column direction including the common read transistor part has a PD1/TG1/FD1 region 22a, a PD2/TG2/FD2 region 22b and a read transistor region 22e which will be explained below.

The pixel $P_n$ positioned in the $n^{th}$ row has the PD1/TG1/FD1 region 22a including a wide rectangular region which is elongated in the column direction, and a projected region which is continuous to the wide rectangular region and projected from one of the sides of the wide rectangular region, which are parallel with the column direction, where the photodiode PD1, the transfer transistor TG1 and the floating diffusion FD1 are provided. A contact part 25c is provided at the end of the projected region of the PD1/TG1/FD1 region 22a. The contact part 25c is electrically connected to an FD-SF interconnection 36c (see FIG. 28) for electrically connecting the floating diffusion FD1 and the floating diffusion FD2 with each other, which will be described later, via a contact plug 30h, a lead interconnection 32h (see FIG. 27) and a contact plug 34e (see FIG. 28).

The pixel $P_{n+1}$ positioned in the $n+1^{th}$ row has the PD2/TG2/FD2 region 22b including a wide rectangular region which is elongated in the column direction, and a projected region which is continuous to the wide rectangular region and projected from one of the sides of the wide rectangular region, which are parallel with the column direction, where the photodiode PD2, the transfer transistor TG2 and the floating diffusion FD2 are provided. A contact part 25d is provided at the end of the projected region of the PD2/TG2/FD2 region 22b. The contact part 25d is electrically connected to an FD-SF interconnection 36c (see FIG. 28) for electrically connecting the floating diffusion FD1 and the floating diffusion FD2 with each other, which will be described later, via a contact plug 30j, a lead interconnection 32j (see FIG. 27) and a contact plug 34f (see FIG. 28).

The PD1/TG1/FD1 region 22a and the PD2/TG2/FD2 region 22b have substantially the same shape. The position of the PD1/TG1/FD1 region 22a in the pixel $P_n$ and the position of the PD2/TG2/FD2 region 22b in the pixel $P_{n+1}$ are substantially the same. That is, the PD1/TG1/FD1 region 22a and the PD2/TG2/FD2 region 22b are spaced from each other substantially with 1 pixel pitch in the column direction.

Compared to the solid-state image sensor according to the first and the second embodiments, the solid-state image sensor according to the present embodiment is altered so that, as described above, the PD1/TG1/FD1 region 22a and the PD2/TG2/FD2 region 22b have substantially the same shape, and additionally, the layout of the active region with the common read transistor part formed in is changed as will be described below.

The pixel $P_n$ positioned in the $n^{th}$ row includes the RST region 22d for the reset transistor RST of the common read transistor part formed in. The RST region 22d is provided on the side of one of the sides of the pixel $P_n$, which are parallel with the column direction, with respect to the PD1/TG1/FD1 region 22a. The shape of the RST region 22d is a rectangle which is longer in the column direction.

The pixel $P_{n+1}$ positioned in the $n+1^{th}$ row includes the Select/SF-Tr region 22c with the select transistor Select and the source follower transistor SF-Tr of the common read transistor part formed in. The Select/SF-Tr region 22c is provided on one side of one of the sides of the pixel $P_{n+1}$, which are parallel with the column direction, with respect to the PD2/TG2/FD2 region 22b. The shape of the Select/SF-Tr region 22c is a rectangle which is longer in the column direction.

The Select/SF-Tr region 22c and the RST region 22d are provided both on the same side in the row direction with respect to the PD1/TG1/FD1 region 22a and the PD2/TG2/FD2 region 22b.

The pixel $P_{n-1}$ (not shown) which is adjacent to the pixel $P_n$ in the column direction and positioned in the $n-1^{th}$ row includes active regions which are the same as those of the pixel $P_{n+1}$. The pixel $P_{n+2}$ (not shown) which is adjacent to the pixel $P_{n+1}$ in the column direction and positioned in the $n+2^{th}$ row includes active regions which are the same as those of the pixel $P_n$. The RST region 22d of the pixel $P_n$ is integrally continuous to the Select/SF-Tr region 22c of the pixel $P_{n-1}$ via the active region 22f elongated in the column direction. The Select/SF-Tr region 22c of the pixel $P_{n+1}$ is integrally continuous to the RST region 22d of the pixel $P_{n+2}$ via the active region 22f elongated in the column direction. Thus, the read transistor region 22e which is one continuous active region of the continuously integral Select/SF-Tr region 22c and the RST region 22d is provided over the pixel $P_{n-1}$ and the $P_n$. Similarly, over the pixel $P_{n+1}$ and the pixel $P_{n+2}$, the read transistor region 22e which is one continuous active region of the continuously integral Select/SF-Tr region 22c and the RST region 22d is provided.

The photodiode PD1 is formed in the wide rectangular region of the PD1/TG1/FD1 region 22a of the pixel $P_n$ positioned in the $n^{th}$ row. Near the end of the photodiode PD1, which is lower in the PD1/FG1/FD1 region 22a as viewed in FIG. 26, the gate electrode $24_{TG1}$ of the transfer transistor TG1 is formed, bridging the PD1/TG1/FD1 region 22a in the row direction. Under the end of the gate electrode $24_{TG1}$ on the side of the photodiode PD1, the end of the buried N-type diffused layer $26_{PD1}$ is positioned. A contact part 25a is projected from the end of the gate electrode $24_{TG1}$ on the side of the RST region 22*d*. The contact part 25*a* is electrically connected to the TG1 line 32*b* (see FIG. 27) via the contact plug 30*b*. The shape of the gate electrode 24$_{TG1}$ is the same except the contact part 25*a* as that of the solid-state image sensor according to the modification of the third embodiment shown in FIG. 19.

The photodiode PD2 is formed in the wide rectangular region of the PD2/TG2/FD2 region 22*b* of the pixel P$_{n+1}$ positioned in the n+1$^{th}$ row. Near the end of the photodiode PD2, which is lower in the PD2/FG2/FD2 region 22*b* as viewed in FIG. 26, the gate electrode 24$_{TG2}$ of the transfer transistor TG2 is formed, bridging the PD2/TG2/FD2 region 22*b* in the row direction. Under the end of the gate electrode 24$_{TG2}$ on the side of the photodiode PD2, the end of the buried N-type diffused layer 26$_{PD2}$ is positioned. A contact part 25*b* is projected from the end of the gate electrode 24$_{TG2}$ on the side of the Select/SF-Tr region 22*c*. The contact part 25*b* is electrically connected to the TG2 line 32*d* (see FIG. 27) via the contact plug 30*d*. The shape of the gate electrode 24$_{TG2}$ is the same except the contact part 25*b* as that of the solid-state image sensor according to the modification of the third embodiment shown in FIG. 19.

The photodiode PD1 and the photodiode PD2 have substantially the same shape. The gate electrode 24$_{TG1}$ including the contact part 25*a* and the gate electrode 24$_{TG2}$ including the contact part 25*b* have substantially the same shape. The positional relationship of the gate electrode 24$_{TG1}$ with respect to the photodiode PD1 and the positional relationship of the gate electrode 24$_{TG2}$ with respect to the photodiode PD2 are substantially the same. That is, the photodiode PD1 and the photodiode PD2 are spaced form each other substantially with pixel pitch in the column direction, and the gate electrode 24$_{TG1}$ and the gate electrode 24$_{TG2}$ are spaced from each other substantially with 1 pixel pitch in the column direction. The overlap of the buried N-type diffused layer 26$_{PD1}$ of the photodiode PD1 with the gate electrode 24$_{TG1}$ and the overlap of the buried N-type diffused layer 26$_{PD2}$ of the photodiode PD2 with the gate electrode 24$_{TG2}$ are substantially the same. That is, the area of the part of the buried N-type diffused layer 26$_{PD1}$ present immediately under the end of the gate electrode 24$_{TG1}$ and the area of the part of the buried N-type diffused layer 26$_{PD2}$ present immediately under the end of the gate electrode 24$_{TG2}$ are substantially equal to each other.

Above the RST region 22*d* of the pixel P$_n$ positioned in the n$^{th}$ row, the gate electrode 24$_{RST}$ of the reset transistor RST is formed, bridging the RST region 22*d* in the row direction.

Above the Select/SF-Tr region 22*c* of the pixel P$_{n+1}$ positioned in the n+1$^{th}$ row, the gate electrode 24$_{Select}$ of the select transistor Select and the gate electrode 24$_{SF-Tr}$ of the source follower transistor SF-Tr are formed respectively bridging the Select/SF-Tr region 22*c* in the row direction. The gate electrode 24$_{Select}$ and the gate electrode 24$_{SF-Tr}$ are arranged from the n+1$^{th}$ row toward the n+2$^{th}$ row in the stated order.

As described above, the RST region 22*d* of the pixel P$_n$ is integrally continuous, via the active region 22*f* elongated in the column direction, to the Select/SF-Tr region 22*c* of the pixel P$_{n-1}$ adjacent to the pixel P$_n$ in the column direction and positioned in the n−1$^{th}$ row. This makes the drain region of the reset transistor RST of the pixel P$_n$ and the drain region of the source follower transistor SF-Tr of the pixel P$_{n-1}$ continuous via the active region 22*f*. That is, the drain region of the reset transistor RST of the pixel P$_n$ and the drain region of the source follower transistor SF-Tr of the pixel P$_{n-1}$ are formed of a common impurity diffused region. The Select/SF-Tr region 22*c* of the pixel P$_{n+1}$ is integrally continuous to the RST region 22*d* of the pixel P$_{n+2}$ adjacent to the pixel P$_{n+1}$ in the column direction and positioned in the n+2$^{th}$ row via the elongated active region 22*f* elongated in the column direction. This makes the drain region of the source follower transistor SF-Tr of the pixel P$_{n+1}$ and the drain region of the reset transistor RST of the pixel P$_{n+2}$ are continuous via the active region 22*f*. That is, the drain region of the source follower transistor SF-Tr of the pixel P$_{n+1}$ and the drain region of the reset transistor RST of the pixel P$_{n+2}$ are formed of a common impurity diffused region.

Thus, the common read transistor part (Select transistor Select, source follower transistor SF-Tr and reset transistor RST) of the pixel P$_n$, P$_{n+1}$ adjacent in the column direction in the m$^{th}$ column is formed in the region between the photodiodes PD1, PD2 in the m$^{th}$ row and the photodiodes PD1, PD2 in the m+1$^{th}$ row.

In the part of the PD1/TG1/FD1 region 22*a*, which is between the gate electrode 24$_{TG1}$ and the contact part 25*c*, the floating diffusion FD1 is formed. The floating diffusion FD2 is formed in the part of the PD2/TG2/FD2 region 22*b*, which is between the gate electrode 24$_{TG2}$ and the contact part 25*d*. Thus, the floating diffusion FD1 and the floating diffusion FD2 are formed in the active regions of substantially the same shape. The location of the floating diffusion FD1 in the pixel P$_n$ and the location of the floating diffusion FD2 in the pixel P$_{n+1}$ are substantially the same. That is, the floating diffusion FD1 and the floating diffusion FD2 are spaced from each other substantially with 1 pixel pitch in the column direction.

As shown in FIG. 27, the first metal interconnection layer 32 includes the Select line 32*a* electrically connected to the gate electrode 24$_{Select}$ via a contact plug 30*a*, the TG1 line 32*b* electrically connected to the gate electrode 24$_{TG1}$ via a contact plug 30*b*, the RST line 32*c* electrically connected to the gate electrode 24$_{RST}$ via a contact plug 30*c* and the TG2 line 32*d* electrically connected to the gate electrode 24$_{TG2}$ via a contact plug 30*d*. The first metal interconnection layer 32 also includes the lead interconnection 32*e* electrically connected to the source region of the select transistor Select via a contact plug 30*e*, the lead interconnection 32*f* electrically connected to the gate electrode 24$_{SF-Tr}$ via a contact plug 30*f*, the lead interconnection 32*h* electrically connected to the floating diffusion FD1 via a contact plug 30*h*, the lead interconnection 32*i* electrically connected to the drain region of the reset transistor RST via a contact plug 30*i*, the lead interconnection 32*j* electrically connected to the floating diffusion FD2 via a contact plug 30*j*, and the lead interconnection 32*k* electrically connected to the source region of the reset transistor RST via a contact plug 30*k*.

The select line 32*a* is extended sinuously in the row direction, getting around the photodiode PD2. That is, near one of the edges of the photodiode PD2 parallel with the row direction, the Select line 32*a* is extended along said edge with a prescribed space from the edge of the photodiode PD2. Near the corners of the photodiode PD2, the Select line 32*a* is extended, overlapping obliquely a small part of each of said corners of the photodiode PD2.

The RST line 32*c* is extended sinuously in the row direction, getting around the photodiode PD1. That is, near one of the edges of the photodiode PD1 parallel with the row direction, the RST line 32*c* is extended along said edge with a prescribed space from the edge of the photodiode PD1. Near the corners of the photodiode PD1, the RST line 32*c* is extended, overlapping obliquely a small part of each of said corners of the photodiode PD1. The pattern shape of the RST line 32*c* is substantially the same as the shape of the Select line 32*a*.

The TG1 line 32*b* electrically connected to the gate electrode 24$_{TG1}$ is extended in the row direction, overlapping the end of the photodiode PD1 on the side of the gate electrode $24_{TG1}$. The TG1 line 32b has a widened part widened downward as viewed in the drawing at a part thereof near the end of the photodiode PD1.

Similarly, The TG2 lines 32d electrically connected to the gate electrode $24_{TG2}$ is extended in the row direction, overlapping the end of the photodiode PD2 on the side of the gate electrode $24_{TG2}$. The TG2 line 32d has a widened part 33d widened downward as viewed in the drawing at a part of thereof near the end of the photodiode PD2. The pattern shape of the TG2 line 32d is substantially the same as the pattern shape of the TG1 line 32b. The overlap of the TG2 line 32d over the end of the photodiode PD2 is substantially the same as the overlap of the TG1 line 32b over the end of the photodiode PD1.

The contact plug 30b electrically connecting the TG1 line 32b to the gate electrode $24_{TG1}$ is connected to the contact part 25a of the gate electrode $24_{TG1}$ projected from the end of the gate electrode $24_{TG1}$ on the side of the RST region 22d. Thus, the contact part 25a of the gate electrode $24_{TG1}$ connected to the contact plug 30b is not formed in the region between the photodiode PD1 and the photodiode PD2 adjacent to each other in the column direction.

The contact plug 30d electrically connecting the TG2 line 32d to the gate electrode $24_{TG2}$ is connected to the contact part 25b of the gate electrode $24_{TG2}$ projected from the end of the gate electrode $24_{TG2}$ on the side of the Select/SF-Tr region 22c. Thus, the contact part 25b of the gate electrode $24_{TG2}$ connected to the contact plug 30d is not formed in the region between the photodiode PD1 and the photodiode PD2 adjacent to each other in the column direction.

The contact plug 30h electrically connecting the lead interconnection 32h to the floating diffusion FD1 is connected to the contact part 25c provided in the projected region of the PD1/TG1/FD1 region 22a. The contact part 25c of the floating diffusion FD1 is not formed in the region between the photodiode PD1 and the photodiode PD2 adjacent to each other in the column direction.

The contact plug 30j electrically connecting the lead interconnection 32j to the floating diffusion FD2 is connected to the contact part 25d provided in the projected region of the PD2/TG2/FD2 region 22b. The contact part 25d of the floating diffusion FD2 is not formed in the region between the photodiode PD1 and the photodiode PD2 adjacent to each other in the column direction.

In the first metal interconnection layer 32, the RST line 32c and the Select 32a have the substantially same pattern shape, the TG1 line 32b and the TG2 line 32d have the substantially same pattern shape, and in addition thereto, the lead interconnections have substantially the same pattern shape as follows. That is, the lead interconnection 32i and the lead interconnection 32e have substantially the same pattern shape. The lead interconnection 32k and the lead interconnection 32f have substantially the same pattern shape. The lead interconnection 32h and the lead interconnection 33j have substantially the same pattern shape. Thus, in the first metal interconnection layer 32, the interconnection layers (RST line 32c, TG1 line 32b, lead interconnections 32i, 32k, 32h) of the pixel $P_n$, and the interconnection layers (Select line 32a, TG2 line 32d lead interconnections 32e, 32f, 32j) of the pixel $P_{n+1}$ have substantially the same pattern shape.

As shown in FIG. 28, the second metal interconnection layer 36 includes the signal read line 36a electrically connected to the source region of the select transistor Select via a contact plug 34a, and the FD-SF interconnection 36c electrically connected to the gate electrode $24_{SF-Tr}$ of the source follower transistor SF-Tr, the floating diffusion FD1, the floating diffusion FD2 and the source region of the reset transistor RST respectively via a contact plugs 34d, 34e, 34f, 34l. The second interconnection layer 36 further includes the lead interconnection 36h electrically connected to the drain region of the reset transistor RST via a contact plug 34h. Furthermore, the second metal interconnection layer 36 includes VR lines 36i, 36j which are formed respectively over the gate electrodes $24_{TG1}$, $24_{TG2}$, and, as will be described later, are electrically connected to the VR line 76 (see FIG. 29) respectively via contact plugs 74c, 74d (see FIG. 29).

The signal read line 36a and the FD-SF interconnection 36c are extended respectively in the column direction. The lead interconnection 36h is formed side by side in the column direction with the FD-SF interconnection 36c.

The signal read line 36a is electrically connected to the source region of the select transistor Select via the contact plug 30e, the lead interconnection 32e of the first metal interconnection layer 32 and the contact plug 34a.

The FD-SF interconnection 36c is electrically connected to the gate electrode $24_{SF-Tr}$ of the source follower transistor SF-Tr via the contact plug 30f, the lead interconnection 32f of the first metal interconnection layer 32 and the contact plug 34d. The FD-SF interconnection 36c is electrically connected to the floating diffusion FD1 via the contact plug 30h, the lead interconnection 32h of the first metal interconnection layer 32 and the contact plug 34e. Furthermore, the FD-SF interconnection 36c is electrically connected to the floating diffusion FD2 via the contact plug 30j, the lead interconnection 32j of the first metal interconnection layer 32j and the contact plug 34f. Further, the FD-SF interconnection 36c is electrically connected to the source region of the reset transistor RST via the contact plug 30k, the lead interconnection 32k of the first metal interconnection layer 32 and the contact plug 34l. Thus, the floating diffusion FD1, the floating diffusion FD2, the gate electrode $24_{SF-Tr}$ of the source follower transistor SF-Tr and the source region of the reset transistor RST are connected to each other by the FD-SF interconnection 36c, and the lead interconnections 32f, 32h, 32j, 32k.

The VR line 36i is formed over the gate electrode $24_{TG1}$ and below the TG1 line 32b as viewed in the drawing. The pattern of the VR line 36i has a T-shape including a rectangular part elongated in the row direction along the TG1 line 32b and a rectangular part projected from said elongated rectangular part downward as viewed in the drawing. The end of the widened part 33b of the TG1 line 32b is located under the end of the VR line 36i on the side of the TG1 line 32b.

The VR line 36j is formed over the gate electrode $24_{TG2}$ and below the TG2 line 32d as viewed in the drawing. The pattern shape of the VR line 36j is substantially the same as the pattern shape of the VR line 36j and has a T-shape including a rectangular part elongated in the row direction along the TG2 line 32d and a rectangular part projected from said elongated rectangular part downward as viewed in the drawing. The end of the widened part 33d of the TG2 line 32d is located under the end of the VR line 36j on the side of the TG2 line 32d.

As shown in FIG. 29, the third metal interconnection layer 76 forms the VR line electrically connected to the VR line 36i. 36j respectively via the contact plugs 74c, 74d.

The VR line 76 is extended both in the row direction and in the column direction to function as a light shielding film, as in the solid-state image sensor according to the sixth embodiment illustrated in FIG. 25. In the openings 80 where the VR line is not formed, the photodiodes PD1, PD2 are positioned. In the regions where the VR line 76 extended in the row direction and the VR line 76 extended in the column direction intersect each other, a metal layer 86 is formed in a rectangle integrally with the VR line 76. Thus, the openings 80 where the photodiodes PD1, PD2 of the respective pixels are positioned are formed in an octagon.

The VR line 76 is electrically connected to the drain region of the rest transistor RST via the contact plug 30i, the lead interconnection 32i of the first metal interconnection layer 32, the contact plug 34h, the lead interconnection 36h of the second metal interconnection layer 36 and the contact plug 74b.

The VR line 76 is electrically connected to the VR line 36i of the second metal interconnection layer 36 formed over the gate electrode $24_{TG1}$ via the contact plug 74c and is electrically connected to the VR line 36j of the second metal interconnection layer 36 formed over the gate electrode $24_{TG2}$ via the contact plug 74d. The VR line 36i of the second metal interconnection 36 electrically connected to the VR line 76 covers the gap between the Select line 32a and the TG1 line 32b above the gate electrode $24_{TG1}$ to shield the gate electrode $24_{TG1}$ from light. The VR line 36j of the second metal interconnection 36 electrically connected to the VR line 76 covers the gap between the RST line 32c and the TG2 line 32d above the gate electrode $24_{TG2}$ to shied the gate electrode $24_{TG2}$ from light.

Thus, the solid-state image sensor according to the present embodiment is constituted.

The solid-state image sensor according to the present embodiment is characterized mainly in that the shape of the floating diffusion FD1 and the shape of the floating diffusion FD2 both including the respective contact parts 25c, 25d are substantially the same between the pixels $P_n$, $P_{n+1}$ including the common read transistor part and adjacent to each other in the column direction.

This can make the capacitance of the floating diffusion FD1 and the capacitance of the floating diffusion FD2 substantially equal to each other. Especially, the layout can make the capacitance between the transfer transistor TG1 and the floating diffusion FD1 and the capacitance between the transfer transistor TG2 and the floating diffusion FD2 substantially equal to each other. Accordingly, the characteristics of the charge transfer of the transfer transistor TG1 from the photodiode PD1 to the floating diffusion FD1 and the characteristics of the charge transfer of the transfer transistor TG2 from the photodiode PD2 to the floating diffusion FD2 can be made substantially equal to each other.

Furthermore, in the solid-state image sensor according to the present embodiment, as in the solid-state image sensor according to the first embodiment, the shape of the photodiode PD1 and the shape of the photodiode PD2 are substantially equal to each other, and the shape of the gate electrode $24_{TG1}$ of the transfer transistor TG1 and the shape of the gate electrode $24_{TG2}$ of the transfer transistor TG2 are substantially equal to each other. The positional relationship among the photodiode PD1, the gate electrode $24_{TG1}$ of the transfer transistor TG1 and the floating diffusion FD1 and the positional relationship among the photodiode PD2, the gate electrode $24_{TG2}$ of the transfer transistor TG2 and the floating diffusion FD2 are substantially the same. That is, the photodiode PD1 and the photodiode PD2 are spaced from each other substantially with 1 pixel pitch in the column direction, and the gate electrode $24_{TG1}$ of the transfer transistor TG1 and the gate electrode $24_{TG2}$ of the transfer transistor TG2 are spaced from each other substantially with 1 pixel pitch in the column direction. In addition, the floating diffusion FD1 and the floating diffusion FD2 are spaced from each other substantially with 1 pixel pitch in the column direction. Such identity of the layout between the pixels $P_n$, $P_{n+1}$ makes the characteristics of the charge transfer of the transfer transistor TG1 from the photodiode PD1 to the floating diffusion FD1 and the characteristics of the charge transfer of the transfer transistor TG2 from the photodiode PD2 to the floating diffusion FD2 equal to each other with high precision.

The solid-state image sensor according to the present embodiment is characterized mainly in that the reset transistor RST, the Select transistor Select and the source follower transistor SF-Tr which are made common are formed in the read transistor region 22e, which is a continuous active region.

The active regions for the rest transistor RST, the select transistor Select and the source follower transistor SF-Tr, which are made common, are made the continuous region, whereby in the solid-state image sensor according to the present embodiment, the drain region of the source follower transistor SF-Tr and the drain region of the reset transistor RST are formed of the common impurity diffused region. Accordingly, no special interconnection may not be led out to electrically connect the drain region of the source follower transistor SF-Tr and the drain region of the reset transistor RST, which allows the interconnection structure to be simple.

MODIFIED EMBODIMENTS

The present invention is not limited to the above-described embodiments and can cover other various modifications.

For example, in the above-described embodiments, substantially square pixels are arrayed in the row direction and in the column direction with the same pitch in a square arrangement. The shape and the arrangement of the pixels can be suitably changed.

In the above-described embodiments, the Select line, TG1 line, RST line, TG2 line, the signal read line, the VR line and the FD-SF interconnection line are formed in the first and the second metal interconnection layers 32, 36 or in the first to the third metal interconnection layers 32, 36, 76. However, a plurality of metal interconnection layers are further provided to suitably distribute these signal lines in the metal interconnection layers. For example, in the above-described embodiments, the Select line, the TG1 line, the RST line and the TG2 line are formed in one and the same layer, but these signal lines may be divided in a plurality of metal interconnection layers.

In the above-described embodiments, the second metal interconnection layer 36 is formed on the first metal interconnection layer 32 but may be formed topsy-turvy by using suitably lead interconnections.

What is claimed is:

1. A solid-state image sensor comprising
a plurality of pixels arranged in a matrix in a row direction and in a column direction, each of said plurality of pixels including photoelectric converter; a first transistor for transferring a signal charge generated in the photoelectric converter; an impurity diffused region for storing the signal charge outputted from the photoelectric converter via the first transistor; a second transistor for outputting a signal, based on the signal charge stored in the impurity diffused region; a third transistor for resetting an input terminal of the second transistor;
the second transistor of a first one of said pixels in an nth row, and the second transistor of a second one of said pixels in an n+1th row being made common,
the third transistor of the first pixel and the first transistor of the second pixel being made common,
the first transistor of the first pixel and the first transistor of the second pixel being formed in regions positioned respectively on the same side in the column direction with respect to the photoelectric converter of the first pixel and the photoelectric converter of the second pixel, and at least one of the second transistor made common and the third transistor made common being formed in a region positioned on a side in the row direction with respect to the photoelectric converter of the first pixel and the photoelectric converter of the second pixel, wherein the first transistor of the first pixel is formed at least in a region positioned between the photoelectric converter of the first pixel and the photoelectric converter of the second pixel, and the first transistor of the second pixel is formed at least in a region positioned between the photoelectric converter of the second pixel and the photoelectric converter of a third one of said pixels in an n+2th row.

2. A solid-state image sensor according to claim 1, wherein the impurity diffused region of the first pixel and the impurity diffused region of the second pixel are formed at least in regions respectively positioned on the same side in the column direction with respect to a gate electrode of the first transistor of the first pixel and a gate electrode of the first transistor of the second pixel.

3. A solid-state image sensor according to claim 1, wherein the impurity diffused region of the first pixel and the impurity diffused region of the second pixel are formed at least in regions respectively positioned on a side in the row direction with respect to a gate electrode of the first transistor of the first pixel and a gate electrode of the first transistor of the second pixel.

4. A solid-state image sensor according to claim 3, wherein a cut is formed in the gate electrode of the first transistor included in each of the first pixel and the second pixel, and the impurity diffused region is formed in a region exposed in the cut.

5. A solid-state image sensor according to claim 1, wherein a shape of the photoelectric converter of the first pixel and a shape of the photoelectric converter of the second pixel are substantially the same.

6. A solid-state image sensor according to claim 1, wherein a shape of a gate electrode of the first transistor of the first pixel and a shape of a gate electrode of the first transistor of the second pixel are substantially the same.

7. A solid-state image sensor according to claim 1, wherein the first pixel is said pixel in an nth row and an mth column, and the second pixel is said pixel in an n+1th row and an mth column.

8. A solid-state image sensor according to claim 7, wherein the photoelectric converter of the first pixel and the photoelectric converter of the second pixel are arranged in the column direction substantially with the same pitch as the said plurality of pixels are arranged in the column direction, and a gate electrode of the first transistor of the first pixel and a gate electrode of the first transistor of the second pixel are arranged in the column direction substantially with the same pitch as said plurality of pixels are arranged in the column direction.

9. A solid-state image sensor according to claim 1, wherein the first pixel is said pixel in an nth row and an mth column, and the second pixel is said pixel in an n+1th row and an m+1th column.

10. A solid-state image sensor according to claim 9, wherein the photoelectric converter of the first pixel and the photoelectric converter of the second pixel are arranged in the column direction substantially with the same pitch as the said plurality of pixels are arranged in the column direction, and a gate electrode of the first transistor of the first pixel and a gate electrode of the first transistor of the second pixel are arranged in the column direction substantially with the same pitch as said plurality of pixels are arranged in the column direction.

11. A solid-state image sensor according to claim 9, wherein the photoelectric converter of the first pixel and the photoelectric converter of the second pixel are arranged in the row direction substantially with the same pitch as said plurality of pixels are arranged in the row direction, and a gate electrode of the first transistor of the first pixel and a gate electrode of the first transistor of the second pixel are arranged in the row direction at substantially the same pitch as said plurality of pixels are arranged in the row direction.

12. A solid-state image sensor according to claim 1, wherein the second transistor made common is formed in regions positioned on a side in the row direction with respect to the photoelectric converter of the first pixel, and the third transistor made common is formed in a region positioned on a side in the row direction with respect to the photoelectric converter of the second pixel.

13. A solid-state image sensor according to claim 12, wherein each of said plurality of pixels include a fourth transistor for reading the signal outputted by the second transistor, the fourth transistor of the first pixel, and the fourth transistor of the second pixel are made common, and the fourth transistor made common is formed in regions positioned on a side the row direction with respect to the photoelectric converter of the first pixel.

14. A solid-state image sensor according to claim 1, a contact plug is formed in a region other than the region between the photoelectric converters adjacent in the column direction.

15. A solid-state image sensor according to claim 1, wherein a width in the row direction of an active region where the photoelectric converter is formed and a width in the row direction of an active region under a gate electrode of the first transistor are substantially the same.

16. A solid-state image sensor according to claim 1, wherein the photoelectric converter is a photodiode including an impurity diffused layer buried in a semiconductor substrate, and an area of a part of the impurity diffused layer present immediately under a gate electrode of the first transistor of the first pixel and an area of a part of the impurity diffused layer present immediately under a gate electrode of the first transistor of the second pixel are substantially the same.

17. A solid-state image sensor according to claim 1, further comprising a metal silicide film formed in at least a part of the impurity diffused region.

18. A solid-state image sensor according to claim 17, wherein the metal silicide film is formed further on a gate electrode of the first transistor of the first pixel and a gate electrode of the first transistor of the second pixel, and a space between the silicide film formed on the gate electrode of the first transistor of the first pixel and the photoelectric converter of the first pixel, and a space between the metal silicide film formed on the gate electrode of the first transistor of the second pixel and the photoelectric converter of the second pixel are substantially the same.

19. A solid-state image sensor according to claim 1, wherein each of said plurality of pixels include a fourth transistor for reading the signal outputted by the second transistor, the fourth transistor of the first pixel, and the fourth transistor of the second pixel are made common, and at least one of the second transistor made common, the third transistor made common and the fourth transistor made common are formed in a region positioned on a side in the row direction with respect to the photoelectric converter of the first pixel and the photoelectric converter of the second pixel.

20. A solid-state image sensor according to claim 19, wherein a shape of the impurity diffused region of the first pixel and a shape of the impurity diffused region of the second pixel are substantially the same.

21. A solid-state image sensor according to claim 20, wherein the second transistor made common and the fourth transistor made common are formed in a region positioned on a side in the row direction with respect to the photoelectric converter of the second pixel, and the third transistor made common is formed in a region positioned on a side in the row direction with respect to the photoelectric converter of the first pixel.

22. A solid-state image sensor according to claim 21, wherein the second transistor of a third one of said plurality of pixels in the n+2th row and the second transistor of a fourth one of said plurality of pixels in the n+3th row are made common, the third transistor of the third pixel and the third transistor of the fourth pixel are made common, the fourth transistor of the third pixel and the fourth transistor of the fourth pixel are made common, and the second transistor and the fourth transistor made common between the first pixel and the second pixel, and the third transistor made common between the third pixel and the fourth pixel are formed in one continuous active region provided over the second pixel and the third pixel.

23. A solid-state image sensor according to claim 20, wherein the second transistor of a third one of said plurality of pixels in the n+2th row and the second transistor of a fourth one of said plurality of pixels in the n+3th row are made common, the third transistor of the third pixel and the third transistor of the fourth pixel are made common, the fourth transistor of the third pixel and the fourth transistor of the fourth pixel are made common, and the second transistor and the fourth transistor made common between the first pixel and the second pixel, and the third transistor made common between the third pixel and the fourth pixel are formed in one continuous active region provided over the second pixel and the third pixel.

24. A solid-state image sensor according to claim 19, further comprising:

a first signal line formed, extended in the row direction and electrically connected to a gate electrode of the first transistor of the first pixel;

a second signal line formed, extended in the row direction and electrically connected to a gate electrode of the first transistor of the second pixel;

a third signal line formed, extended in the row direction and electrically connected to a gate electrode of the third transistor made common;

a fourth signal line formed, extended in the row direction and electrically connected to a gate electrode of the fourth transistor made common;

a fifth signal line formed, extended in the column direction and electrically connected to a source terminal of the fourth transistor made common;

a sixth signal line electrically connected to a drain terminal of the second transistor made common and a drain terminal of the third transistor made common; and a seventh signal line electrically connecting the impurity diffused region of the first pixel, the impurity diffused region of the second pixel and a gate electrode of the second transistor made common.

25. A solid-state image sensor according to claim 24, wherein the first signal line, the second signal line the third signal line and the fourth signal line are formed in a first metal interconnection layer, and the fifth signal line and the seventh signal line are formed in a second metal interconnection layer.

26. A solid-state image sensor according to claim 25, wherein the seventh signal line is electrically connected to the impurity diffused region of the first pixel via a first lead interconnection formed in the first metal interconnection layer, is electrically connected to the impurity diffused region of the second pixel via a second lead interconnection formed in the first metal interconnection layer, and is electrically connected, via a third lead interconnection formed in the first metal interconnection layer, to the gate electrode of the second transistor made common.

27. A solid-state image sensor according to claim 26, wherein a length of a part where the first lead interconnection and the first signal line are opposed to each other, and a length of a part where the second lead interconnection and the second signal line are opposed to each other are substantially the same.

28. A solid-state image sensor according to claim 27, wherein the second transistor made common is formed in a region between the impurity diffused region of the first pixel and the impurity diffused region of the second pixel.

29. A solid-state image sensor according to claim 26, wherein the second transistor made common is formed in a region between the impurity diffused region of the first pixel and the impurity diffused region of the second pixel.

30. A solid-state image sensor according to claim 25, wherein a length of a part where the fifth signal line adjacent to the photoelectric converter of the first pixel and the photoelectric converter of the first pixel are opposed to each other, and a length of a part where the fifth signal line adjacent to the photoelectric converter of the second pixel and the photoelectric converter of the second pixel are opposed to each other are substantially the same.

31. A solid-state image sensor according to claim 25, wherein
a length of a part where the seventh signal line adjacent to the photoelectric converter of the first pixel and the photoelectric converter of the first pixel are opposed to each other, and a length of a part where the seventh signal line adjacent to the photoelectric converter of the second pixel and the photoelectric converter of the second pixel are opposed to each other are substantially the same.

32. A solid-state image sensor according to claim 25, wherein
a space between the first signal line adjacent to the photoelectric converter of the first pixel and an edge of the photoelectric converter of the first pixel, and a space between the second signal line adjacent to the photoelectric converter of the second pixel and an edge of the photoelectric converter of the second pixel are substantially the same.

33. A solid-state image sensor according to claim 25, wherein
a space between the fourth signal line adjacent to the photoelectric converter of the first pixel and an edge of the photoelectric converter of the first pixel, and a space between the third signal line adjacent to the photoelectric converter of the second pixel and an edge of the photoelectric converter of the second pixel are substantially the same.

34. A solid-state image sensor according to claim 25, wherein
a space between the fifth signal line adjacent to the photoelectric converter of the first pixel and an edge of the photoelectric converter of the first pixel, and a space between the fifth signal line adjacent to the photoelectric converter of the second pixel and an edge of the photoelectric converter of the second pixel are substantially the same.

35. A solid-state image sensor according to claim 25, wherein
the sixth signal line is formed in the second metal interconnection layer, extended in the column direction.

36. A solid-state image sensor according to claim 35, wherein
a space between the sixth signal line adjacent to the photoelectric converter of the first pixel and an edge of the photoelectric converter of the first pixel, and a space between the sixth signal line adjacent to the photoelectric converter of the second pixel and an edge of the photoelectric converter of the second pixel are substantially the same.

37. A solid-state image sensor according to claim 35, wherein
a length of a part where the sixth signal line adjacent to the photoelectric converter of the first pixel and the photoelectric converter of the first pixel are opposed to each other, and a length of a part where the sixth signal line adjacent to the photoelectric converter of the second pixel and the photoelectric converter of the second pixel are opposed to each other are substantially the same.

38. A solid-state image sensor according to claim 25, wherein
a space between the seventh signal line adjacent to the photoelectric converter of the first pixel and an edge of the photoelectric converter of the first pixel, and a space between the seventh signal line adjacent to the photoelectric converter of the second pixel and an edge of the photoelectric converter of the second pixel are substantially the same.

39. A solid-state image sensor according to claim 25, wherein
the sixth signal line is formed in a third metal interconnection layer, extended in the column direction.

40. A solid-state image sensor according to claim 39, wherein
a space between the sixth signal line adjacent to the photoelectric converter of the first pixel and an edge of the photoelectric converter of the first pixel, and a space between the sixth signal line adjacent to the photoelectric converter of the second pixel and an edge of the photoelectric converter of the second pixel are substantially the same.

41. A solid-state image sensor according to claim 39, wherein
a length of a part where the sixth signal line adjacent to the photoelectric converter of the first pixel and the photoelectric converter of the first pixel are opposed to each other, and a length of a part where the sixth signal line adjacent to the photoelectric converter of the second pixel and the photoelectric converter of the second pixel are opposed to each other are substantially the same.

42. A solid-state image sensor according to claim 25, wherein
a length of a part where the first signal line adjacent to the photoelectric converter of the first pixel and the photoelectric converter of the first pixel are opposed to each other, and a length of a part where the second signal line adjacent to the photoelectric converter of the second pixel and the photoelectric converter of the second pixel are opposed to each other are substantially the same.

43. A solid-state image sensor according to claim 25, wherein
the sixth signal line is formed in a matrix in a third metal interconnection layer.

44. A solid-state image sensor according to claim 43, wherein
inside openings of the matrix of the sixth signal line, at least a part of the first metal interconnection layer and the second metal interconnection layer is present.

45. A solid-state image sensor according to claim 43, wherein
a space between the sixth signal line adjacent to the photoelectric converter of the first pixel and an edge of the photoelectric converter of the first pixel, and a space between the sixth signal line adjacent to the photoelectric converter of the second pixel and an edge of the photoelectric converter of the second pixel are substantially the same.

46. A solid-state image sensor according to claim 43, wherein
a length of a part where the sixth signal line adjacent to the photoelectric converter of the first pixel and the photoelectric converter of the first pixel are opposed to each other, and a length of a part where the sixth signal line adjacent to the photoelectric converter of the second pixel and the photoelectric converter of the second pixel are opposed to each other are substantially the same.

47. A solid-state image sensor according to claim 25, wherein
a length of a part where the fourth signal line adjacent to the photoelectric converter of the first pixel and the photoelectric converter of the first pixel are opposed to each other, and a length of a part where the third signal line adjacent to the photoelectric converter of the second pixel and the photoelectric converter of the second pixel are opposed to each other are substantially the same.

48. A solid-state image sensor according to claim 32, wherein a length of a part where the seventh signal line adjacent to the photoelectric converter of the first pixel and the photoelectric converter of the first pixel are opposed to each other, and a length of a part where the seventh signal line adjacent to the photoelectric converter of the second pixel and the photoelectric converter of the second pixel are opposed to each other are substantially the same.

49. A solid-state image sensor according to claim 32, wherein a length of a part where the fifth signal line adjacent to the photoelectric converter of the first pixel and the photoelectric converter of the first pixel are opposed to each other, and a length of a part where the fifth signal line adjacent to the photoelectric converter of the second pixel and the photoelectric converter of the second pixel are opposed to each other are substantially the same.

50. A solid-state image sensor according to claim 32, wherein a length of a part where the fourth signal line adjacent to the photoelectric converter of the first pixel and the photoelectric converter of the first pixel are opposed to each other, and a length of a part where the third signal line adjacent to the photoelectric converter of the second pixel and the photoelectric converter of the second pixel are opposed to each other are substantially the same.

51. A solid-state image sensor according to claim 32, wherein a length of a part where the first signal line adjacent to the photoelectric converter of the first pixel and the photoelectric converter of the first pixel are opposed to each other, and a length of a part where the second signal line adjacent to the photoelectric converter of the second pixel and the photoelectric converter of the second pixel are opposed to each other are substantially the same.

52. A solid-state image sensor according to claim 32, wherein the seventh signal line is electrically connected to the impurity diffused region of the first pixel via a first lead interconnection formed in the first metal interconnection layer, is electrically connected to the impurity diffused region of the second pixel via a second lead interconnection formed in the first metal interconnection layer, and is electrically connected, via a third lead interconnection formed in the first metal interconnection layer, to the gate electrode of the second transistor made common.

53. A solid-state image sensor according to claim 52, wherein a length of a part where the first lead interconnection and the first signal line are opposed to each other, and a length of a part where the second lead interconnection and the second signal line are opposed to each other are substantially the same.

54. A solid-state image sensor according to claim 32, wherein a space between the fourth signal line adjacent to the photoelectric converter of the first pixel and an edge of the photoelectric converter of the first pixel, and a space between the third signal line adjacent to the photoelectric converter of the second pixel and an edge of the photoelectric converter of the second pixel are substantially the same.

55. A solid-state image sensor according to claim 32, wherein a space between the fifth signal line adjacent to the photoelectric converter of the first pixel and an edge of the photoelectric converter of the first pixel, and a space between the fifth signal line adjacent to the photoelectric converter of the second pixel and an edge of the photoelectric converter of the second pixel are substantially the same.

56. A solid-state image sensor according to claim 32, wherein a space between the seventh signal line adjacent to the photoelectric converter of the first pixel and an edge of the photoelectric converter of the first pixel, and a space between the seventh signal line adjacent to the photoelectric converter of the second pixel and an edge of the photoelectric converter of the second pixel are substantially the same.

* * * * *